US010910337B2

(12) United States Patent
Okunishi et al.

(10) Patent No.: US 10,910,337 B2
(45) Date of Patent: Feb. 2, 2021

(54) SEMICONDUCTOR DEVICE

(71) Applicant: Renesas Electronics Corporation, Tokyo (JP)

(72) Inventors: Noriko Okunishi, Tokyo (JP); Toshinori Kiyohara, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/594,160

(22) Filed: Oct. 7, 2019

(65) Prior Publication Data
US 2020/0035638 A1 Jan. 30, 2020

Related U.S. Application Data

(63) Continuation of application No. 15/729,715, filed on Oct. 11, 2017, now abandoned.

(30) Foreign Application Priority Data

Oct. 28, 2016 (JP) .................................. 2016-211435

(51) Int. Cl.
H01L 23/495 (2006.01)
H01L 23/29 (2006.01)
H01L 23/31 (2006.01)
H01L 21/56 (2006.01)
H01L 23/00 (2006.01)

(52) U.S. Cl.
CPC ............ *H01L 24/46* (2013.01); *H01L 23/293* (2013.01); *H01L 23/3114* (2013.01); *H01L 23/4951* (2013.01); *H01L 23/49524* (2013.01); *H01L 23/49562* (2013.01); *H01L 23/49575* (2013.01); *H01L 24/09* (2013.01); *H01L 24/49* (2013.01); *H01L 24/85* (2013.01); *H01L 21/565* (2013.01); *H01L 23/3107* (2013.01); *H01L 24/45* (2013.01); *H01L 2224/04042* (2013.01);
(Continued)

(58) Field of Classification Search
None
See application file for complete search history.

(56) References Cited

U.S. PATENT DOCUMENTS 5,441,917 A * 8/1995 Rostoker ............... H01L 23/315
438/612
6,534,878 B1 3/2003 Sander et al.
(Continued)

FOREIGN PATENT DOCUMENTS

JP 2000-503491 3/2000
JP 2009-231805 10/2009
(Continued)

OTHER PUBLICATIONS

Japanese Office Action received in corresponding Japanese Application No. 2016-211435 dated Nov. 12, 2019.

Primary Examiner — Nishath Yasmeen
(74) Attorney, Agent, or Firm — Mattingly & Malur, PC

(57) ABSTRACT

A performance of a semiconductor device is improved. The semiconductor device according to one embodiment includes a wire that is bonded to one bonding surface at a plurality of parts in an opening formed in an insulating film of a semiconductor chip. The semiconductor device includes also a sealer that seals the semiconductor chip and the wire so that the sealer is in contact with the bonding surface. An area of a part of the bonding surface, the part not overlapping the wire, is small.

5 Claims, 27 Drawing Sheets

(52) U.S. Cl.
CPC .......... *H01L 2224/0603* (2013.01); *H01L 2224/45124* (2013.01); *H01L 2224/45144* (2013.01); *H01L 2224/4807* (2013.01); *H01L 2224/48175* (2013.01); *H01L 2224/48247* (2013.01); *H01L 2224/4903* (2013.01); *H01L 2924/13055* (2013.01); *H01L 2924/13091* (2013.01); *H01L 2924/183* (2013.01)

(56) References Cited

U.S. PATENT DOCUMENTS

| | | | |
|---|---|---|---|
| 2005/0224924 A1* | 10/2005 | Koh | H01L 24/48 257/666 |
| 2007/0057350 A1* | 3/2007 | Otremba | H01L 24/40 257/666 |
| 2007/0278664 A1 | 12/2007 | Carney et al. | |
| 2009/0218676 A1 | 9/2009 | Muto et al. | |
| 2010/0258945 A1* | 10/2010 | Numata | H01L 24/37 257/773 |
| 2011/0241224 A1* | 10/2011 | Tsubaki | H01L 24/85 257/784 |
| 2013/0009299 A1 | 1/2013 | Takada et al. | |
| 2014/0193968 A1* | 7/2014 | Nakazawa | H01L 29/407 438/589 |

FOREIGN PATENT DOCUMENTS

| | | |
|---|---|---|
| JP | 2013-102233 A | 5/2013 |
| JP | 2014-027293 A | 2/2014 |

* cited by examiner

SEMICONDUCTOR DEVICE

CROSS-REFERENCE TO RELATED APPLICATION

The present application is a continuation application of U.S. application Ser. No. 15/729,715, filed Oct. 11, 2017, which claims priority from Japanese Patent Application No. 2016-211435 filed on Oct. 28, 2016, the content of which is hereby incorporated by reference into this application.

TECHNICAL FIELD OF THE INVENTION

The present invention relates to a semiconductor device. For example, the present invention relates to a semiconductor device in which a part of a lead connected with a wire is sealed with a resin sealer.

BACKGROUND OF THE INVENTION

Japanese Patent Application Laid-open Publication No. 2014-27293 (Patent Document 1) describes a power semiconductor device in which a plurality of wires are connected to one source electrode pad of a semiconductor chip and also describes a semiconductor device in which wires are connected to a plurality of source electrode pads of a semiconductor chip, respectively.

Japanese Patent Application Laid-open Publication No. 2013-102233 (Patent Document 2) describes a method of bonding one aluminum ribbon to a plurality of pads and lead posts of a semiconductor chip by using a wedge tool serving as a bonding tool.

SUMMARY OF THE INVENTION

The inventors of the present invention have studied techniques for improving a performance of a semiconductor device. For example, a technique of bonding one wire to a plurality of positions of one electrode pad of a semiconductor chip is cited. An electrode formation surface of the semiconductor chip is covered with an insulating film serving as a protective film. When the wire is bonded to the plurality of positions of the electrode pad, the wire is easy to be bonded by increasing an opening area of an opening formed on the protective film. However, it has been found out that a resin (resin sealer) that seals the wire is separated from a part of the electrode pad, the part being not connected with the wire and being exposed from the protective film, because of the weakness at the bonded interface between a metal material making up the electrode pad and the resin material sealing the wire. Even if the electrode pad and the resin sealer are separated from each other, the function of the semiconductor device is not immediately damaged. However, in consideration of long-term product quality such as the service life of the semiconductor device or others, it is preferable to suppress the separation between the resin sealer and the electrode pad.

Other object and novel characteristics will be apparent from the description of the present specification and the accompanying drawings.

A semiconductor device according to one embodiment includes a first conductive member bonded to a first bonding surface at a plurality of positions in a first opening formed on an insulating film of a semiconductor chip. The semiconductor device also includes a sealer that seals the semiconductor chip and the first conductive member so as to be in contact with the first bonding surface. An area of a part of the first bonding surface, the part not overlapping the first conductive member, is small.

According to the above-described one embodiment, the performance of the semiconductor device can be improved.

BRIEF DESCRIPTIONS OF THE DRAWINGS

Figure 1:
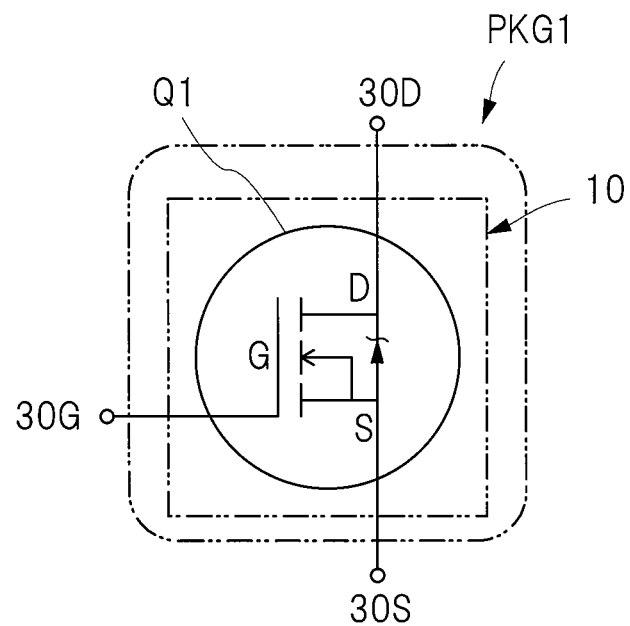
FIG. 1 is an explanatory diagram schematically showing an example of a circuit included in a semiconductor device of one embodiment.

DESCRIPTIONS OF THE PREFERRED EMBODIMENTS (Explanation of Description Form, Basic Term and Method in Present Application)

In the present application, the invention will be described in a plurality of sections or others when required as a matter of convenience. However, these sections or others are not irrelevant to each other unless otherwise particularly stated, and the one of each part of a simple example relates to a detailed part, a part, or the entire of the other as a modification example or others, regardless of before and after the description. Also, in principle, the repetitive description of the same part is omitted. Further, each element in the embodiment is not indispensable unless otherwise particularly stated not to be so, logically limited to the number, and clearly not to be so from the contexts.

Similarly, when "X made of A" or others is described for materials, compositions, and others in the description of the embodiment and others, the one containing other components than A is not eliminated unless otherwise stated not to be only the component and clearly not to be so from the contexts. For example, the component means "X containing A as a main component" or others. For example, it is needless to say that a "silicon material" and others includes not only pure silicon but also SiGe (silicon germanium) or other multicomponent alloy containing silicon as a main component, or a member containing other additives or others. Also, gold plating, a Cu layer, nickel plating, and others include not only pure material but also members containing gold, Cu, nickel, and others as a main component, respectively, unless otherwise specified not to be so.

Further, even when a specific numerical value and numerical amount are mentioned, they may exceed the specific numerical values or smaller than the specific numerical values unless otherwise specified not to be so, logically limited to the number, and clearly described to be so from the contents.

Still further, in each drawing of the embodiment, the same or similar parts are denoted by the same or similar symbol or reference number, and the description thereof is not repeated.

Also, in the attached drawings, hatching or others is omitted in some cases even in a cross-sectional view in a conversely complicated case or in a case in which a space is clearly distinguished therefrom. In respect to this, in a case in which it is clear from the description or others, an outline of the background is omitted even in a hole which is closed in a plan view in some cases. Further, hatching or a dot pattern is added to a drawing even if the drawing is not a cross-sectional view in order to explicitly illustrate so as not to be the space or explicitly illustrate a boundary between regions.

In the following description, terms "contact", "adhesion", "bonding", "separation", and "connection" are used in the following meanings. The term "contact" represents a state in which two separable members are in contact with each other in at least a part of them. The term "adhesion" represents a state in which two separable members (bonded materials) are coupled and fixed to each other via an adhesive in at least a part of them. The term. "bonding" represents a state in which two separable members (bonded materials) are coupled and fixed to each other in at least a part of them. The above-described term "coupling" includes mechanical coupling such as an anchoring effect, coupling caused by a physical interaction such as intermolecular force, and coupling caused by a chemical interaction such as covalent bonding. The term "bonding" includes not only a case in which a different material (e.g., adhesive) is interposed between the bonded materials but also a case in which no different material is interposed therebetween. That is, a "bonded state" includes an "adhered state". The term "separation" represents a state in which the above-described "bonded state" is released and changed into a separable state. A simply-termed "separation" includes not only a case in which the coupling is released in the entire bonded part between two members but also a case in which the coupling is released in a part of the bonded part. The term "connection" represents a state in which two members communicate with each other (in which a connection path is not interrupted in its middle and is continuously linked). It is irrelevant whether a different member is interposed between two members or not. For example, "state in which a member A and a member B are electrically connected" represents an electrical conductible state between the member A and the member B, and also includes a case in which a member C is interposed between the member A and the member B. A simple term "state in which the member A and the member B are connected" represents a state in which the member A and the member B are fixed to each other, and also includes a case in which the member C is interposed between the member A and the member B. For example, "state in which the member A and the member B are connected" also includes a case in which the member A and the member B are formed integrally into an inseparable single object and yet are distinguished from each other in terms of shape and function. Such a state in which the member A and member B are formed into the single object is termed as "joint" in some cases.

In the following description, when solder, solder member, solder material, or solder component is mentioned, the term represents, for example, Sn—Pb solder containing lead (Pb) or so-called lead-free solder substantially containing no lead. As examples of the lead-free solder, for example, only tin (Sn), tin and bismuth (Sn—Bi), tin-copper-silver (Sn—Cu—Ag), tin-copper (Sn—Cu) and others are cited. Here, the lead-free solder represents the one having lead (Pb) content of 0.1 wt % or less. This content is defined as standards of the RoHS (Restriction of Hazardous Substances) directive.

In the present embodiment, as an example of a semiconductor device, a power device embedded into a power control circuit of a power circuitry, etc., or a semiconductor device referred to as power semiconductor device will be exemplified and described. A semiconductor device described below is embedded into a power conversion circuit, and functions as a switching element.

<Example of Circuit Configuration>

Figure 2:
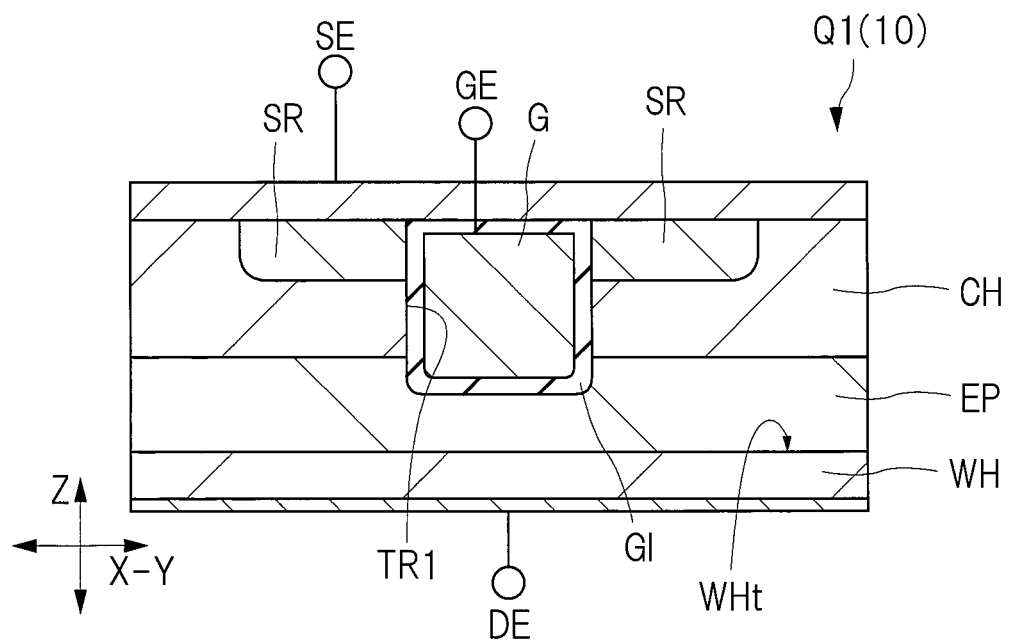
FIG. 2 is a cross-sectional view of a principal part showing an example of an element structure of a field-effect transistor shown in FIG. 1.

FIG. 1 is an explanatory diagram schematically showing an example of a circuit included in a semiconductor device of the present embodiment. FIG. 2 is a cross-sectional view of a principal part showing an example of an element structure of a field-effect transistor shown in FIG. 1.

Some semiconductor devices for power control, each of which is referred to as power semiconductor device, include semiconductor elements such as diodes, thyristors, and transistors. A transistor is used in various fields. As described in the present embodiment, a transistor embedded into a power control circuit through which a large current of, for example, 1 A (ampere) or larger flows to function as a switching element is called power transistor. A semiconductor device PKG1 of the present embodiment includes a semiconductor chip 10 having a transistor Q1 serving as a power transistor as shown in FIG. 1. In the examples shown in FIGS. 1 and 2, the transistor Q1 formed on the semiconductor chip 10 is a field-effect transistor, more specifically, a MOSFET (Metal Oxide Semiconductor Field Effect Transistor). In a power semiconductor device, a transistor is used as, for example, a switching element. A MOSFET used for a power semiconductor device is referred to as power MOSFET.

The above-described MOSFET is used as a term that widely represents a field-effect transistor having a structure in which a gate electrode made of a conductive material is disposed on a gate insulating film. Therefore, even when the MOSFET is mentioned, a gate insulating film other than an oxide film is not excluded. Also, even when the MOSFET is mentioned, a gate electrode material such as polysilicon other than metal is not excluded.

The transistor Q1 shown in FIG. 1 is formed of, for example, an n-channel type field-effect transistor as shown in FIG. 2. FIG. 2 is a cross-sectional view of a principal part showing an example of an element structure of the field-effect transistor shown in FIG. 1.

In the example shown in FIG. 2, for example, an n⁻-type epitaxial layer EP is formed on a main surface WHt of a semiconductor substrate WH made of n-type single crystal silicon. These semiconductor substrate WH and epitaxial layer EP make up a drain region (which corresponds to a drain "D" shown in FIG. 1) of the MOSFET. This drain region is electrically connected to a drain electrode DE formed on the back surface side of the semiconductor chip 10.

On the epitaxial layer EP, a channel formation region CH, which is a p⁺-type semiconductor region, is formed. On this channel formation region CH, a source region SR (which corresponds to a source "S" illustrated in FIG. 1), which is an n⁺-type semiconductor region, is formed. The source region SR is electrically connected to a source electrode pad (electrode, source electrode) SE formed on the main surface side of the semiconductor chip 10 via a leading-out wiring. In the semiconductor region stacked on the semiconductor substrate WH, a trench (opening, groove) TR1 is formed so as to penetrate from the upper surface of the source region SR through the channel formation region CH into the epitaxial layer EP.

On the inner wall of the trench TR1, a gate insulating film GI is formed. On the gate insulating film GI, a stacked gate electrode G is formed so that the trench TR1 is embedded. The gate electrode G is electrically connected to the gate electrode pad (electrode, gate electrode) GE of the semiconductor chip 10 via a leading-out wiring.

In the transistor Q1, the drain region and the source region SR are arranged across the channel formation region CH in the thickness direction, and therefore, a channel is formed in the thickness direction (which will hereinafter be referred to as "vertical channel structure"). In this case, an occupation area of the element in a plan view can be smaller than that of a field-effect transistor having a channel formed along the main surface WHt. Therefore, a plane size of the semiconductor chip 10 can be reduced.

In the case of the above-described vertical channel structure, a channel width per unit area in a plan view can be increased, and therefore, an on-resistance can be reduced. Note that FIG. 2 is a drawing showing the element structure of the field-effect transistor. In the semiconductor chip 10 shown in FIG. 1, for example, a plurality of (a number of) transistors Q1 each having the element structure as shown in FIG. 2 are connected in parallel. In this manner, a power MOSFET through which a large current exceeding, for example, 1 ampere flows through can be made up.

When the MOSFET is made up so that the plurality of the transistors Q1 having the vertical channel structure are connected in parallel as described above, the electrical characteristics (mainly, breakdown characteristics, on-resistance characteristics, capacity characteristics) of the MOSFET changes in accordance with the plane size of the semiconductor chip 10. For example, by the increase in the plane area of the semiconductor chip 10, the number of cells of the transistors Q1 connected in parallel is increased, and therefore, the on-resistance decreases, and the capacity increases.

In FIGS. 1 and 2, the MOSFET is exemplified as an example of the power transistor included in the power semiconductor device. However, various modification examples are applicable. For example, in place of the MOSFET, the power semiconductor device may have an insulated gate bipolar transistor (IGBT).

<Semiconductor Device>

Figure 3:
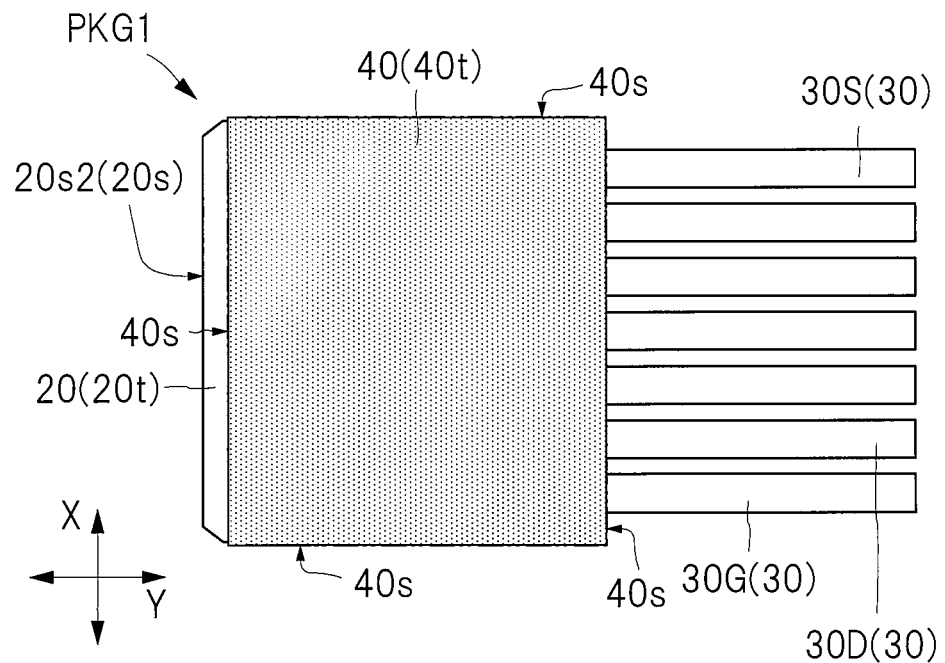
FIG. 3 is a top view of the semiconductor device shown in FIG. 1.
Figure 4:
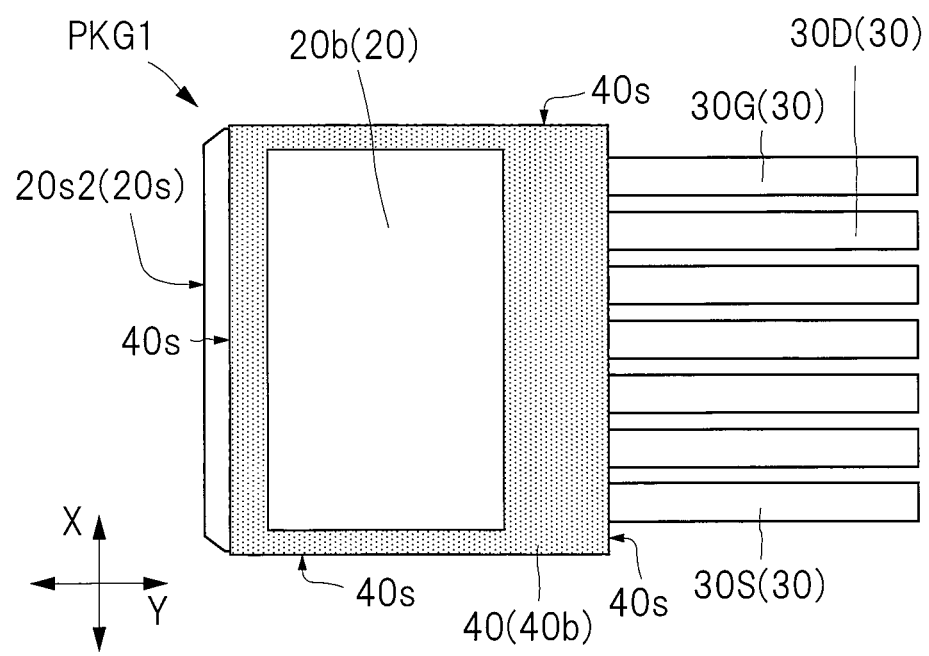
FIG. 4 is a bottom view of the semiconductor device shown in FIG. 3.
Figure 5:
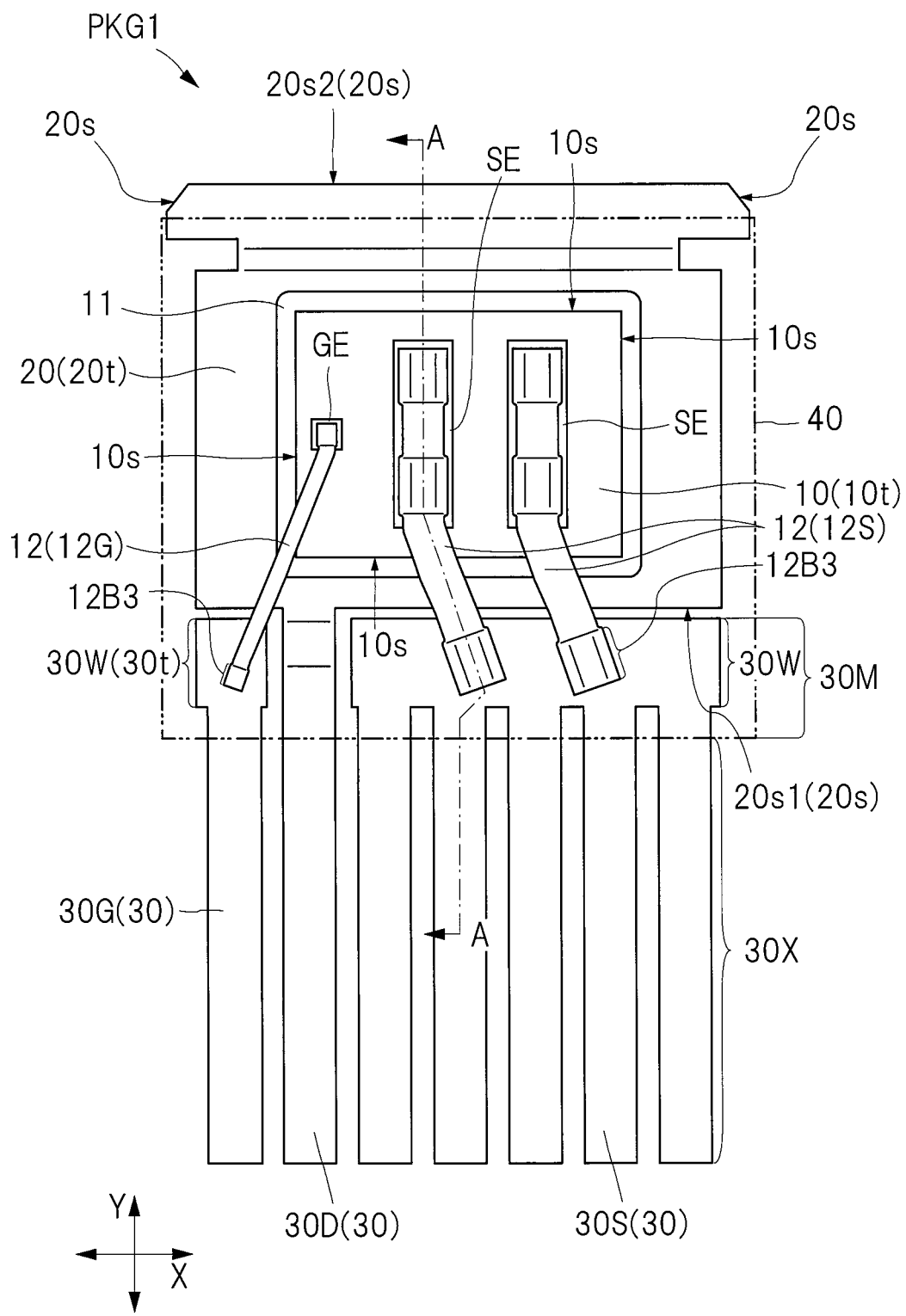
FIG. 5 is a perspective plan view showing an internal structure of the semiconductor device from which a sealer shown in FIG. 3 is removed.
Figure 6:
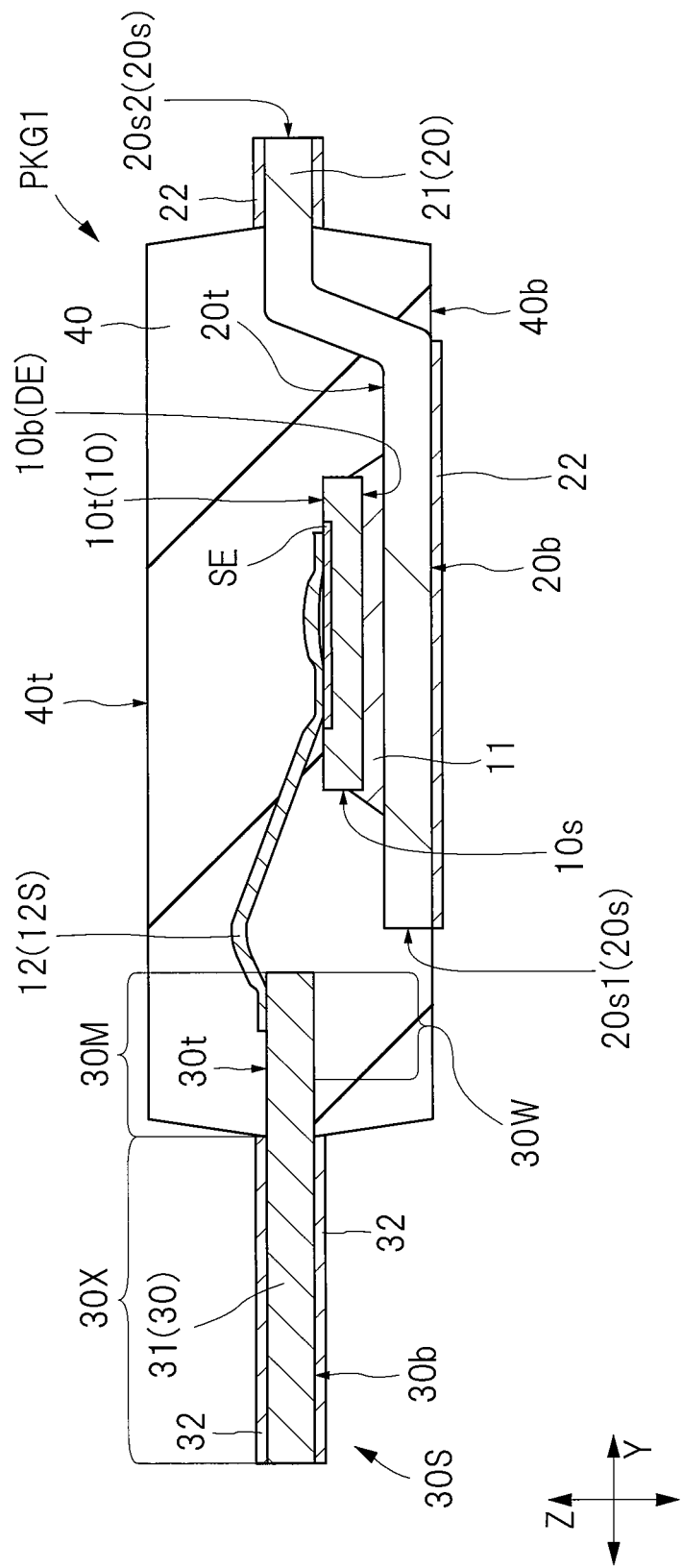
FIG. 6 is a cross-sectional view taken along a line A-A of FIG. 5.

Next, the package structure of the semiconductor device PKG1 shown in FIG. 1 will be described. FIG. 3 is a top view of the semiconductor device shown in FIG. 1. FIG. 4 is a bottom view of the semiconductor device shown in FIG. 3. FIG. 5 is a perspective plan view showing the internal structure of the semiconductor device from which a sealer shown in FIG. 3 is removed. FIG. 6 is a cross-sectional view taken along a line A-A of FIG. 5.

The semiconductor device PKG1 of the present embodiment includes the semiconductor chip 10 (see FIGS. 5 and 6), a die pad (metal plate, chip mounting portion, heat sink) 20 (see FIGS. 3 to 6) on which the semiconductor chip 10 is mounted, and a plurality of leads (terminals) 30 serving as external terminals. The semiconductor chip 10 and the plurality of leads 30 are electrically connected to each other via a plurality of wires 12 (see FIGS. 5 and 6). The semiconductor chip 10, the upper surface 20t of the die pad 20, and the inner portion (inner lead portion, sealed portion) of the plurality of leads 30 (see FIGS. 5 and 6) are sealed with a sealer (resin sealer, resin material, mold resin) 40.

According to the present embodiment, in a plan view, the plurality of leads 30 are arranged side by side with the die pad 20 in the Y direction and are arranged side by side with each other in the X direction intersecting (to be orthogonal to in FIG. 5) the Y direction, as shown in FIG. 5. In the example shown in FIG. 5, in a plan view, a plurality of leads 30S for the source (source leads, source terminals), a lead 30D for the drain (drain lead, drain terminal), and a lead 30G for the gate (gate lead, gate terminal) are sequentially arranged side by side along the X direction. Each of the plurality of leads 30 has an inner portion 30M sealed with the sealer 40, and an outer portion (outer lead portion, exposed portion) 30X exposed from the sealer 40. As shown in FIG. 6, each of the plurality of leads 30 has an upper surface 30t and a lower surface 30b opposite to the upper surface 30t.

As shown in FIG. 6, the semiconductor chip 10 has a front surface (surface, upper surface) 10t and a back surface (surface, lower surface) 10b opposite to the front surface 10t. As shown in FIG. 5, in a plan view, the front surface 10t (or the back surface 10b shown in FIG. 6) of the semiconductor chip 10 is formed into a quadrangular shape which has four side surfaces 10s on its periphery. In the example shown in FIG. 5, in a plan view, the semiconductor chip 10 is formed into a rectangular shape whose long side extends in the X direction.

As shown in FIG. 5, on the front surface 10t of the semiconductor chip 10, the gate electrode pad GE which is electrically connected to the gate electrode G (see FIG. 1) and the source electrode pad SE which is electrically connected to the source S (see FIG. 1) are formed. As shown in FIG. 6, on the back surface 10b of the semiconductor chip 10, the drain electrode (electrode) DE which is electrically connected to the drain D (see FIG. 1) is formed. In the example shown in FIG. 6, the whole of the back surface 10b of the semiconductor chip 10 serves as the drain electrode DE.

As shown in FIG. 2, when the semiconductor chip 10 has the vertical channel structure, its on-resistance can be reduced by reducing the thickness of the semiconductor chip 10 (reducing the distance between the front surface 10t and the back surface 10b shown in FIG. 6). On the other hand, from the viewpoint of increasing a heat capacity of the die pad 20 or the viewpoint of increasing a cross-sectional area of a conductive path through which a current flows, the die pad 20 preferably has a large thickness. For this reason, in the example shown in FIG. 6, the die pad 20 is made thicker than the semiconductor chip 10.

The semiconductor device PKG1 includes the die pad (metal plate, chip mounting portion, heat sink) 20 on which the semiconductor chip 10 is mounted. As shown in FIG. 6, the die pad 20 has an upper surface (surface, main surface, front surface, chip mounting surface) 20t on which the semiconductor chip 10 is mounted via a die bond material 11 and a lower surface (surface, main surface, back surface, exposed surface, mounting surface) 20b opposite to the upper surface 20t. In the example shown in FIG. 5, the plane size of the semiconductor chip 10 (the area of the front surface 10t) is smaller than the plane size of the die pad 20 (the area of the upper surface 20t). As shown in FIG. 4, the die pad 20 has a plurality of side surfaces 20s continuously formed to the lower surface 20b on its periphery.

As shown in FIG. 5, the die pad 20 is formed integrally with the lead 30D serving as the drain terminal. The lead 30D is the external terminal electrically connected to the drain D of FIG. 1. As shown in FIG. 6, on the back surface 10b of the semiconductor chip 10, the drain electrode DE which is connected to the drain D of the transistor Q1 (see FIG. 1) which is the MOSFET is formed. The drain electrode DE is electrically connected to the die pad 20 via the die bond material 11 made of a conductive material. The die bond material 11 is a solder or a conductive resin created by, for example, curing a mixture of a resin and conductive particles such as silver (Ag) particles. The lead 30D is connected to the die pad 20 and is electrically connected to the drain electrode DE of the semiconductor chip 10 via the die pad 20 and die bond material 11. The lead 30D is connected (coupled) to the die pad 20 and has a function as a suspension lead that supports the die pad 20 in a process of manufacturing the semiconductor device, which will be described later.

In the present embodiment, note that the lower surface 20b of the die pad 20 is exposed from the sealer 40. Therefore, the die pad 20 itself may be handled as the drain terminal. In the present embodiment, the explanation has been made while exemplifying the aspect of usage of the MOSFET as the power transistor, and therefore, the lead 30 and the die pad 20 operate as the drain terminal of the semiconductor device PKG1 in the term of a circuit. However, when an IGBT is used as the power transistor as a modification example, a collector electrode is formed on the back surface of the semiconductor chip. Therefore, when the power transistor is the IGBT, the lead 30 and the die pad 20 operate as the collector terminal of the semiconductor device PKG1 in terms of a circuit.

As shown in FIG. 5, the plurality of side surfaces 20s of the die pad 20 are provided so as to face the plurality of leads 30 in a plan view, respectively, and include a side surface 20s1 sealed with the sealer 40. The plurality of side surfaces 20s include also a side surface 20s2 which is opposite to the side surface 20s1, which is exposed from the sealer 40, and which is covered with a metal film 22 (see FIG. 6).

As shown in FIGS. 4 and 6, the lower surface 20b of the die pad 20 is exposed from the sealer 40 on the lower surface 40b side of the sealer 40. In the example shown in FIG. 4, the area of the lower surface 20b of the die pad 20 is equal to or larger than the area of the lower surface 40b of the sealer 40. As shown in FIG. 3, in a plan view that is viewed from the upper surface 20t side of the die pad 20, a part of the die pad 20 protrudes outward from one side surface 40s of the plurality of side surfaces 40s of the sealer 40. As shown in FIGS. 3 and 6, a part of the upper surface 20t of the die pad 20 and some (at least the side surface 20s2) of the plurality of side surfaces 20s are exposed from the sealer 40. By increasing the plane size of the die pad 20 and exposing a part of the die pad 20 from the sealer 40 as described in the present embodiment, the efficiency of dissipating the heat generated by the semiconductor chip 10 is improved.

Since the lower surface 20b of the die pad 20 which is connected to the lead 30D serving as the external terminal is exposed from the sealer 40, the cross-sectional area of the conductive path through which the current flows is increased. Therefore, an impedance component of the conductive path can be reduced. Particularly when the lead 30D serves as an external terminal for supporting an output node of a circuit included in the semiconductor device PKG1, the reduction in the impedance component of the conductive path connected to the lead 30D is preferable in that power loss of an output wiring can be directly reduced.

The die pad 20 has a base material 21 made of the same metal material as a metal material making up the leads 30, such as copper (Cu) or an alloy material mainly containing copper (Cu) as a main component. Each of the plurality of leads 30 has a base material 31 made of the same metal material as a metal material making up the die pad 20, such as copper (Cu) or an alloy material mainly containing copper (Cu) as a main component.

The part (outer portion, exposed portion) of the die pad 20 that is exposed from the sealer 40 is covered with the metal film 22. Similarly, the part (outer portion 30X) of lead 30 that is exposed from the sealer 40 is covered with a metal film 32. These metal films 22 and 32 are metal films that are for improving the wetness of the solder material used as a connection material in the mounting of the semiconductor device PKG1 on amounting substrate. The metal films 22 and 32 are, for example, plating metal films formed by an electroplating method. Although described in detail later, each of the metal films 22 and 32 is made of, for example, a solder material containing tin (Sn).

The die bond material (bonding material) 11 shown in FIGS. 5 and 6 is a conductive member (die bond material) for fixing the semiconductor chip 10 onto the die pad 20 and electrically connecting the semiconductor chip 10 to the die pad 20. As the die bond material 11, for example, a solder material may be used. Alternatively, the die bond material 11 may be a conductive resin bonding material containing a plurality of silver (Ag) particles (Ag filler), which is referred to as so-called silver (Ag) paste. Although not shown in the drawing, note that a metal film (not shown in the drawing) having a larger bonding property to the die bond material 11 than that of copper (Cu) or a copper alloy that is the base material of the die pad 20 may be formed on a part of the upper surface 20t of the die pad 20. In this manner, the strength of the bonding between the die bond material 11 and the die pad 20 can be improved.

As shown in FIG. 5, the gate electrode pad GE of the semiconductor chip 10 and the lead 30G are electrically connected to each other via a wire 12 (specifically, wire 12G). Similarly, the source electrode pad SE of the semiconductor chip 10 and the lead 30S are electrically connected to each other via a wire (conductive member, metal line) 12 (specifically, wire 12S). The wire 12 is a conductive member connecting the electrode pad on the front surface 10t side of the semiconductor chip 10 to the lead 30, and has a main component of, for example, aluminum (Al). Note that various modification examples may be applied to the material making up the wire 12, and a metal material such as copper (Cu), silver (Ag), or gold (Au) may be the main component.

As shown in FIG. 5, one end of the wire 12G is bonded to the gate electrode pad GE of the semiconductor chip 10. On the other hand, the other end of the wire 12G, the other end being opposite to the one end, is bonded to an upper surface 30t of a wire bonding portion (lead post, pad, bonding pad, wire connection, bonding portion) 30W, which is formed on a part of the lead 30G.

As shown in FIGS. 5 and 6, one end of the wire 12S is bonded to the source electrode pad SE of the semiconductor chip 10. On the other end, the other end of the wire 12S, the other end being opposite to the one end, is bonded to the upper surface 30t of the wire bonding portion (lead post, pad, bonding pad, wire connection, bonding portion) 30W, which is formed on a part of the lead 30S.

In the power semiconductor device, through a wiring path connected to the source electrode pad SE, a current flows to be larger than a current flowing through a wiring path connected to the gate electrode pad GE. For this reason, in the example shown in FIG. 5, the wire 12S is made thicker than the wire 12G. Note that the shape and the number of the wires 12 are not limited to the aspect in FIG. 5, and various modification examples are applicable. For example, the wire 12G and the wire 12S may be identical to each other in thickness. In another case, for example, the source electrode pad SE and the lead 30S may be electrically connected to each other via a plurality of wires 12S. According to the present embodiment, the plurality of wires 12S are connected to the source electrode pad SE of the semiconductor chip 10 although described in detail later. By connecting the plurality of thick wires 12S to the source electrode pad SE as described above, the impedance of the conductive path leading to the source S of FIG. 1 can be reduced.

Figure 7:
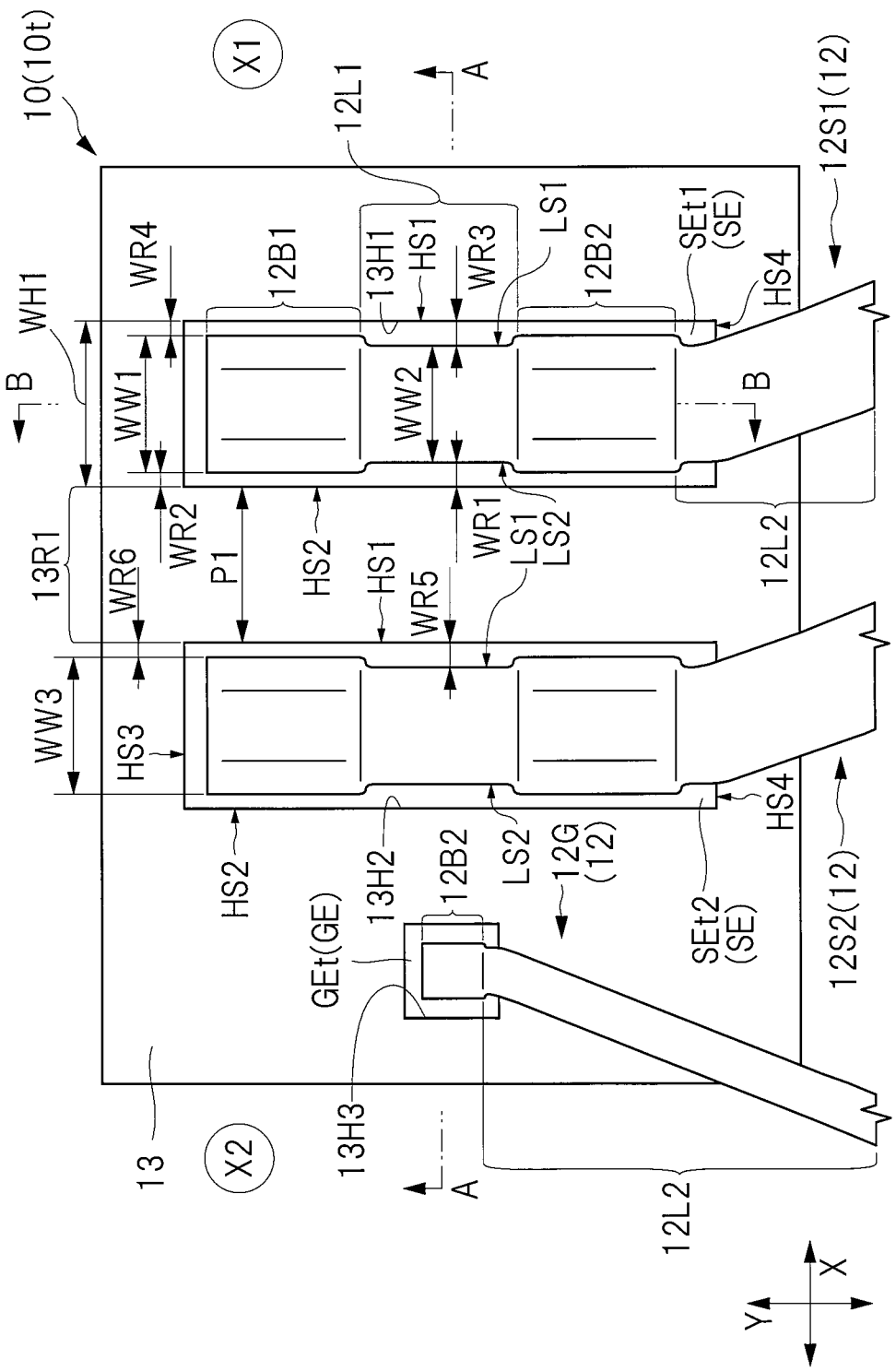
FIG. 7 is an enlarged plan view enlarging and showing a periphery of an upper surface of the semiconductor chip shown in FIG. 5.

The semiconductor chip 10, the plurality of leads 30, and the plurality of wires 12 are sealed with the sealer 40. The sealer 40 is a resin material that seals the semiconductor chip 10 and the plurality of wires 12. Specifically, the sealer 40 is the resin material that seals the semiconductor chip 10 and the plurality of wires 12 so as to be in contact with a bonding surface SEt1 and with a bonding surface SEt2 that are exposed surfaces of the source electrode pad SE as shown in FIG. 7 described later. The sealer 40 has the upper surface 40t (see FIGS. 3 and 6) and the lower surface (mounting surface) 40b (see FIGS. 4 and 6) opposite to the upper surface 40t. As shown in FIGS. 3 and 4, periphery of each of the upper surface 40t (see FIG. 3) and lower surface 40b (see FIG. 4) of the sealer 40 has a plurality of side surfaces 40s. The sealer 40 is made mainly of, for example, a thermosetting resin such as epoxy-based resin. In the present embodiment, in order to improve the characteristics (e.g., thermal expansion characteristics due to thermal influence) of the sealer 40, filler particles such as silica (silicon dioxide: $SiO_2$) particles are mixed into the resin material.

<Details of Connected Parts Between Wires and Electrode Pads>

Figure 8:
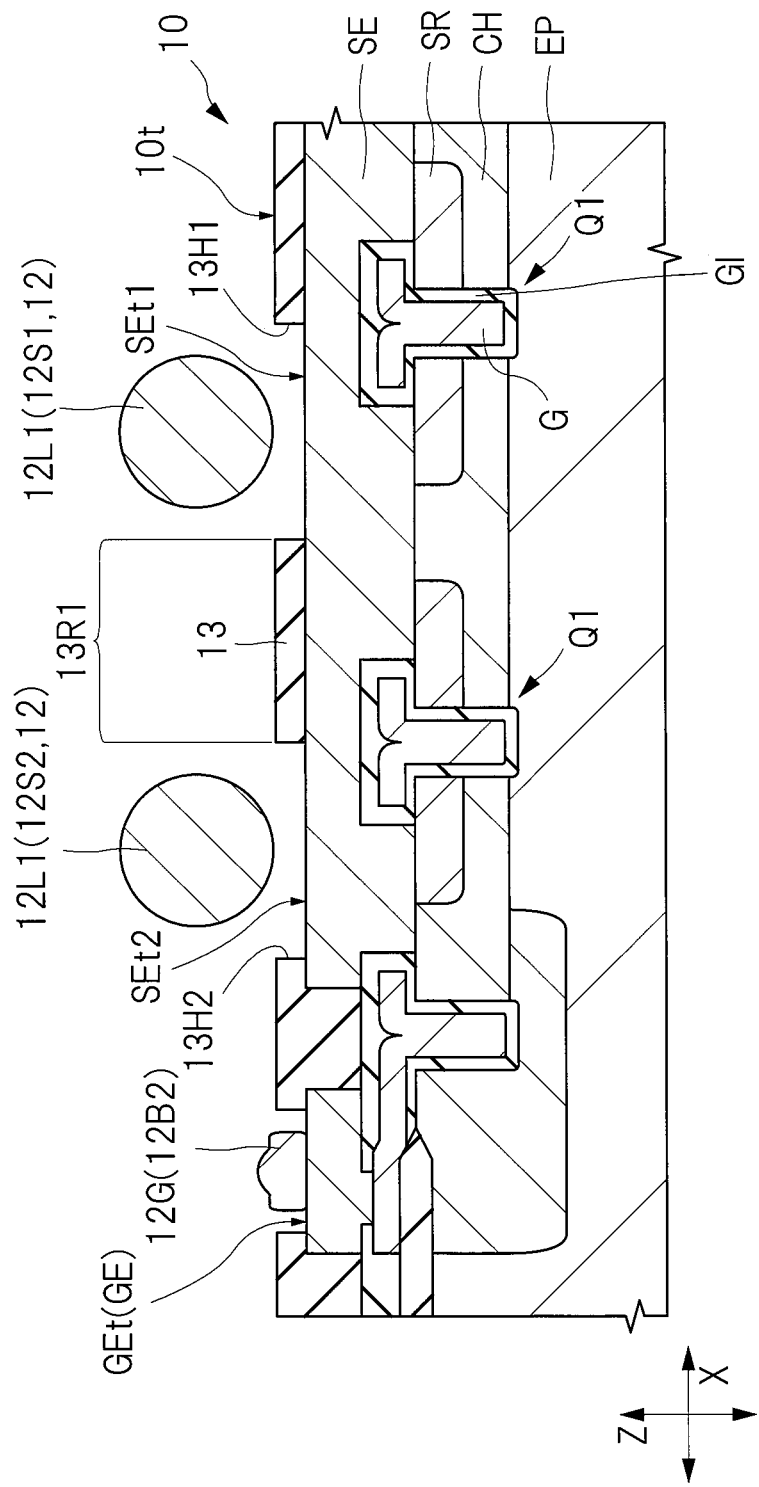
FIG. 8 is an enlarged cross-sectional view taken along a line A-A of FIG. 7.
Figure 9:
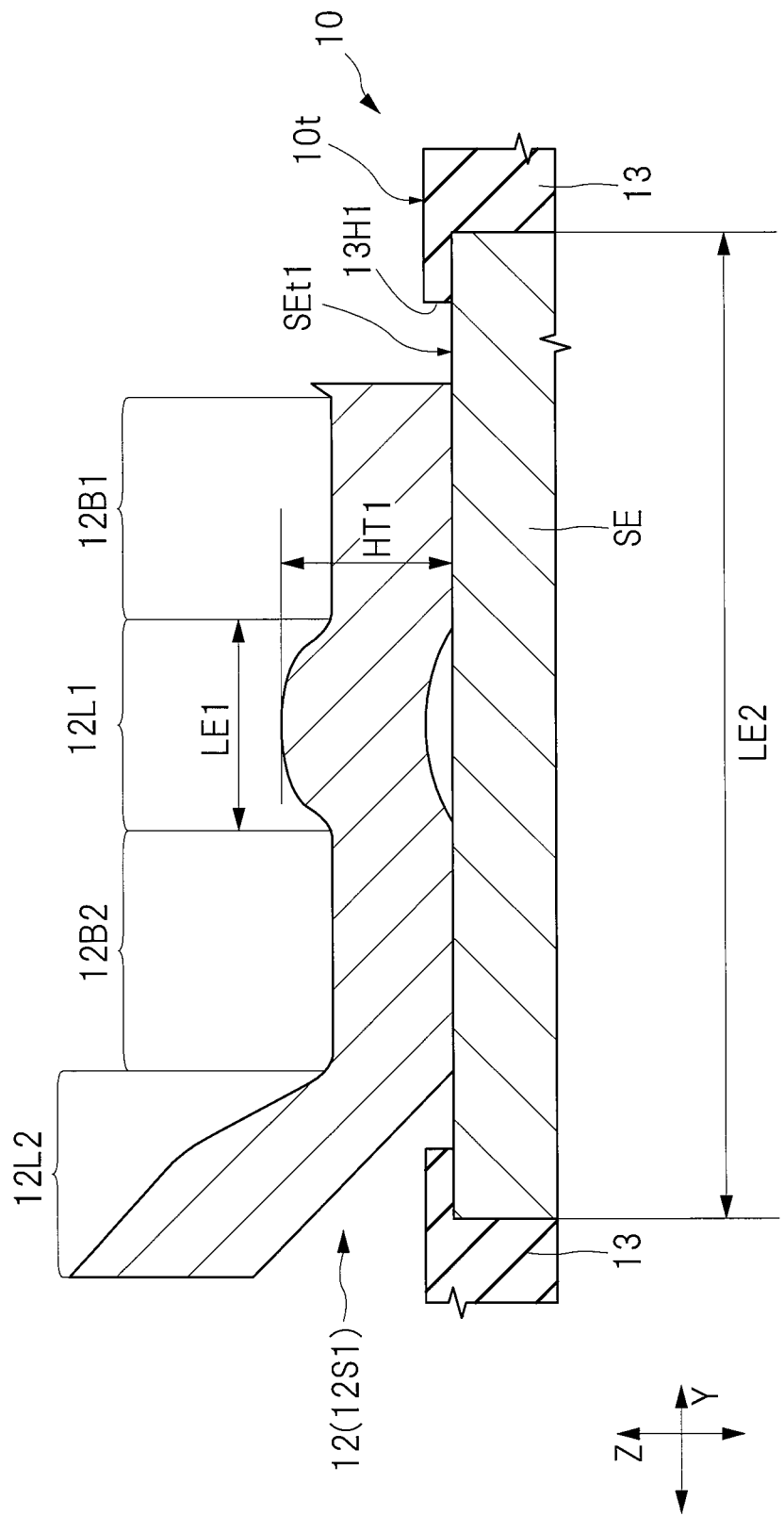
FIG. 9 is an enlarged cross-sectional view taken along a line B-B of FIG. 7.

Here, the details of a part at which the electrode pad of the semiconductor chip is connected to the wire will be described. FIG. 7 is an enlarged plan view showing periphery of the upper surface of the semiconductor chip shown in FIG. 5. FIG. 8 is an enlarged cross-sectional view taken along a line A-A of FIG. 7. FIG. 9 is an enlarged cross-sectional view taken along a line B-B of FIG. 7. In FIG. 8, two transistors Q1 of the large number of transistors Q1 included in the semiconductor chip 10 are representatively shown. As shown in FIG. 7, an insulating film 13 is formed on the front surface 10t of the semiconductor chip 10. The insulating film 13 is a protective film that protects the front surface 10t of the semiconductor chip 10. Most of the front surface 10t is covered with the insulating film (protective film) 13. In the case of the present embodiment, the insulating film 13 is an organic film made of an organic material so as to be, for example, a polyimide film. When the insulating film 13 is the organic film, the bonding strength between the insulating film 13 and the sealer 40 made of a resin is particularly enhanced. However, composite materials of the insulating film 13 have various modification examples. For example, an organic film other than the polyimide film may be adopted. Alternatively, an inorganic insulating film made of silicon oxide ($SiO_2$) or silicon nitride (SiN) may be adopted. In consideration of the bonding strength with the sealer 40, an organic film is more preferable than an inorganic insulating film. However, the bonding strength between the inorganic insulating film and the sealer 40 is higher than the bonding strength between a metal material and the sealer 40.

A plurality of openings are formed in the insulating film 13. In an example shown in FIG. 7, openings 13H1, 13H2, and 13H3 are formed in the insulating film 13. From each of the openings 13H1, 13H2, and 13H3, apart of a conductor pattern formed on a lower layer of the insulating film 13 is exposed. Specifically, in the opening 13H1, the bonding surface (exposed surface, bonding portion) SEt1, which is a part of the source electrode pad SE, is exposed from the insulating film 13. In the opening 13H2, the bonding surface (exposed surface, bonding portion) SEt2, which is another part of the source electrode pad SE, is exposed from the insulating film 13. In the opening 13H3, a bonding surface GEt, which is a part of the gate electrode pad GE, is exposed from the insulating film 13.

A wire (source wire) 12S1 is bonded to the bonding surface SEt1, while a wire (source wire) 12S2 is bonded to the bonding surface SEt2. A wire (gate wire) 12G is bonded to the bonding surface GEt. Specifically, the wire 12S1 has a connecting portion (bonding portion, stitch portion) 12B1 bonded to the bonding surface SEt1, a connecting portion (bonding portion, stitch portion) 12B2 bonded to the bonding surface SEt1, and a loop portion 12L1 located between the connecting portion 12B1 and the connecting portion 12B2 in the Y direction in a plan view. Each of the connecting portions 12B1 and 12B2 is a part of the wire 12, the part being thermally compression-bonded to the electrode pad of the semiconductor chip 10, and each lower surface of the connecting portions 12B1 and 12B2 is bonded to the same (common) bonding surface SEt1. The loop portion 12L1 is a portion that couples the connecting portions 12B1 to the connecting portions 12B2, and is separated from the bonding surface SEt1 (see FIG. 8). The wire 12S1 has a connecting portion (bonding portion, stitch portion) 12B3 bonded to the wire bonding portion 30W of the leads 30 shown in FIG. 5. The wire 12S1 also has a loop portion 12L2 that is located between the connecting portion 12B2 shown in FIG. 7 and the connecting portion 12B3 (see FIG. 5) and that couples the connecting portion 12B2 to the connecting portion 12B3.

Although the wire 12S2 is not denoted with a reference character in FIG. 7, the wire 12S2 has the same configuration with that of the wire 12S1. That is, the wire 12S2 has a connecting portion (bonding portion, stitch portion) 12B1 bonded to the bonding surface Set2, a connecting portion (bonding portion, stitch portion) 12B2 bonded to the bonding surface Set2, and a loop portion 12L1 located between the connecting portion 12B1 and the connecting portion 12B2 in the Y direction in a plan view. Each lower surface of the connecting portions 12B1 and 12B2 is bonded to the same (common) bonding surface Set2. The loop portion 12L1 is separated from the bonding surface Set2 (see FIG. 8). The wire 12S2 has a connecting portion (bonding portion, stitch portion) 12B3 bonded to the wire bonding portion 30W of the leads 30 shown in FIG. 5. As shown in FIG. 7, the wire 12Ss also has a loop portion 12L2 that is located between the connecting portion 12B2 and the connecting portion 12B3 (see FIG. 5) and that couples the connecting portion 12B2 to the connecting portion 12B3.

In other words, each of the wire 12S1 and the wire 12S2, which are connected to the source electrode pad SE, is bonded to one bonding surface SEt1 (or bonding surface SEt2) at a plurality of parts. In this case, a (total) bonding area between the wire 12S1, the wire 12S2 and the bonding surface SEt1, the bonding surface SEt2 becomes large, and therefore, an impedance of a supply path for a potential supplied through the wires 12S1 and 12S2 can be reduced.

The wire 12G connected to the gate electrode pad GE is different in a structure from the wires 12S1 and 12S2. That is, the wire 12G is bonded to one bonding surface GEt at one part. Specifically, the wire 12G has a connecting portion (bonding portion, stitch portion) 12B2 bonded to the bonding surface GEt, a connecting portion (bonding portion, stitch portion) 12B3 (see FIG. 5) bonded to the wire bonding portion 30W (see FIG. 5) of the leads 30 (see FIG. 5), and a loop portion 12L2 located between the connecting portion 12B2 and the connecting portion 12B3. However, the wire 12G does not have the portions corresponding to the connecting portion 12B1 and loop portion 12L1 of each of the wires 12S1 and 12S2. To the wire 12G, a signal (gate signal) for controlling the switching operation of the transistor Q1 (see FIG. 1) is transmitted. A transmission path through the wire 12G has a relatively smaller influence on a performance of a switching circuit than transmission paths provided through the wires 12S1 and 12S2 even if the impedance of the transmission path is large. For this reason, the wire 12G is bonded to one bonding surface GEt at one part. By simplification of the structure of the connected part between the wire 12G and the semiconductor chip 10, a manufacturing process can be simplified.

Incidentally, as shown in FIG. 8, in the present embodiment, each of the bonding surfaces SEt1 and SEt2 is a part of the source electrode pad SE, which is one conductive pattern. In other words, the bonding surface SEt1 is a first part of the source electrode pad SE, while the bonding surface SEt2 is a second part of the source electrode pad SE. For connection of a plurality of wires 12 to one source electrode pad SE, for example, a method of bonding both of the wire 12S1 and wire 12S2 to the bonding surface SEt1 exposed from one opening 13H1 by increasing an opening area of the opening 13H1 is considered. In this case, a margin for a positional shift caused when the wires 12 is bonded to the bonding surface SEt1 becomes large.

However, according to the studies of the inventors of the present application, it has been found that separation of the sealer 40 from the source electrode pad SE occurs at the bonding interface therebetween because of the low bonding strength between the sealer 40 (see FIG. 6) which contains the organic-based material as a main component and the source electrode pad SE which contains the metal material (e.g., aluminum) as a main component. In addition, since a difference in a linear expansion coefficient between the sealer 40 and the source electrode pad SE is large, such separation is easily caused by a temperature change applied to a package obtained after the completed sealer 40 is formed. As described above, in the sealer 40, the filler particles such as silica particles are mixed into the resin material. Therefore, a linear expansion coefficient as much as the linear expansion coefficient of silicon (Si) making up the semiconductor substrate can be adopted. However, this case also has the large difference in the linear expansion coefficient from the source electrode pad SE, and therefore, the above-described separation tends to occur.

Even if the sealer 40 separates from the source electrode pad SE, the function of the semiconductor device PKG1 (see FIG. 6) is not immediately damaged. However, in consideration of a long-term product quality such as the service life of the semiconductor device PKG1, it is preferable to suppress the separation between the source electrode pad SE and the sealer 40.

As described above, the separation at the bonding interface between the insulating film 13 and the sealer 40 is more difficult to occur than the separation at the bonding interface between the source electrode pad SE that is the metal film and the sealer 40. For example, when the insulating film 13 is made of polyimide which is an organic-based material, an adhesive property with the sealer 40 is high, so that the bonding strength can be improved. Also when the insulating film 13 is made of an inorganic insulating film made of silicon oxide, silicon nitride, etc., as a modification example, the adhesive property with the sealer 40 can be higher than that in a case of a metal film. When the insulating film 13 is an inorganic insulating film made of silicon oxide, silicon nitride, etc., a difference in the linear expansion coefficient from the sealer 40 can be reduced, and therefore, the above-described separation is difficult to occur.

In the above-described manner, it is preferable to reduce an area of a part of the source electrode pad SE, the part being exposed from the insulating film 13, from the viewpoint of suppressing the separation between the sealer 40 and the source electrode pad SE. As shown in FIG. 7, in the present embodiment, the bonding surface SEt1 to which the wire 12S1 is bonded and the bonding surface SEt2 to which the wire 12S2 is bonded are exposed from the insulating film 13 in the different openings 13H1 and 13H2, respectively. As a result, in a plan view, in a region 13R1 between the bonding surface SEt1 and the bonding surface SEt2, the source electrode pad SE is covered with the insulating film 13 (see FIG. 8). Specifically, in a plan view, the periphery of each of the bonding surface SEt1 and bonding surface SEt2 has a side (portion) HS1 extending in the Y direction and a side (portion) HS2 extending in the Y direction and being opposite to the side HS1. In the X direction intersecting the Y direction in a plan view, the side HS2 of the bonding surface SEt1 and the side HS1 of the bonding surface SEt2 are arranged adjacent to each other across the region 13R1 of the insulating film 13. Each of the bonding surface SEt1 and the bonding surface SEt2 has a side (portion) HS3 and a side (portion) HS4 both extending in the X direction intersecting the Y direction. In the present embodiment, each of the bonding surface SEt1 and the bonding surface SEt2 has a rectangular shape, and the sides HS1 and HS2 extending in the Y direction are long sides of the rectangular shape.

In other words, in a plan view, each of the openings 13H1 and 13H2 of the insulating film 13 has the side HS3 extending in the X direction, the side HS4 extending in the X direction and opposite to the side HS3, the side HS1 extending in the Y direction intersecting the X direction, and the side HS2 extending in the Y direction and opposite to the side HS1. In a plan view, the side HS2 of the opening 13H1 and the side HS1 of the opening 13H2 are arranged adjacent to each other across the region 13R1 of the insulating film 13.

The configuration of the periphery of each of the bonding surface SEt1 and bonding surface SEt2 shown in FIG. 7 may also be defined as follows. That is, in a plan view, the bonding surface SEt1 and bonding surface SEt2 are arranged side by side along the X direction (orthogonally in FIG. 7) intersecting the Y direction. The periphery of each of the bonding surface SEt1 and bonding surface SEt2 has the portion (side HS1) closer to one side (X1 side) of the wire (wire 12S1 or 12S2) bonded to the bonding surface (bonding surface SEt1 or SEt2) and the portion (side HS2) closer to the other side (X2 side) of the wire.

In the present embodiment, the distance between the bonding surface SEt1 and the bonding surface SEt2 (in other words, the distance between the opening 13H1 and the opening 13H2) is large. For example, in the example shown in FIG. 7, the width (thickness) P1 of the region 13R1 in the X direction is 500 μm. A value of this width P1 is larger than a value (e.g., 400 μm) of a wire diameter of each of the wires 12S1 and 12S2. In the X direction, the width (thickness) P1 of the region 13R1 is larger than the width (thickness) WW1 of the connecting portion 12B1 of the wire 12S1. The width (thickness) WW1 of the connecting portion 12B1 is defined by a condition under which the connecting portion 12B1 is pressed when the wire 12 is bonded to the bonding surface SEt1 and the bonding surface SEt2, and is, for example, 470 μm. In the present embodiment, each of the connecting portions 12B1 and 12B2 of the wire 12S1 and the connecting portions 12B1 and 12B2 of the wire 12S2 is bonded under the same condition as one another. The width of each of these connecting portions in the X direction is 470 μm.

In the present embodiment, the loop portion 12L1 of each of the wires 12S1 and 12S2 extends in the Y direction orthogonally intersecting the X direction. Therefore, the width (thickness) WW2 of the loop portion 12L1 in the X direction is almost equal to the diameter of each of the wires 12S1 and 12S2, and the width (thickness) WW2 is 400 μm in the present embodiment. That is, in the X direction, the width (thickness) P1 of the region 13R1 is larger than the width (thickness) WW2 of the loop portion 12L1 of the wire 12S1.

The width (thickness) WW2 of the loop portion 12L1 of each of the wires 12S1 and 12S2 can be defined as follows. That is, in a plan view, each of the loop portion 12L1 of the wire 12S1 and the loop portion 12L1 of the wire 12S2 has a side LS1 extending from the connecting portion 12B1 to the connecting portion 12B2 in the Y direction and a side LS2 opposite to the side LS1. The width (thickness) WW2 of the loop portion 12L1 is defined as a width (length) of a part sandwiched between the side LS1 and the side LS2 in the X direction.

In this manner, by the large width P1 of the region 13R1 sandwiched between the bonding surface SEt1 and the bonding surface SEt2, a width of an exposed part of the bonding surface SEt1 in the X direction, in other words, an opening width of the opening 13H1, can be reduced. For example, in the example shown in FIG. 7, the width WH1 of the bonding surface SEt1 (in other words, the width of the opening 13H1) in the X direction is 570 μm. A value of this width WH1 is larger than a value of the width P1 of the region 13R1. However, the bonding surface SEt1 is not in contact with the sealer 40 (see FIG. 6) at a part of bonding surface SEt1, the part being bonded with the wire 12, and therefore, the above-described separation does not occur at this part. Since the loop portion 12L1 is separated from the bonding surface SEt1 as shown in FIG. 9, the sealer 40 is provided between the loop portion 12L1 and the bonding surface SEt1. However, according to the studies by the inventors of the present application, the separation of the sealer 40 is more difficult to occur in the region sandwiched between the loop portion 12L1 and the bonding surface SEt1 than other exposed regions. For this reason, from the viewpoint of suppressing the separation between the sealer 40 and the bonding surface SEt1, the small width and area of the part of the bonding surface SEt1, the part not overlapping the wire 12S1 in a plan view in FIG. 7, is important.

In the present embodiment, in the X direction, the maximum width of the region of the bonding surface SEt1, the region being sandwiched between the wire 12S1 and the side HS2 of the bonding surface SEt1, is smaller than the width P1 of the region 13R1 of the insulating film 13. Note that the above-described maximum width means the maximum of a plurality of widths, if any, in the region sandwiched between the wire 12S1 and the side HS2 of the bonding surface SEt1. For example, in the example shown in FIG. 7, a value of the width WR1 of a region sandwiched between the loop portion 12L1 of the wire 12S1 and the side HS2 of the bonding surface SEt1 is larger than a value of the width WR2 of a region sandwiched between the connecting portion 12B1 of the wire 12S1 and the side HS2 of the bonding surface SEt1. A value of the width WR1 in the region sandwiched between the wire 12S1 and the side HS2 of the bonding surface SEt1 is larger than a value of a width in any other part. In this case, the value of the width WR1 is the above-described maximum width.

In the example shown in FIG. 7, the center of the loop portion 12L1 of the wire 12S1 is arranged so as to overlap the center of the bonding surface SEt1 in the X direction, and each value of the width WR1 and a width WR3 is 85 µm. On the other hand, each value of the width WR2 and a width WR4 is 50 µm. When the wire 12S1 is bonded, the larger the value of each of the width WR2 and the width WR4 is, the larger the margin for the positional accuracy of wire bonding is. When the side HS2 extends in the Y direction, the width WR1 becomes the maximum width in many cases.

In the present embodiment, in the X direction, the total of the maximum width (width WR1) of the region of the bonding surface SEt1, the region being sandwiched between the wire 12S1 and the side HS2 of the bonding surface SEt1, and the maximum width (width WR3) of the region of the same, the region being sandwiched between the wire 12S1 and the side HS1 of the bonding surface SEt1, is smaller than the width P1 of the region 13R1 of the insulating film 13. According to the present embodiment, since the values of the widths WR1 and WR3 are small, the separation between the sealer 40 (see FIG. 6) and the bonding surface SEt1 can be suppressed.

In the present embodiment, the structure of the bonding between the bonding surface SEt2 and the wire 12S2 shown in FIG. 7 is the same as the structure of the bonding between the bonding surface SEt1 and the wire 12S1. For example, the wire diameter (diameter) of the wire 12S2 is the same as the diameter of the wire 12S1, and is, for example, 400 µm. In the X direction shown in FIG. 7, the width WW3 of the connecting portion 12B1 of the wire 12S2 (as well as the width of the connecting portion 12B2 of the wire 12S2) is the same as the width WW1 of the connecting portion 12B1 of the wire 12S1, and is, for example, 470 µm. Although the repetitive description is omitted, for example, the relation in the size between the widths WR1, WR2, WR3, and WR4 and the width P1 of the region 13R1 is similarly described for the bonding surface SEt1 in the present embodiment.

When the structure of the bonding between the bonding surface SEt2 and wire 12S2 is the same as the structure of the bonding between the bonding surface SEt1 and wire 12S1, the following can be described. That is, in the X direction, in the region sandwiched between the wire 12S1 and the wire 12S2, the total of the maximum width (width WR1) of the region sandwiched between the wire 12S1 and the side HS2 of the bonding surface SEt1 and the maximum width (width WR5) of the region sandwiched between the wire 12S2 and the side HS1 of the bonding surface SEt2 is smaller than the width P1 of the region 13R1 of the insulating film 13.

Each value of the widths WR1, WR2, WR3, and WR4 shown in FIG. 7 is smaller than the wire diameter of the wire 12S1 (the width WW2 of the loop portion 12L1). In the present embodiment, the total of the width W1 and the width W3 is smaller than the wire diameter of the wire 12S1 (i.e., the width WW2 of the loop portion 12L1). For example, in the above-described example, the total of the width WR1 and the width WR3 is equal to or smaller than half of the wire diameter of the wire 12S1 (i.e., the width WW2 of the loop portion 12L1).

As described above, according to the present embodiment, in the X direction that is the short-side direction of the rectangular-shaped bonding surfaces SEt1 and SEt2, the width of the part of the bonding surfaces SEt1 and SEt2, the part not overlapping the wires 12, is made small. In this manner, the area of the part from which the sealer 40 of FIG. 6 easily separates can be reduced, and therefore, the occurrence of the separation can be suppressed.

As seen in the case of the present embodiment, when the width P1 of the region 13R1 is made small while the opening area of the opening 13H1 and the opening area of the opening 13H2 are smaller than the wire diameters (diameters) of the wires 12S1 and 12S2, the distance between the wire 12S1 and the wire 12S2 adjacent to each other is short. If more wires 12 can be bonded to the source electrode pad SE by the short distance between the adjacent wires 12S1 and wire 12S2, a cross-sectional area of the conductive path becomes large, and therefore, this manner is preferable from the viewpoint of the impedance reduction. However, if the distance between the adjacent wires 12S1 and wire 12S2 is extremely short, there is a possibility of causing a bonding tool (e.g., wedge tool WT shown in FIG. 19 described later) to be in contact with a next wire in the wire bonding.

In the present embodiment, each value of the width WR2 of the region sandwiched between the connecting portion 12B1 of the wire 12S1 and the side HS2 of the bonding surface SEt1 and the width WR6 of the region sandwiched between the connecting portion 12B1 of the wire 12S2 and the side HS1 of the bonding surface SEt2 shown in FIG. 7 is such a small value as about 50 µm. However, since the width P1 of the region 13R1 is larger than the width WW1 of the connecting portion 12B1 of the wire 12S1, the (minimum) distance between the wire 12S1 and wire 12S2 adjacent to each other in the X direction is larger than at least the width WW1 of the connecting portion 12B1. As a result, for example, when the wire 12S1 is bonded, the contact of the bonding tool with the adjacent wire 12S2 is suppressed.

Figure 10:
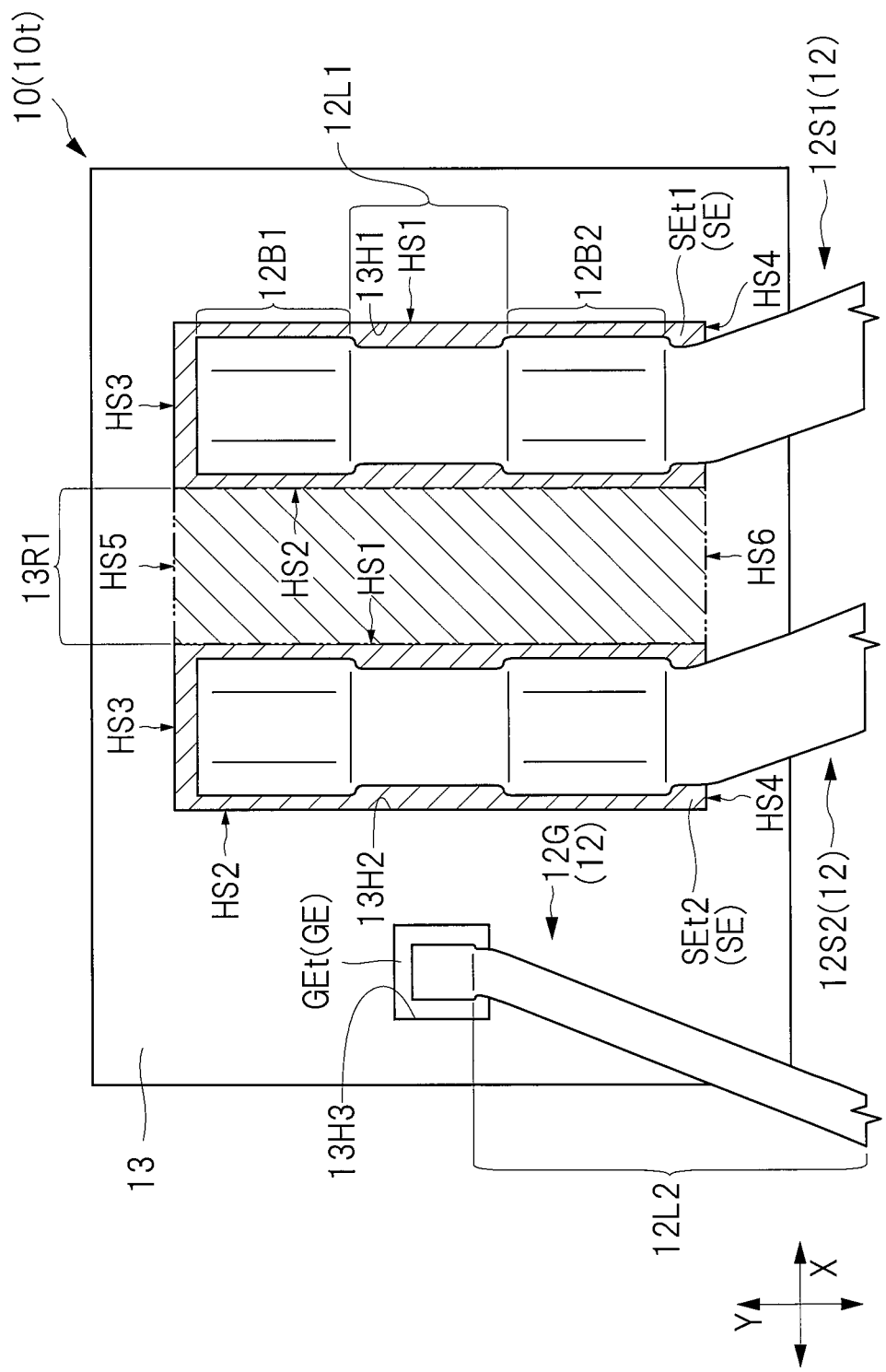
FIG. 10 is an enlarged plan view indicating a range of a region of an insulating film shown in FIG. 7, the region being sandwiched between bonding surfaces adjacent to each other.

Regarding the small exposed area of each of the bonding surfaces SEt1 and SEt2 in the present embodiment, the area of the region 13R1 is defined as follows as shown in FIG. 10. FIG. 10 is an enlarged plan view clearly showing a range of a region of the insulating film shown in FIG. 7, the region being sandwiched between the bonding surfaces adjacent to each other. In FIG. 10, the range of the region 13R1 is indicated by two-dot chain line, and hatching is added to the bonding surfaces SEt1 and SEt2 and the region 13R1.

As shown in FIG. 10, the outer periphery of the region 13R1 has the side HS2 of the opening 13H1 (bonding surface SEt1) and the side HS1 of the opening 13H2 (bonding surface SEt2). The outer periphery of the region 13R1 also has a side HS5 extending from an intersection between the side HS3 and side HS2 of the opening 13H1 (bonding surface SEt1) to an intersection between the side HS3 and side HS1 of the opening 13H2 (bonding surface SEt2), and a side HS6 extending from an intersection between the side HS4 and side HS2 of the opening 13H1 (bonding surface SEt1) to an intersection between the side HS4 and side HS1 of the opening 13H2 (bonding surface SEt2). In the example of the present embodiment, the opening area of the opening 13H1 (the area of the bonding surface SEt1) is equal to the opening area of the opening 13H2 (the area of the bonding surface SEt2). And, the opening area of the opening 13H1 (the area of the bonding surface SEt1) is larger than the area of the region 13R1. However, an area of a part of the opening area of the opening 13H1 (the area of the bonding surface SEt1), the part not overlapping the wire 12S1, (that is, the area is an area of the region where the separation tends to occur) is smaller than the area of the region 13R1. Similarly, the opening area of the opening 13H2 (the area of the bonding surface SEt2) is larger than the area of the region 13R1. However, an area of a part of the opening area of the opening 13H2 (the area of the bonding surface SEt2), the part not overlapping the wire 12S2 (that is, the area is the area of the region where the separation tends to occur) is smaller than the area of the region 13R1.

In this manner, in order to bond the thick wires 12S1 and 12S2 to the source electrode pad SE, the areas of the bonding surfaces SEt1 and SEt2 become large. However, in the present embodiment, the area of each region of the bonding surfaces SEt1 and SEt2, the region tending to cause the separation, that is, the area of the part of the bonding surfaces SEt1 and SEt2, the part not overlapping the wires 12S1 and 12S2, is reduced, the separation between the sealer 40 (see FIG. 6) and the bonding surfaces SEt1 and SEt2 can be suppressed.

Figure 11:
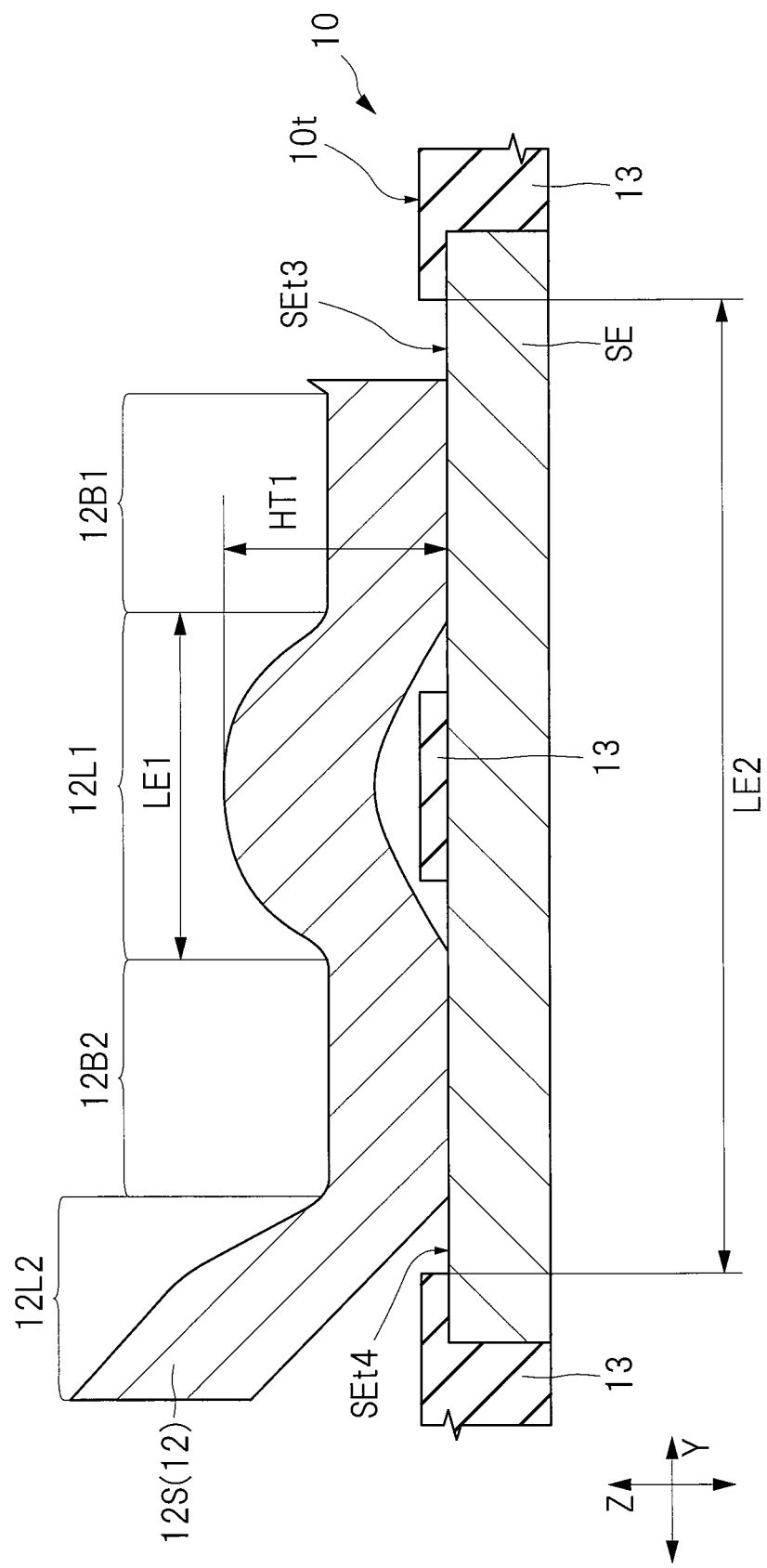
FIG. 11 is an enlarged cross-sectional view showing a study example of FIG. 9.

A structure shown in a study example shown in FIG. 11 can be considered from the viewpoint of the reduction in the exposed area of the source electrode pad SE. FIG. 11 is an enlarged cross-sectional view of a study example of FIG. 9. The study example of FIG. 11 is different from the aspect of FIG. 9 in that one wire 12S is bonded to a bonding surface SEt3 and a bonding surface SEt4 that are separated from each other across the insulating film 13. In other words, in the example shown in FIG. 11, on the front surface 10t of the semiconductor chip 10, the wire 12S is bonded to the source electrode pad SE at two parts, and the bonding surface SEt3 and the bonding surface SEt4, to which the wire 12S is bonded, are separated from each other. In still other words, in the example of FIG. 11, the insulating film 13 is interposed between the loop portion 12L1 of the wire 12S and the source electrode pad SE. In the example shown in FIG. 9, no insulating film 13 is interposed between the loop portion 12L1 of the wire 12S1 and the source electrode pad SE. In the example shown in FIG. 11, since the bonding surface SEt3 and the bonding surface SEt4 are separated from each other across the insulating film 13 on the front surface 10t, the exposed area of the source electrode pad SE can be smaller than that in the example of the present embodiment shown in FIG. 9.

However, the example shown in FIG. 9 is more preferable in the following points that have been found by the comparison between FIG. 9 and FIG. 11. That is, in the example shown in FIG. 11, it is required to form the loop portion 12L1 of the wire 12S into such a shape as not coming in contact with the insulating film 13. For this reason, when a distance from the exposed surface of the source electrode pad SE to a part of the loop portion 12L1, the part being positioned at the farthest from the exposed surface, is defined as a loop height HT1, the loop height HT1 of the example shown in FIG. 9 can be smaller than the loop height HT1 of the example shown in FIG. 11. When the length of the loop portion 12L1 in the Y direction (in other words, the distance between the connecting portion 12B1 and the connecting portion 12B2) is defined as a loop length LE1, the loop length LE1 of the example shown in FIG. 9 can be smaller than the loop length LE1 of the example shown in FIG. 11. This is achieved by the fact that the loop height HT1 in the example shown in FIG. 9 can be smaller. If the loop length LE1 can be small, the length LE2 of the source electrode pad SE in the Y direction (the length also including that of a part covered with the insulating film 13) can also be small.

Since the size of the source electrode pad SE in the example shown in FIG. 9 can be made smaller than that in the example shown in FIG. 11, the plane area of the semiconductor chip 10 (the area of the front surface 10t) can be reduced. If the plane area of the semiconductor chip 10 can be small, various advantages can be obtained. For example, the plane area of the semiconductor device PKG1 (see FIG. 5) on which the semiconductor chip 10 is mounted can be small. Further, for example, when a semiconductor chip is manufactured, the number (yield efficiency) of semiconductor chips that can be obtained from one semiconductor wafer is improved, so that a manufacturing efficiency of the semiconductor chip is improved.

The short length LE2 of the source electrode pad SE in the Y direction is preferable in the following points. That is, a stress caused by a difference in the linear expansion coefficient between the source electrode pad SE and the sealer 40 becomes large in proportion to the length of the source electrode pad SE. Therefore, as shown in FIG. 9, according to the present embodiment, the length LE2 of the source electrode pad SE in the Y direction can be made small, and therefore, the stress caused by the difference in linear expansion coefficient between the source electrode pad SE and the sealer 40 can be reduced. As a result, the separation between the sealer 40 and the source electrode pad SE, which is caused by such a stress, can be suppressed.

The sealer 40 shown in FIG. 6 is formed so as to be in contact with the bonding surface GEt, which is the exposed surface of the gate electrode pad GE shown in FIG. 10. Therefore, from the viewpoint of suppressing the separation between the sealer 40 and the bonding surface GEt, it is preferable to reduce an area of a region of the bonding surface Get, the region not overlapping the wire 12G. However, in the present embodiment, the wire diameter (diameter) of the wire 12G is smaller than the wire diameter of each of the wires 12S1 and 12S2, and is, for example, about 125 to 150 µm. The wire 12G is bonded to the gate electrode pad GE at one part but is not bonded thereto at other parts. For this reason, the area of the bonding surface GEt of the gate electrode pad GE is smaller than the area of each of the bonding surfaces SEt1 and SEt2 of the source electrode pad SE. For example, in the example shown in FIG. 10, the area of the bonding surface GEt of the gate electrode pad GE is equal to or smaller than one fourth of the area of each of the bonding surfaces SEt1 and SEt2 of the source electrode pad SE. In other words, the area of each of the bonding surfaces SEt1 and SEt2 is equal to or large than four times as large as the area of the bonding surface GEt. In this manner, the bonding surface GEt is sufficiently smaller in the area than the bonding surfaces SEt1 and SEt2 of the source electrode pad SE. The bonding surface GEt, therefore, is less likely to separate from the sealer 40 than the bonding surfaces SEt1 and SEt2 are. Therefore, on the front surface 10t of the semiconductor chip 10, the bonding surfaces SEt1 and SEt2 of the source electrode pad SE has a higher priority than the bonding surface GEt of the gate electrode pad GE in a part for which a measure for preventing the separation from the sealer 40 is to be performed.

<Method of Manufacturing Semiconductor Device>

Figure 12:
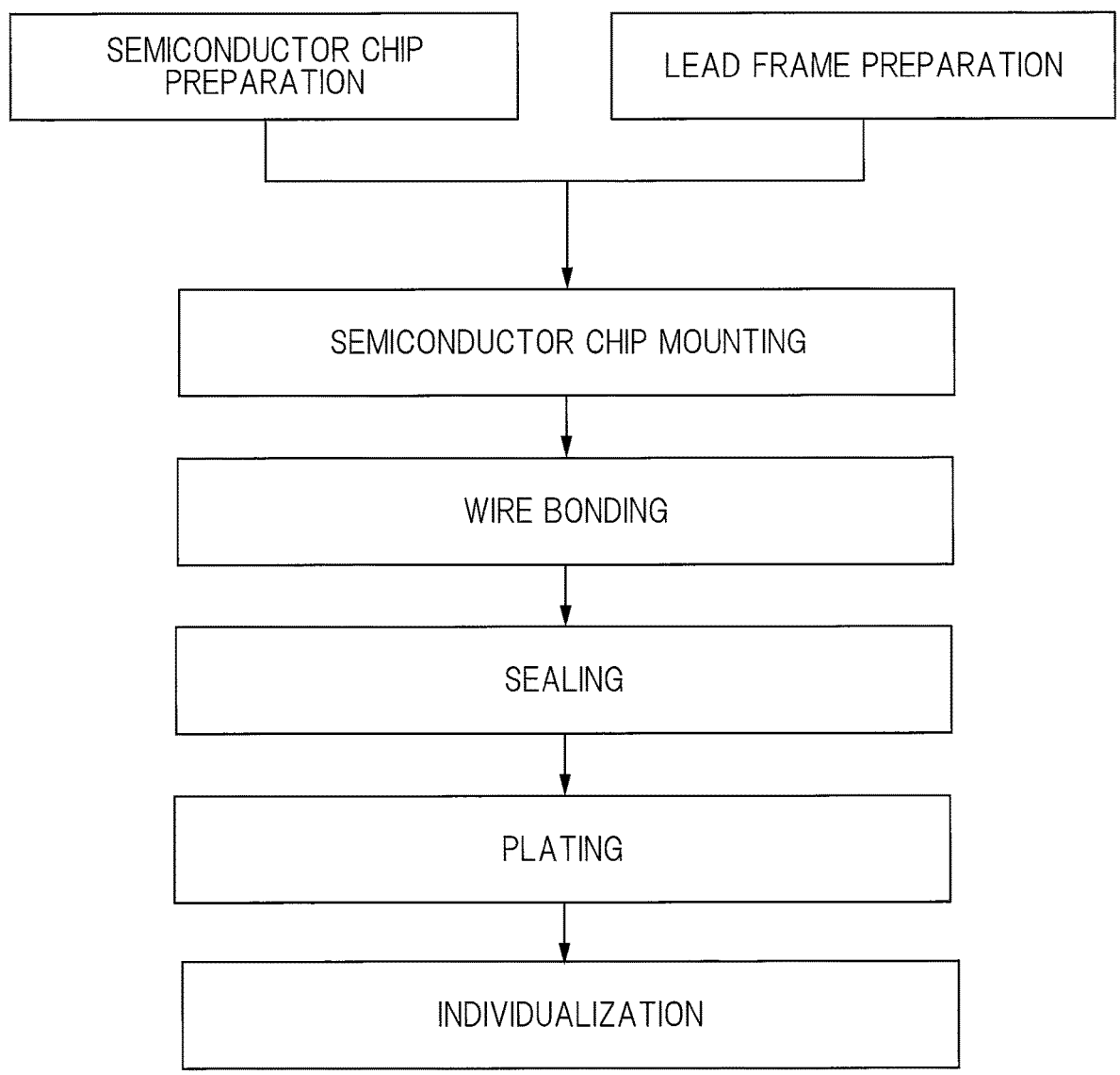
FIG. 12 is an explanatory diagram showing an outline of steps of manufacturing the semiconductor device described with reference to FIGS. 1 to 10.

Next, a method of manufacturing the semiconductor device PKG1 having been described with reference to FIGS. 1 to 10 will be described. The semiconductor device PKG1 is manufactured in accordance with a flow shown in FIG. 12. FIG. 12 is an explanatory diagram showing an outline of the steps of manufacturing the semiconductor device having been described with reference to FIGS. 1 to 10. In the following description, components of the semiconductor device PKG1 will be described with reference to FIGS. 1 to 11 that have been previously described in some cases if needed.

<Semiconductor Chip Preparation Step>

Figure 13:
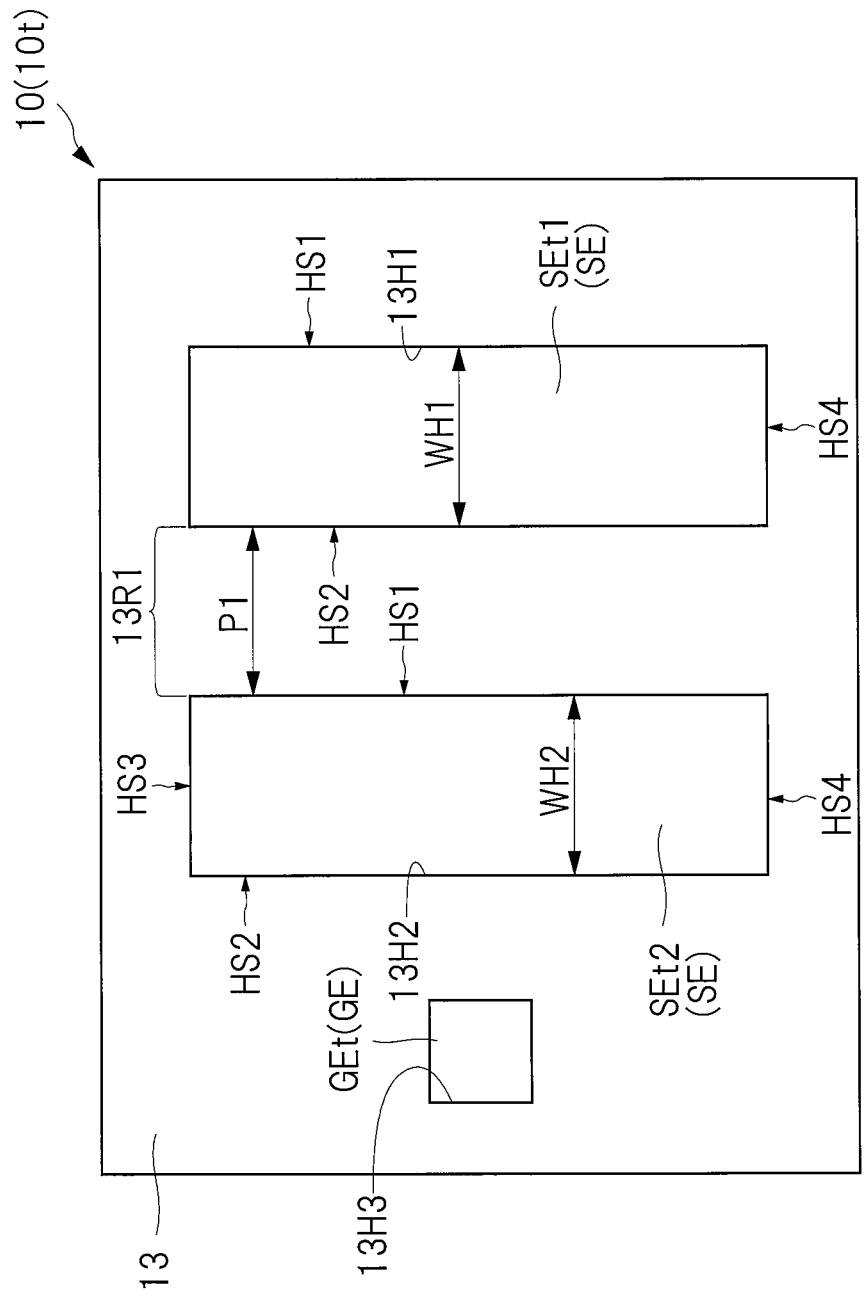
FIG. 13 is a plan view on a front surface (electrode exposed surface) side of a semiconductor chip prepared at a semiconductor chip preparation step shown in FIG. 12.

At a semiconductor chip preparation step shown in FIG. 12, the semiconductor chip 10 shown in FIG. 13 is prepared. FIG. 13 is a plan view showing the front surface (electrode exposed surface) of the semiconductor chip prepared at the semiconductor chip preparation step shown in FIG. 12.

The semiconductor chip 10 prepared at this step includes the front surface 10t on which the insulating film 13 and the source electrode pad (electrode) SE, a part of which is exposed from the insulating film, are formed. The source electrode pad SE has the bonding surface SEt1 that is exposed from the insulating film 13 at the opening 13H1 formed on the insulating film 13, and the bonding surface SEt2 that is exposed from the insulating film 13 at the opening 13H2 formed on the insulating film 13. On the front surface 10t of the semiconductor chip 10, the gate electrode pad (electrode) GE is also formed. The gate electrode pad GE has the bonding surface GEt that is exposed from the insulating film 13 at the opening 13H3 formed on the insulating film 13. The semiconductor chip 10 includes also the back surface 10b opposite to the front surface 10t, as shown in FIG. 6. On the back surface 10b of the semiconductor chip 10, the drain electrode (electrode) DE that is connected electrically to the drain D (see FIG. 1) is formed. In the example shown in FIG. 6, the whole of the back surface 10b of the semiconductor chip 10 becomes the drain electrode D.

As shown in FIG. 13, in a plan view, the opening 13H1 and the opening 13H2 are arranged side by side in the X direction. In a plan view, each of the opening 13H1 and opening 13H2 of the insulating film 13 has the side HS3 extending in the X direction, the side HS4 extending in the X direction and opposite to the side HS3, the side HS1 extending in the Y direction intersecting the X direction, and the side HS2 extending in the Y direction and opposite to the side HS1. In a plan view, the side HS2 of the opening 13H1 and the side HS1 of the opening 13H2 are adjacent to each other across the region 13R1 of the insulating film 13. In the example of the present embodiment, the planar shapes of the opening 13H1 and the opening 13H2, in other words, the shapes of the bonding surface SEt1 and the bonding surface SEt2 are the same as each other. For example, in the X direction, the width WH1 of the opening 13H1 is the same as the width WH2 of the opening 13H2, and is larger than the width P1 of the region 13R1. By the large value of the width WH1, the wire 12S1 with a large wire diameter (see FIG. 7) can be bonded at a wire-bonding step shown in FIG. 12. By the large value of the width WH2, the wire 12S2 with a large wire diameter (see FIG. 7) can be bonded at the wire-bonding step shown in FIG. 12.

The semiconductor chip 10 of FIG. 13 is manufactured as, for example, follows. For example, a semiconductor wafer (not shown) including an n⁻-type epitaxial layer EP formed on the main surface WHt (see FIG. 2) of the semiconductor substrate WH (see FIG. 2) made of, for example, n-type single crystal silicon is prepared, and a plurality of transistors Q1 are formed on the epitaxial layer EP as shown in FIG. 8. The semiconductor wafer includes a large number of chip regions, and a plurality of transistors Q1 are formed in each of the plurality of chip regions. On the transistors Q1, the source electrode pad SE and the gate electrode pad GE are formed. The source electrode pad SE is connected to a plurality of source regions SR, while the gate electrode pad GE is connected to a plurality of gate electrodes G. FIG. 8 shows an example in which the source regions SR are connected directly to the source electrode pad SE. As a modification example, a leading-out wiring (source wiring) may be interposed between the source regions and the source electrode pad SE. Although illustration is omitted in FIG. 8, the gate electrode pad GE is connected to the gate electrodes G via a leading-out wiring (gate wiring) not shown. Subsequently, the insulating film 13 is formed so as to entirely cover the source electrode pad SE and gate electrode pad GE. Then, the openings 13H1, 13H2, and 13H3 shown in FIG. 13 are formed in the insulating film 13 so that a part (i.e., bonding surfaces SEt1 and SEt2) of the source electrode pad SE and a part (i.e., bonding surface GEt) of the gate electrode pad GE are from the insulating film 13. Then, after a necessary test (wafer test), such as electrical test on a circuit, is performed, the wafer is divided into a plurality of semiconductor chips 10. When a metal film is formed on the back surface 10b as the drain electrode DE of FIG. 6, note that the metal film serving as the drain electrode DE is formed at any timing from the step of preparing the semiconductor wafer to the step of dividing the semiconductor wafer. For example, when the thickness of the semiconductor chip 10 is reduced by polishing the back surface of the semiconductor wafer after the formation of the openings 13H1, 13H2, and 13H3 and before the wafer test, the metal film serving as the drain electrode DE is formed on the back surface 10b (see FIG. 6). When the metal film is not used as the drain electrode DE, this step can be omitted.

<Lead Frame Preparation Step>

Figure 14:
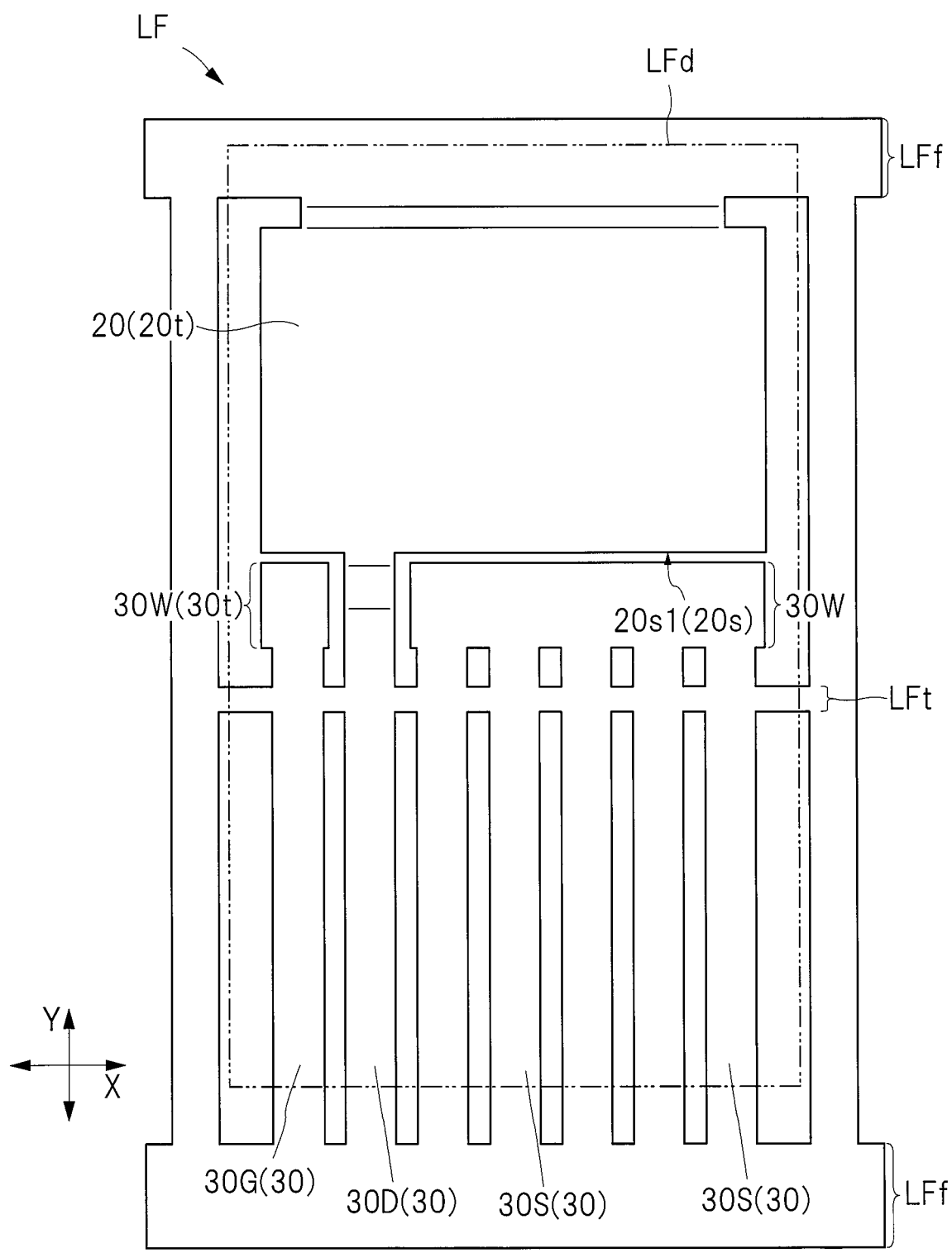
FIG. 14 is an enlarged plan view showing apart of a lead frame prepared at a lead frame preparation step shown in FIG. 12.

At a lead frame preparation step shown in FIG. 12, a lead frame LF shown in FIG. 14 is prepared. FIG. 14 is an enlarged plan view showing a part of the lead frame prepared at the lead frame preparation step of FIG. 12.

As shown in FIG. 14, the lead frame LF prepared at this step has a device formation portion LFd connected to a frame portion LFf. One device formation portion LFd corresponds to one semiconductor device PKG1 shown in FIG. 5. FIG. 14 shows one device formation portion LFd. However, the lead frame LF has a plurality of device formation portions LFd coupled together through the frame portion LFf. In this manner, by using the lead frame LF having the plurality of device formation portions LFd, a plurality of semiconductor devices PKG1 (see FIG. 3) can be collectively manufactured, and therefore, the manufacturing efficiency can be improved.

The lead frame LF is made of a metal material containing, for example, copper (Cu) as a main component, and has a thickness of, for example, about 125 μm to 400 μm. Each of the device formation portions LFd is connected to the frame portion LFf. The frame portion LFf is a support portion that supports each member formed in the device formation portion LFd until start of a lead separation step shown in FIG. 12.

As shown in FIG. 14, the die pad 20 and the plurality of the leads 30 are formed in the device formation portion LFd. The die pad 20 is coupled to the frame portion LFf via one (lead 30D) of the plurality of leads 30, and is supported by the frame portion LFf. The die pad 20 has the upper surface 20t that is the chip mounting surface.

Each of the plurality of leads 30 is coupled to the frame portion LFf, and is supported by the frame portion LFf. The plurality of leads 30 extend in the Y direction, and are arranged side by side so as to be adjacent to each other in the X direction. The plurality of leads 30 are coupled to each other via a tie bar LFt.

The plurality of leads 30 include the plurality of leads 30S that are the source leads. The plurality of leads 30S are arranged side by side in the X direction so as to be adjacent to each other, and are coupled to the wire bonding portion (lead post, pad, bonding pad, wire connecting portion, bonding portion) 30W. The plurality of leads 30 include also the lead 30G that is the gate lead. The wire bonding portion 30W is provided to a tip of the lead 30G, the tip being closer to the die pad 20. The plurality of leads 30 include also the lead 30D that is the drain lead. The lead 30D is located between the lead 30G and the leads 30S in the X direction, and has a tip closer to the die pad 20 in the Y direction, the tip being coupled to the die pad 20.

According to the present embodiment, the upper surface 20t of the die pad 20 is located at a height different from a height of the upper surface 30t of the wire bonding portion 30W of the lead 30. The lead 30D supporting the die pad 20 and a portion connecting the die pad 20 to the frame portion LFf are bent to offset the die pad 20. According to the present embodiment, the die pad 20 is offset downward from other members of the lead frame LF. As a result, as shown in FIG. 6, the upper surface 20t of the die pad 20 is arranged to be lower than the upper surface 30t of the lead 30. By the downward-offset of the die pad 20 as described above, the lower surface 20b of the die pad 20 is exposed from the sealer 40, as shown in FIG. 6.

<Semiconductor Chip Mounting Step>

Figure 15:
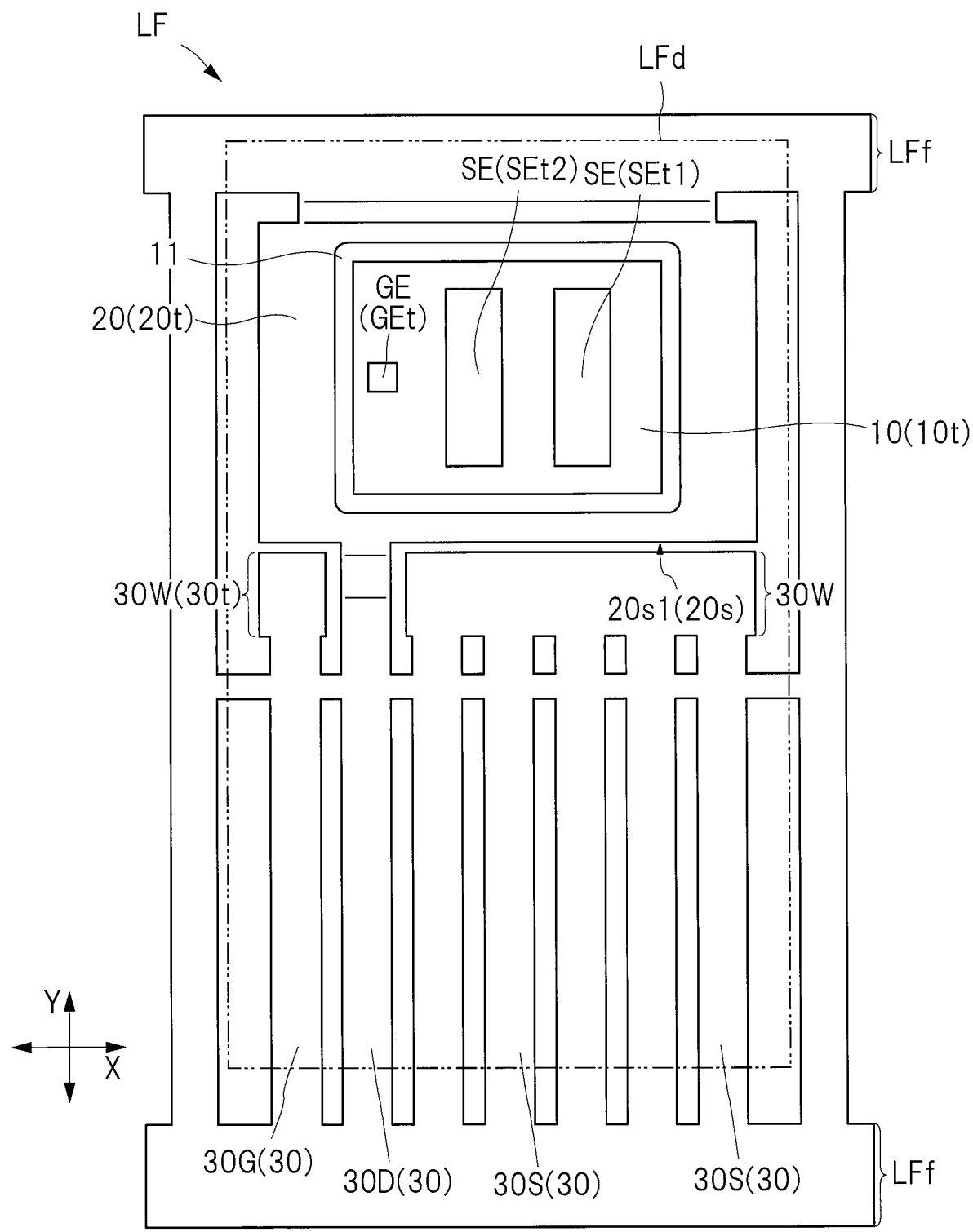
FIG. 15 is an enlarged plan view showing a state in which the semiconductor chip is mounted on a die pad shown in FIG. 14.

Next, at a semiconductor chip mounting step shown in FIG. 12, the semiconductor chip 10 is mounted on the die pad 20 of the lead frame LF as shown in FIG. 15. FIG. 15 is an enlarged plan view showing a state in which the semiconductor chip is mounted on the die pad shown in FIG. 14.

At the present step, the semiconductor chip 10 is mounted via the die bond material 11 on (adhesively fixed to) the upper surface 20t of the die pad 20 formed integrally with the lead 30D serving as the drain terminal. The semiconductor chip 10 is adhesively fixed to the upper surface 20t via the die bond material 11 so that the back surface 10b (see FIG. 6) on which the drain electrode DE (see FIG. 6) is mounted is opposite to the upper surface 20t serving as the chip mounting surface of the die pad 20. As a result, the drain electrode DE of the semiconductor chip 10 is connected electrically to the die pad 20 via the die bond material 11, which is a conductive bonding material.

At the present step, after the die bond material 11 is applied to the upper surface 20t of the die pad 20, the semiconductor chip 10 is mounted on the die bond material 11. The die bond material is cured, so that the semiconductor chip 10 and die pad 20 are fixed to each other.

As the die bond material 11, for example, a solder material may be used. Alternatively, as the die bond material 11, a conductive resin adhesive that is a so-called silver (Ag) paste containing a plurality of silver (Ag) particles (Ag filler) may be used. When the die bond material 11 is the solder material, a reflow process is performed as a method of curing the die bond material. When the die bond material 11 is the conductive resin adhesive, a thermosetting resin component contained in the die bond material 11 is heated to be cured.

<Wire Bonding Step>

Figure 16:
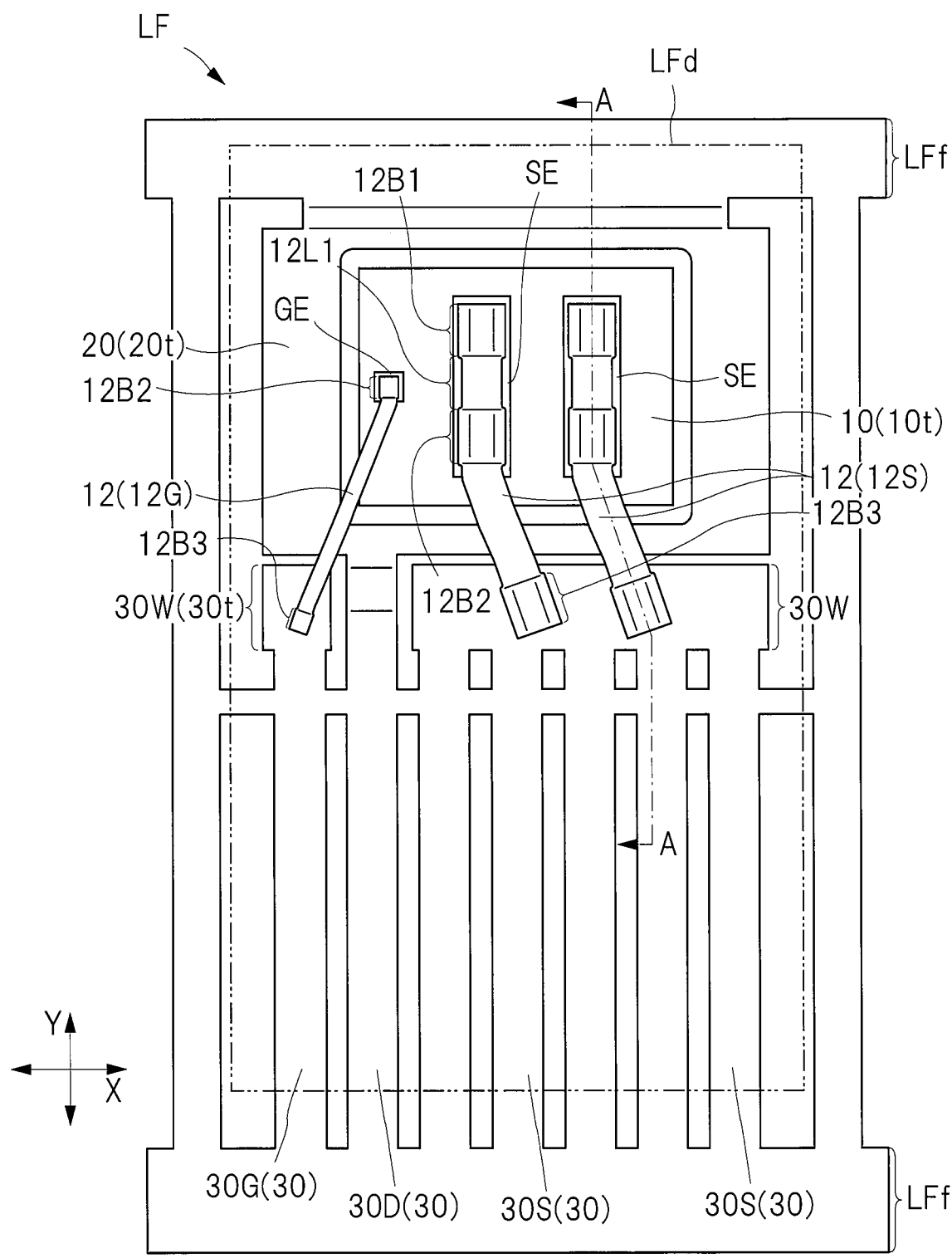
FIG. 16 is an enlarged plan view showing a state in which the semiconductor chip shown in FIG. 15 is electrically connected to leads via wires.
Figure 17:
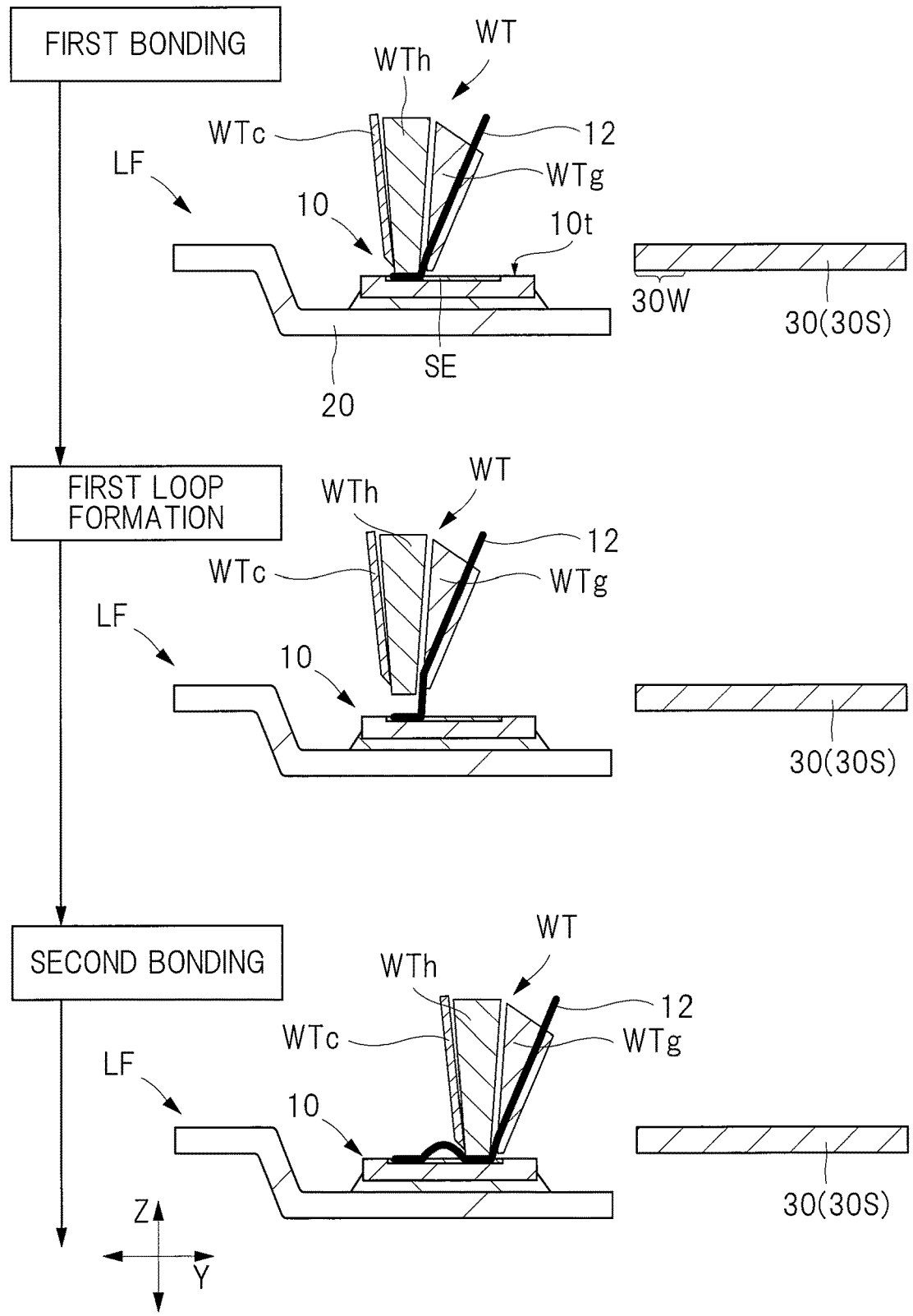
FIG. 17 is an explanatory diagram showing an example of a wire-bonding step using a wedge tool.
Figure 18:
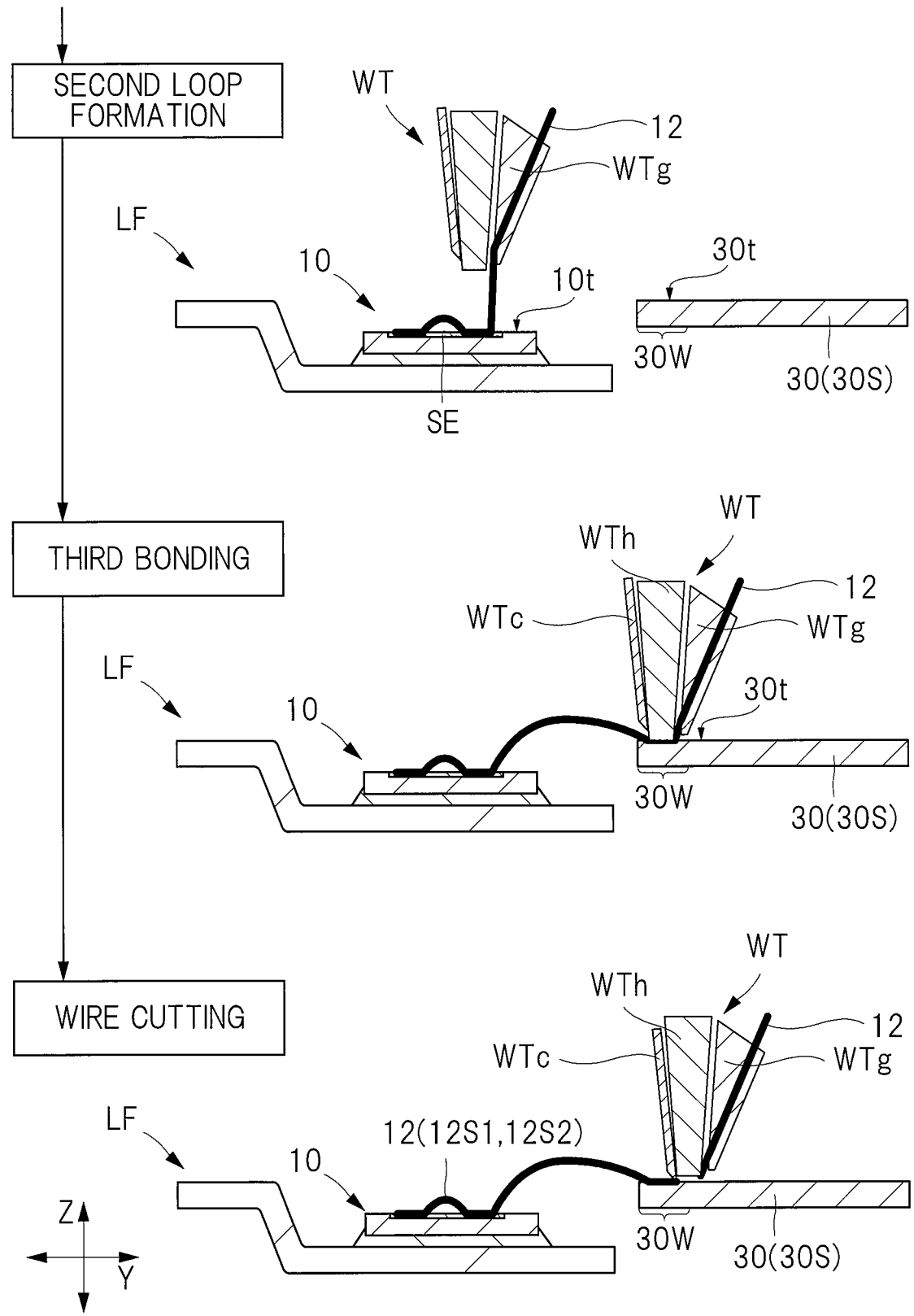
FIG. 18 is an explanatory diagram showing an example of the wire-bonding step using the wedge tool.
Figure 19:
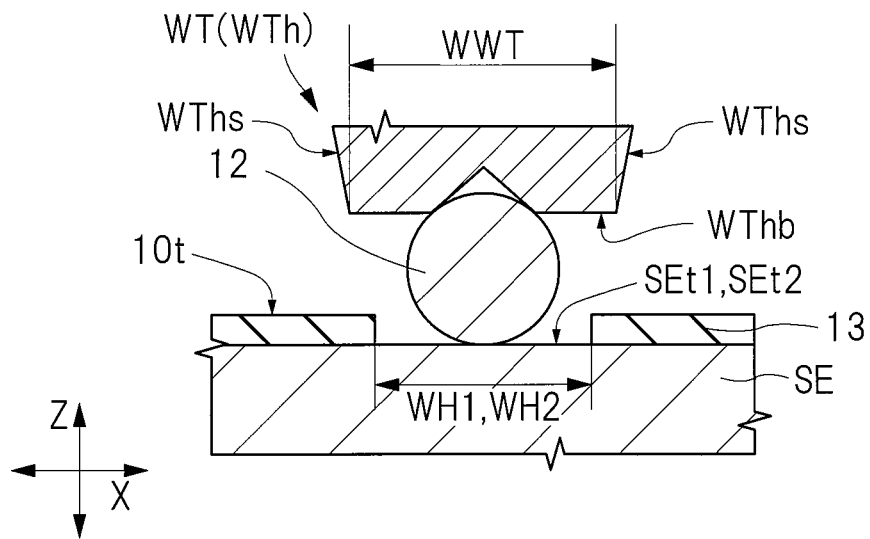
FIG. 19 is an enlarged cross-sectional view showing a state in which a wire is compressed and bonded to an electrode pad of the semiconductor chip at a first bonding step or second bonding step shown in FIG. 17.
Figure 20:
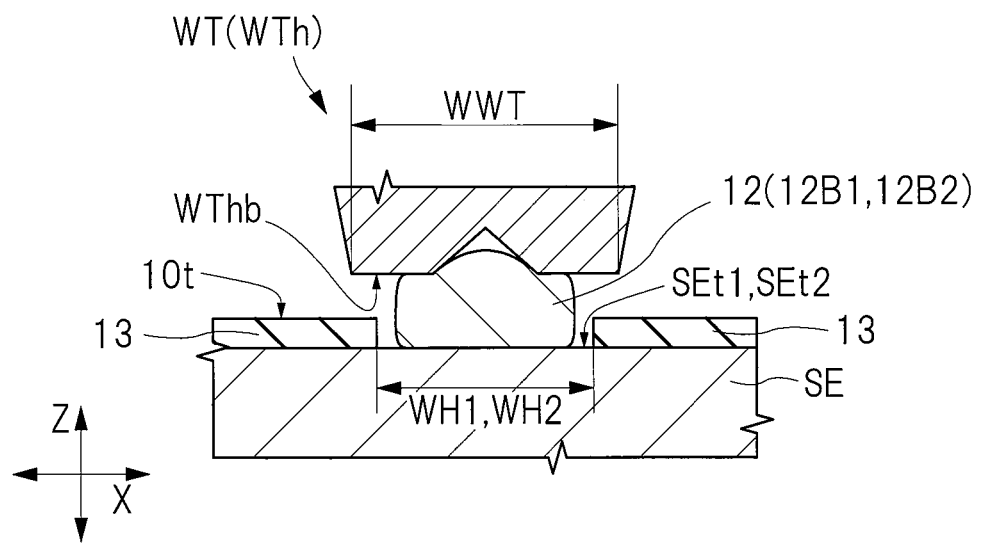
FIG. 20 is an enlarged cross-sectional view showing a state in which the wire is compressed and bonded to the electrode pad of the semiconductor chip at the first bonding step or second bonding step shown in FIG. 17.

Next, at a wire bonding step shown in FIG. 12, the plurality of electrode pads (gate electrode pad GE and source electrode pad SE) of the semiconductor chip 10 are connected electrically to the plurality of leads 30 via the wires (metal wires) 12, respectively, as shown in FIG. 16. FIG. 16 is an enlarged plan view showing a state in which the semiconductor chip of FIG. 15 is electrically connected to the leads via the wires. Each of FIGS. 17 and 18 is an explanatory diagram showing an example of the wire bonding step using a wedge tool. Each of FIGS. 19 and 20 is an enlarged cross-sectional view showing a state in which the wire 12 is compression-bonded to the electrode pad of the semiconductor chip at a first bonding step or second bonding step shown in FIG. 17. The enlarged cross-sectional views of FIGS. 17 and 18 correspond to a cross-sectional view taken along the line A-A of FIG. 16. FIGS. 19 and 20 correspond to an enlarged cross-sectional view taken along the X direction of FIG. 16.

As shown in FIG. 16, at the present step, the gate electrode pad GE of the semiconductor chip 10 is connected electrically to the lead 30G via the wire 12G. At the present step, the source electrode pad SE of the semiconductor chip 10 is connected electrically to the leads 30S via the wires 12S. Specifically, the connecting portion 12B2 of the wire 12G is bonded to the bonding surface GEt (see FIG. 7), which is a part of the gate electrode pad GE, and the connecting portion 12B3 of the wire 12G is bonded to the upper surface (bonding surface) 30t of the wire connecting portion 30W of the lead 30G. The connecting portion 12B1 and connecting portion 12B2 of the wire 12S1 (see FIG. 7) are bonded to the bonding surface SEt1 (see FIG. 7), which is a part of the source electrode pad SE, and the connecting portion 12B3 of the wire 12S1 is bonded to the upper surface (bonding surface) 30t of the wire connecting portion 30W of the lead 30S. The connecting portion 12B1 and connecting portion 12B2 of the wire 12S2 (see FIG. 7) are bonded to the bonding surface SEt2 (see FIG. 7), which is the other part of the source electrode pad SE, and the connecting portion 12B3 of the wire 12S2 is bonded to the upper surface (bonding surface) 30t of the wire connecting portion 30W of the lead 30S.

Various modification examples are applicable to a method of connecting the wire 12. Meanwhile, according to the present embodiment, a wire 12 made of aluminum is bonded while using a bonding tool shown in FIGS. 17 to 20, which is called wedge tool WT. In FIGS. 17 to 20, explanation will be made while exemplifying a method of electrically connecting the source electrode pad SE to the lead 30S via the wire 12S1 or 12S2 shown in FIG. 16 as an example of a wedge bonding method.

The wire bonding step has the first bonding step shown in FIG. 17. At the first bonding step, by using the wedge tool WT, the connecting portion 12B1 (see FIG. 9) of the wire 12 is bonded to the bonding surface SEt1 (see FIG. 9) of the source electrode pad SE, the surface being exposed from the opening 13H1 (see FIG. 9). When the wire 12S2 of FIG. 7 is formed, the connecting portion 12B1 (see FIG. 16) of the wire 12 is bonded to the bonding surface SEt2 (see FIG. 7) of the source electrode pad SE, the surface being exposed from the opening 13H2 (see FIG. 7), at the first bonding step by using the wedge tool (bonding tool) WT. The wedge tool WT has a body (header) WTh, a wire guide WTg, and a wire cutter (cutter blade) WTc.

In the wedge bonding method, as shown in FIG. 19, the wire 12 is thermally compression-bond to the bonding surface SEt1 or SEt2 by interposing the wire 12 between the tip surface (tip portion, heel, pressure surface) WThb of the body WTh of the wedge tool WT and the bonding surface SEt1 or SEt2 and by applying a pressure and heat from the body WTh. At this time, by applying ultrasonic waves from the body WTh, the wire 12 is easily bonded. The wire 12 pressed by the body WTh is deformed as shown in FIG. 20 and forms the connecting portion 12B1 (connecting portion 12B2 in the case of the second bonding step of FIG. 17). The connecting portion 12B1 formed by deforming the wire 12 with a circular cross section as described above is referred to as stitch portion.

Incidentally, a cross-sectional shape of the connecting portion 12B1 is determined by the distance between the tip surface WThb of the body WTh and the source electrode pad SE. For example, when the width WH1 of the bonding surface SEt1 (or width WH2 of the bonding surface SEt2) is larger than the width WWT of the tip surface WThb in the X direction in FIGS. 19 and 20, the tip surface WThb can be lowered down to a position as low as a position of a height of the upper surface (front surface 10*t*) of the insulating film 13.

However, according to the present embodiment, as described above with reference to FIG. 7, the separation of the sealer 40 (see FIG. 6) is suppressed by reducing the widths WR2 and WR4. As a result, the width WH1 of the bonding surface SEt1 (or width WH2 of the bonding surface SEt2) is smaller than the width WWT of the tip surface WThb. Therefore, at the first bonding step as shown in FIGS. 19 and 20, a part of the tip surface WThb of the wedge tool WT is located at such a position as covering a part of the insulating film 13. In other words, in a plan view, the part of the tip surface WThb of the wedge tool WT overlaps the part of the insulating film 13. Conversely, in the case of the method of manufacturing the semiconductor device of the present embodiment, the more the part of the tip surface WThb of the wedge tool WT covers the part of the insulating film 13 at the first bonding step, the smaller the width WH1 of the bonding surface SEt1 (or width WH2 of the bonding surface SEt2) is. In this manner, the separation of the sealer 40 (see FIG. 6) can be suppressed.

Note that the tip surface (tip portion) WThb of the wedge tool WT is a surface that is at least partially in contact with the wire 12 and faces the front surface 10*t* of the insulating film 13 at the wire bonding step, and does not include a surface WThs (see FIG. 19) continuously formed to a flat surface on the farthest tip portion. A boundary between the side surface WThs and the tip surface WThb is tapered or rounded in some cases. In this case, the "width WWT of the tip surface WThb in the X direction" is defined as the distance in the X direction between a side where an extension surface of one side surface WThs intersects an extension surface of the tip surface WThb and a side where an extension surface of the other side surface WThs intersects an extension surface of the tip surface WThb.

In the present embodiment, the width WWT of the tip surface WThb in the X direction is about 600 µm to 800 µm. Therefore, in the X direction, the width P1 of the region 13R1 of FIG. 7 is smaller than the width WWT of the tip surface WThb of FIGS. 19 and 20.

Next, the wire bonding step has a first loop formation step shown in FIG. 17. At the first loop formation step, the wedge tool WT is moved away from the bonding surfaces SEt1 and SEt2 (see FIG. 20), and then, is moved in the Y direction to form the loop portion 12L1 of FIG. 7. In other words, at the present step, the wedge tool WT moves to be upper than the lead frame LF while feeding the wire 12, so that the wedge tool WT and the semiconductor chip 10 are away from each other. Then, the wedge tool WT is moved in the Y direction toward a region to which the second bonding is performed, and then, the wedge tool WT is moved down again. In this manner, the loop portion 12L1 of FIG. 9 is formed. At this time, according to the present embodiment, no insulating film 13 is interposed between the loop portion 12L1 of the wire 12 and the source electrode pad SE, as described above with reference to FIG. 9. For this reason, a height position to which the wedge tool WT is moved up may be low. In this manner, a loop length LE1 shown in FIG. 9 can be made short.

Next, the wire bonding step has the second bonding step shown in FIG. 17. At the second bonding step, by using the wedge tool WT, the connecting portion 12B2 (see FIG. 9) of the wire 12 is bonded to the bonding surface SEt1 (see FIG. 9) of the source electrode pad SE, the surface being exposed from the opening 13H1 (see FIG. 9). When the wire 12S2 of FIG. 7 is formed, the connecting portion 12B2 (see FIG. 16) of the wire 12 is bonded to the bonding surface SEt2 (see FIG. 7) of the source electrode pad SE, the surface being exposed from the opening 13H2 (see FIG. 7), at the second bonding step by using the wedge tool (bonding tool) WT. At the second bonding step, the wire 12 is thermally compression-bonded to the bonding surface SEt1 and to the bonding surface SEt2 as similar to the first bonding step. At this time, ultrasonic waves may be applied. Each of the width WR2 of the region of the bonding surface SEt1 of FIG. 7, the region being sandwiched between the connecting portion 12B2 of the wire 12 and the side HS2 of the bonding surface SEt1 (or bonding surface SEt2), and the width WR4 of the region of the same, the region being sandwiched between the connecting portion 12B2 of the wire 12 and the side HS1 of the bonding surface SEt1 (or bonding surface SEt2), is small, and is, for example, about 50 µm. Therefore, at the second bonding step, a part of the tip surface WThb of the wedge tool WT is located at such a position as covering a part of the insulating film 13 as similar to the first bonding step described above with reference to FIG. 19.

Next, the wire bonding step has a second loop formation step shown in FIG. 18. At the second loop formation step, the wedge tool WT is moved away from the bonding surfaces SEt1 and SEt2 (see FIG. 20), and then, is moved toward the wire bonding portion 30W of the lead 30S to form the loop portion 12L2 (see FIG. 7). In other words, at the present step, the wedge tool WT moves to be upper than the lead frame LF while feeding the wire 12, so that the wedge tool WT and the semiconductor chip 10 are away from each other. Then, the wedge tool WT is moved toward a region to which the third bonding is performed (that is, toward the wire bonding portion 30W of the lead 30), and then, the wedge tool WT is moved down again. In this manner, the loop portion 12L2 of FIG. 7 is formed. Since the loop portion 12L2 extends from the semiconductor chip 10 to the lead 30, a difference in the height between the bonding surfaces is determined by a shape of the loop portion 12L2. At the second loop formation step, the wedge tool WT moves up to a position higher than the upper surface 30*t* of the lead 30S, and then, moves toward the wire bonding portion 30W, and moves down again. Therefore, a height position to which the wedge tool WT moves up at the present step is higher than a height position to which the wedge tool WT moves up at the first loop formation step. Conversely, a height position to which the wedge tool WT moves up at the first loop formation step is lower than a height position to which the wedge tool WT moves up at the second loop formation step.

The loop portion 12L2 extends from the semiconductor chip 10 to the leads 30. As a result, after the second loop formation step, the loop portion 12L2 intersects any one of the plurality of sides of the opening 13H1 (or opening 13H2) in a plan view, as shown in FIG. 7. In the example shown in FIG. 7, the loop portion 12L2 of the wire 12S1 intersects the side HS4 of the opening 13H1, and the loop portion 12L2 of the wire 12S2 intersects the side HS4 of the opening 13H2.

Next, the wire bonding step has the third bonding step shown in FIG. 18. At the third bonding step, by using the wedge tool WT, the connecting portion 12B3 (see FIG. 16) of the wire 12 is bonded to the upper surface 30*t* that is the bonding surface of the wire bonding portion 30W of the lead 30S. When the wire 12S2 shown in FIG. 7 is formed, at the third bonding step, by using the wedge tool (bonding tool) WT, the connecting portion 12B3 (see FIG. 16) of the wire 12 is bonded to the upper surface 30*t* that is the bonding surface of the wire bonding portion 30W of the lead 30S. At the third bonding step, the wire 12 is thermally compression-bonded to the upper surface 30t that is the bonding surface of the lead 30S as similar to the first bonding step and the second bonding step. At this time, ultrasonic waves may be applied.

Next, the wire bonding step has a wire cutting step shown in FIG. 18. At the wire cutting step, the wire cutter WTc is moved so that a tip of the wire cutter is located to be upper than a region of the wire 12, the region being to be cut, and then, the wire cutter WTc is moved down, so that the wire 12 is cut. Then, the wedge tool WT is moved up to a next region to which the first bonding is performed or to a next semiconductor device.

In FIGS. 17 to 20, note that the explanation has been made while exemplifying the steps of bonding the wire 12 to the source electrode pad SE. According to the present embodiment, the wire 12G of FIG. 16 is connected by using the wedge tool WT of FIG. 17. In the case of the wedge bonding method using the wire 12G, the first bonding step and the first loop formation step of FIG. 17 can be eliminated. However, this bonding method is the same as the wedge bonding method described above with reference to FIGS. 17 and 18, and therefore, the repetitive description is omitted. However, when the wire diameter of the wire 12G is smaller than the wire diameter of the wire 12S as described in the present embodiment, it is preferable to use a wedge tool WT smaller than the wedge tool WT of FIG. 17. Since it is enough for the wire 12G to be bonded to the gate electrode pad GE at one part, a ball bonding method may be used instead of the wedge bonding method. In the case of the ball bonding method, at the first bonding step, a tip portion of the wire is thermally melted to form a ball, and the ball portion is thermally compression-bonded to a portion to be bonded, so that the bonding is performed.

<Sealing Step>

Figure 21:
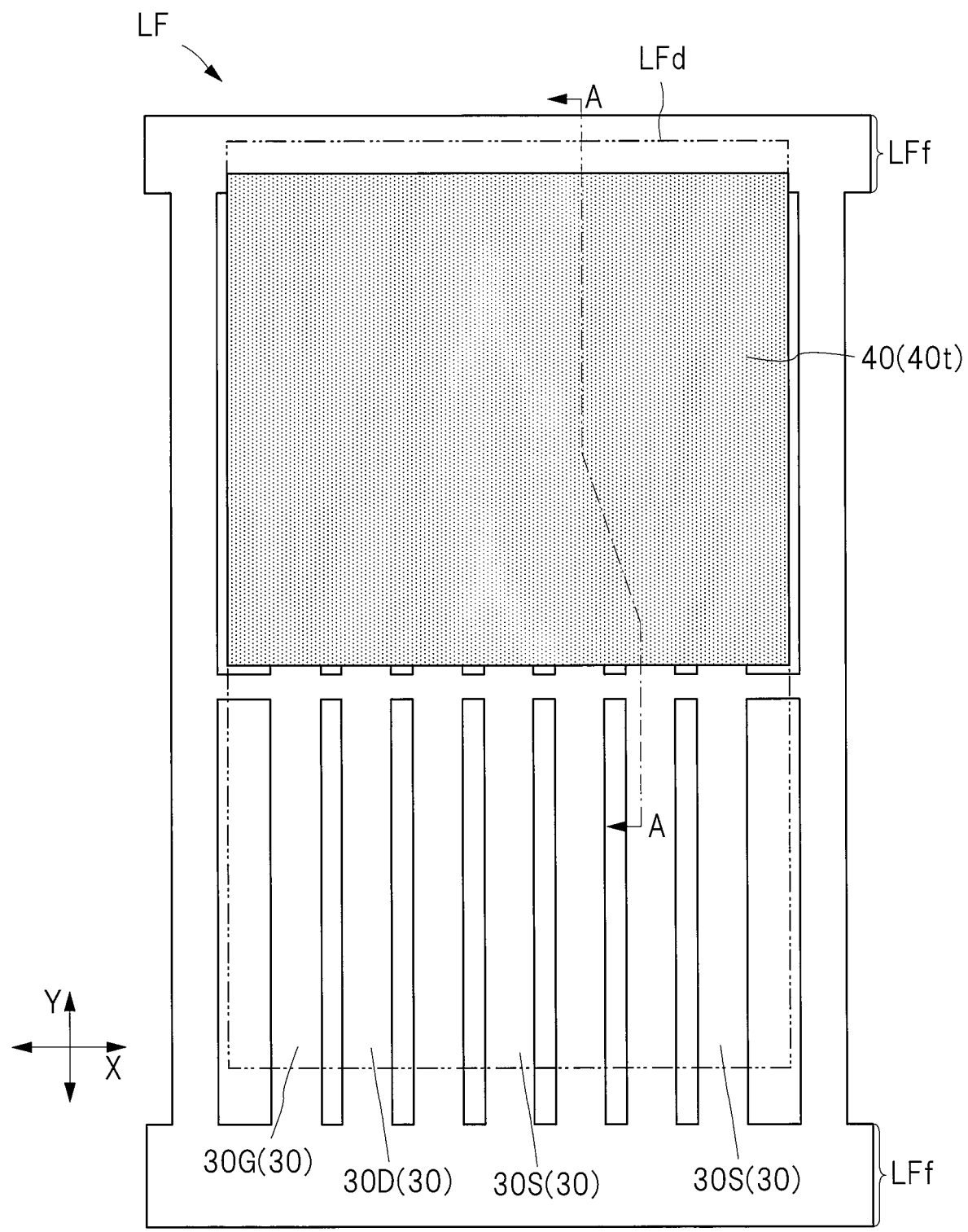
FIG. 21 is an enlarged plan view showing a state in which a sealer that seals the semiconductor chip and wires shown in FIG. 16 is formed.
Figure 22:
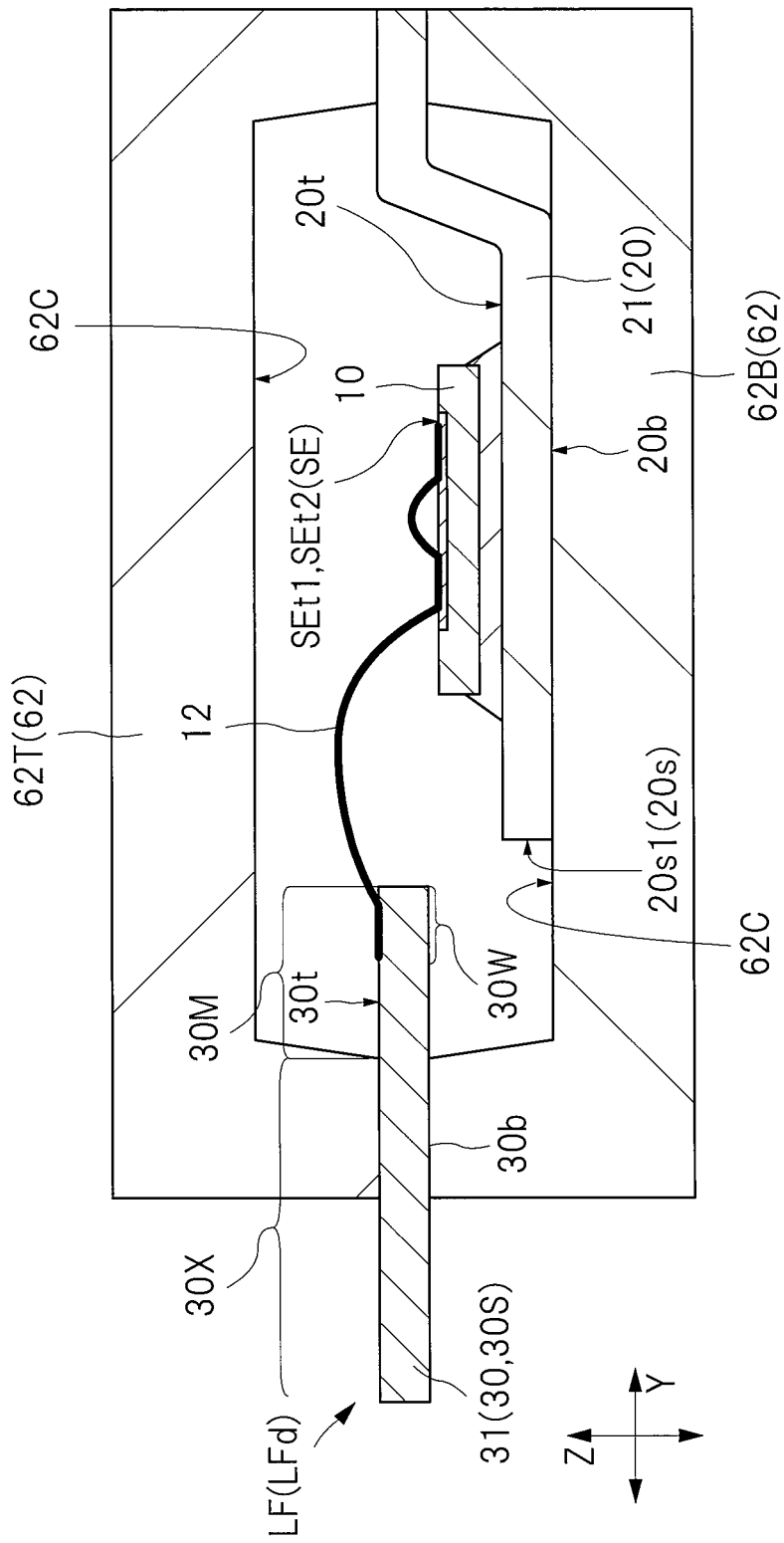
FIG. 22 is an enlarged cross-sectional view showing a state in which the lead frame is placed in a molding die in a cross-sectional surface taken along a line A-A of FIG. 21.
Figure 23:
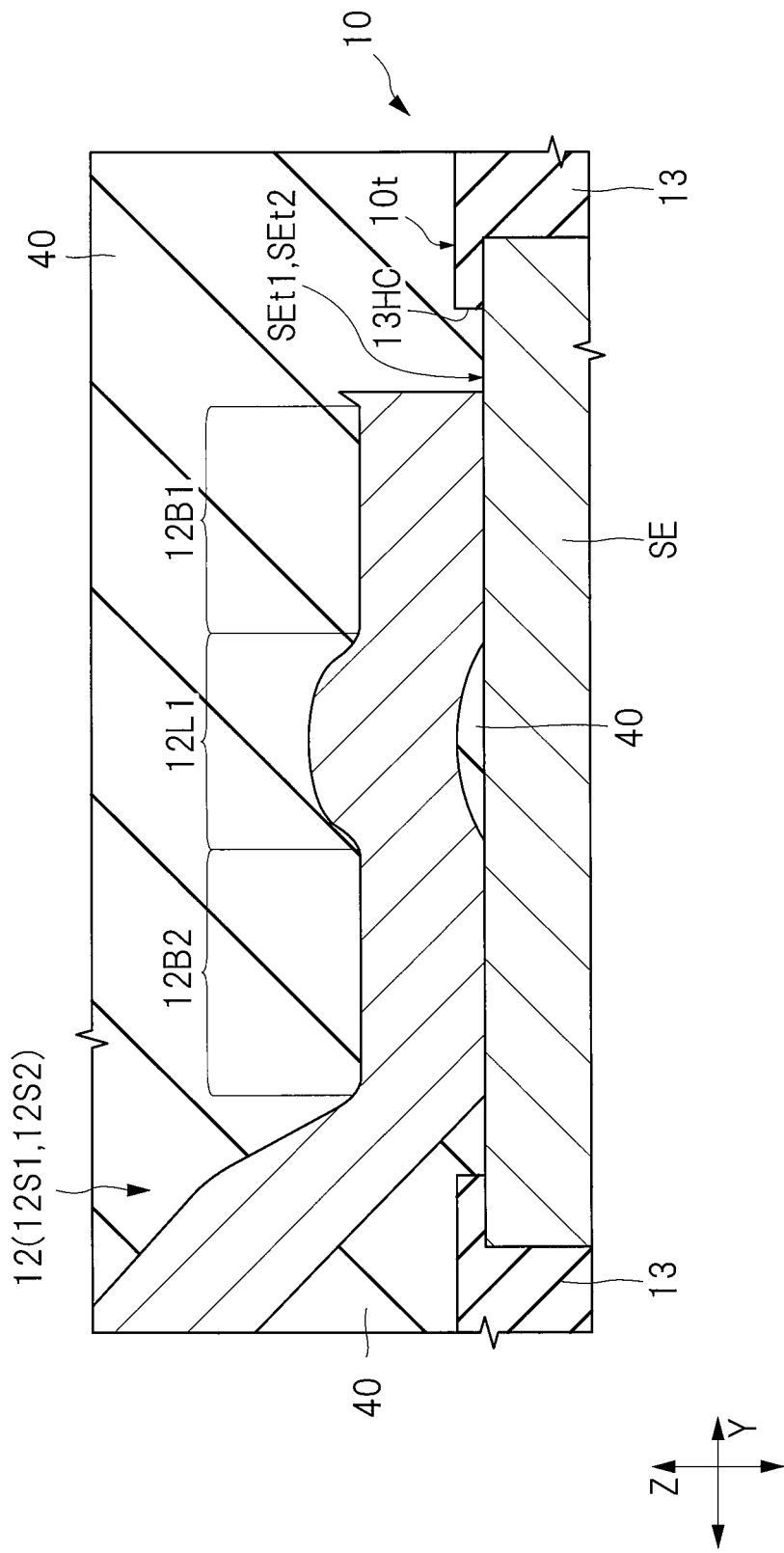
FIG. 23 is an enlarged cross-sectional view showing a periphery of the wire sealed with a resin at a sealing step.

Next, at a sealing step shown in FIG. 12, the semiconductor chip 10, apart of the die pad 20, a part (an inner portion 30M shown in FIG. 22) of each of the plurality of leads 30, and the plurality of wires 12, which are shown in FIG. 16, are sealed with an insulating resin to form the sealer 40 shown in FIG. 21. FIG. 21 is an enlarged plan view showing a state in which the sealer seals the semiconductor chip and wires of FIG. 16 is formed. FIG. 22 is an enlarged cross-sectional view showing a state in which the lead frame is placed in a molding die in the cross-sectional surface taken along the line A-A of FIG. 21. FIG. 23 is an enlarged cross-sectional view showing periphery of the wire sealed with the resin at the sealing step.

At the present step, the sealer 40 is formed by, for example, a so-called transfer mold method using a molding die 62 having a top mold (first mold) 62T and a bottom mold (second mold) 62B as shown in FIG. 22.

In the example shown in FIG. 22, the lead frame LF is arranged so that a part of each of the die pad 20 and the plurality of leads 30 in the device formation portion LFd is located inside a cavity 62C formed by the top mold 62T and the bottom mold 62B. The lead frame LF is clamped (sandwiched) by the top mold 62T and the bottom mold 62B. In this state, a soft (plasticizing) thermosetting resin (insulating resin) is compressively injected into the cavity 62C of the molding die 62, so that the insulating resin is supplied into a space formed by the cavity 62C and the bottom mold 62B, and is molded along the shape of the cavity 62C.

At this time, as shown in FIG. 22, a part of the upper surface 20t of the die pad 20, the part being continuous with the offset part and being located at a relatively high position to be closer to the tip portion, is pressed by the top mold 62T. The lower surface 20b of the die pad 20 is pressed by the bottom mold 62B. In the example shown in FIG. 22, the lower surface 20b of the offset part of the die pad 20 is in close contact with the bottom mold 62B. As a result, as shown in FIG. 21, a part of the lower surface 20b of the die pad 20 is exposed from the sealer 40 after the present step.

As shown in FIG. 23, the sealer 40 is formed at the present step so that the resin making up the sealer 40 is in contact with the bonding surface SEt1 and with the bonding surface SEt2. At the present step, the resin infiltrates a gap between the loop portion 12L1 of the wire 12 and the bonding surface SEt1 or SEt2, so that the sealer 40 is interposed between the loop portion 12L1 of the wire 12 and the bonding surface SEt1 or SEt2.

As described above, when the contact area between the sealer 40 and the bonding surface SEt1 or SEt2 made of a meal material is large, the separation may occur at the bonding interface between the sealer 40 and the bonding surface SEt1 or SEt2 after the present step. However, as described above, the present embodiment can reduce the area of the part of the bonding interface between the sealer 40 and the bonding surface SEt1 or SEt2, the part where the separation tends to occur, and therefore, the separation can be suppressed.

After the formation of the sealer 40, the sealer 40 is heated until part of the thermosetting resin contained in the sealer 40 cures (this step causes a so-called temporary curing state). When the lead frame LF can be removed from the molding die 62 by this temporary curing, the lead frame LF is removed from the molding die 62. The lead frame LF is transferred to a heating furnace, and is further subjected to a heat treatment (cure baking). In this manner, the rest of the thermosetting resin cures, so that the sealer 40 of FIG. 21 is obtained.

The sealer 40 is made of the insulating resin as a main component. The functions of the sealer 40 (e.g., resistance to warping distortion) can be improved by, for example, mixing filler particles such as silica (silicon dioxide: $SiO_2$) particles into the thermosetting resin.

<Plating Step>

Next, at a plating step shown in FIG. 12, the lead frame LF is immersed in a plating solution not shown, so that metal films (metal film 22 and metal film 32 shown in FIG. 6) are formed on respective surfaces of metal portions (outer portions) exposed from the sealer 40.

At the present step, by an electroplating method, the metal films 22 and 32 (FIG. 6) made of, for example, solder are formed on respective surfaces of metal members exposed from the resin. In the electroplating method, the lead frame LF (see FIG. 21) which is a workpiece to be plated is put into a plating bath filled with the plating solution. At this time, the workpiece is connected to a cathode in the plating bath. For example, the frame portion LFf (see FIG. 21) of the lead frame LF is connected electrically to the cathode. Then, by applying, for example, a direct-current voltage to a part between the cathode and an anode which is similarly put into the plating bath, the metal films 22 and 32 are formed on the exposed surfaces of the metal members connected to the frame portion LFf of the lead frame LF. In the present embodiment, the metal films 22 and 32 are formed by a so-called electroplating method.

Although illustration is omitted in FIG. 12, note that chemical polishing may be performed to the surfaces of the die pad 20 and leads 30 of FIG. 21 as a pretreatment at the plating step before the immersion of the lead frame LF into the plating solution. By the pretreatment before the immersion of the lead frame LF into the plating solution, for example, an oxide film, fine burrs, etc., can be removed from the surface of the lead frame LF exposed from the sealer 40 (see FIG. 21).

The metal films 22 and 32 of the present embodiment are made of so-called lead-free solder such as tin (Sn) only, tin-bismuth (Sn—Bi), or tin-copper-silver (Sn—Cu—Ag) that does not substantially contain the lead (Pb) as described above. For this reason, the plating solution used at the present plating step is the electroplating solution containing metal salt such as $Sn^{2+}$ and $Bi^{3+}$. Note that the following explanation will be made about Sn—Bi alloy metal as an example of the lead-free solder plating. However, the electroplating solution can be replaced with electroplating solution obtained by replacing bismuth (Bi) with copper (Cu) and/or silver (Ag), or obtained by adding not only bismuth (Bi) but also copper (Cu) and/or silver (Ag).

In the present embodiment, the plating step is performed while the die pad 20 shown in FIG. 21 (see FIG. 16) is connected electrically to the frame portion LFf via the leads 30. When a voltage is applied to a part between the anode and the cathode while the lead frame LF is immersed in the plating solution, current flows between the anode and the leads 30 and die pad 2 which are connected to the cathode, through the plating solution. At this time, $Sn^{2+}$ and $Bi^{3+}$ in the plating solution deposit on the exposed surfaces of the leads 30 and die pad 20 from the sealer 40 at a predetermined ratio, so that the metal films 22 and 32 shown in FIG. 6 are formed.

<Individualization Step>

Figure 24:
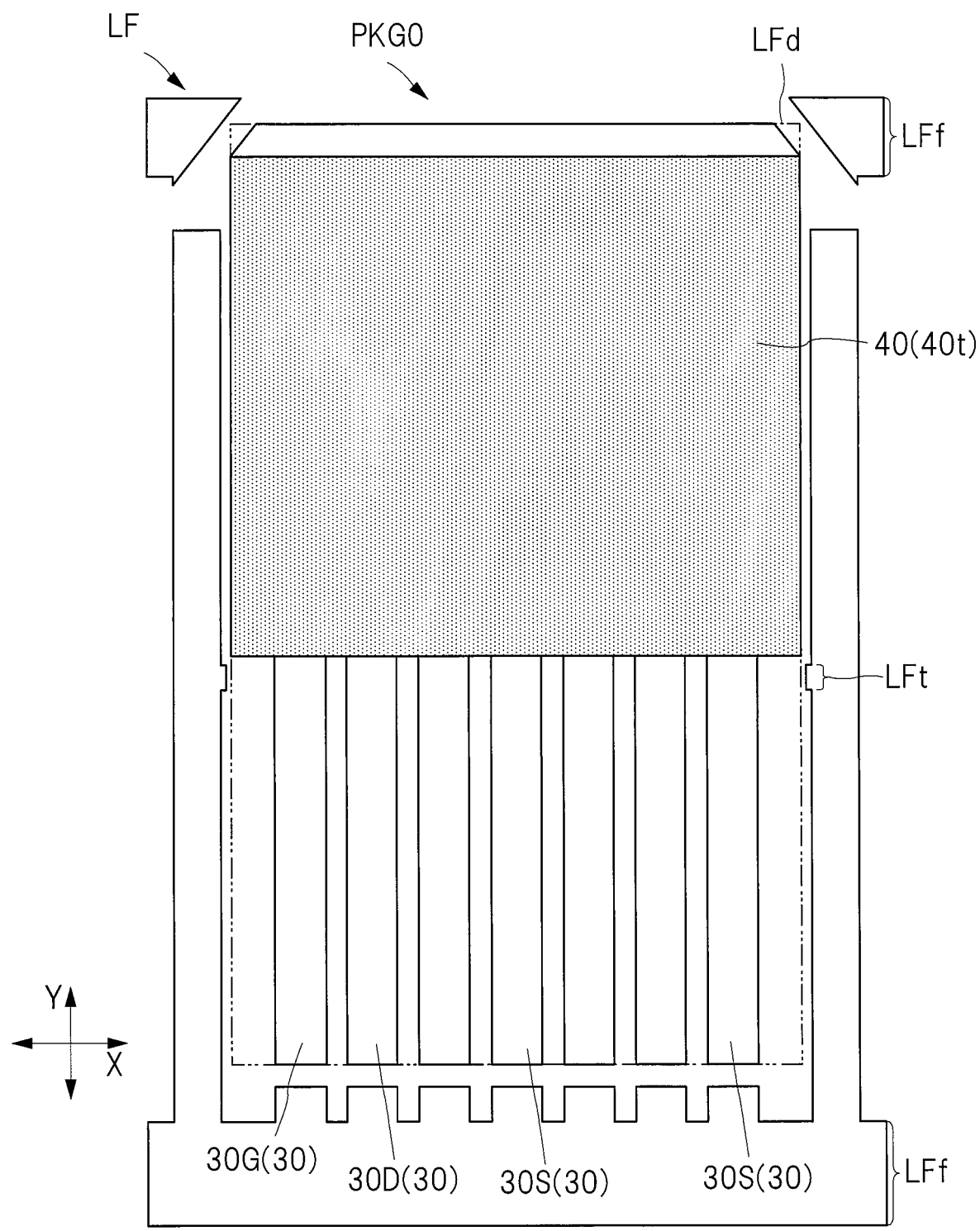
FIG. 24 is an enlarged plan view showing a state in which a plurality of device formation portions are separated from each other at an individualization step shown in FIG. 12.

Next, at an individualization step shown in FIG. 12, an assembly PKG0 equivalent to the semiconductor device PKG1 (see FIG. 3) is separated from the frame portion LFf of the lead frame LF and a tie bar LFt and is individualized as shown in FIG. 24. FIG. 24 is an enlarged plan view showing a state in which each of a plurality of device formation portions is separated at the individualization step of FIG. 12.

At the present step, the frame portion LFf coupled to the plurality of die pads 20 is cut so that the die pads 20 that are coupled to each other by the flame portion LFf are divided from each other. At the present step, the tie bar LFt is cut, and the boundaries between the plurality of leads 30 and the frame portion LFf are cut, so that the plurality of leads 30 are divided from each other.

As a method of cutting the tie bar LFt, the frame portion LFf, and the leads 30, a machining method (press working) for shearing by pressing a cutting jig to a part to be cut can be used. Since the present step is performed after the plating step, a side surface newly created by the shearing at the present step is exposed from the plating films (the metal films 22 and 33 of FIG. 6).

After the present step, necessary inspections and tests such as an appearance inspection and an electrical test are performed, and a part having passed the tests becomes the semiconductor device PKG1 shown in FIG. 3 as a complete product. The semiconductor device PKG1 is shipped, or is mounted on a mounting substrate not shown.

In the foregoing, the invention made by the present inventors has been concretely described based on the embodiments. However, it is needless to say that the present invention is not limited to the foregoing embodiments and various modifications and alterations can be made within the scope of the present invention. A typical modification example will be described below.

First Modification Example

As shown in FIG. 7, the above-described embodiment has described the aspect in which the width P1 of the region 13R1 is larger than the width WW1 of the connecting portion 12B1 of the wire 12S1 in the X direction. As described in the above-described embodiment, when the width P1 of the region 13R1 is small while the respective opening areas of the openings 13H1 and 13H2 are smaller than the respective wire diameters (diameters) of the wires 12S1 and 12S2, the distance between the wires 12S1 and 12S2 adjacent to each other is reduced. In the wire bonding, this case has a possibility of the contact of the bonding tool (e.g., wedge tool WT of FIG. 19) with a next wire.

Figure 25:
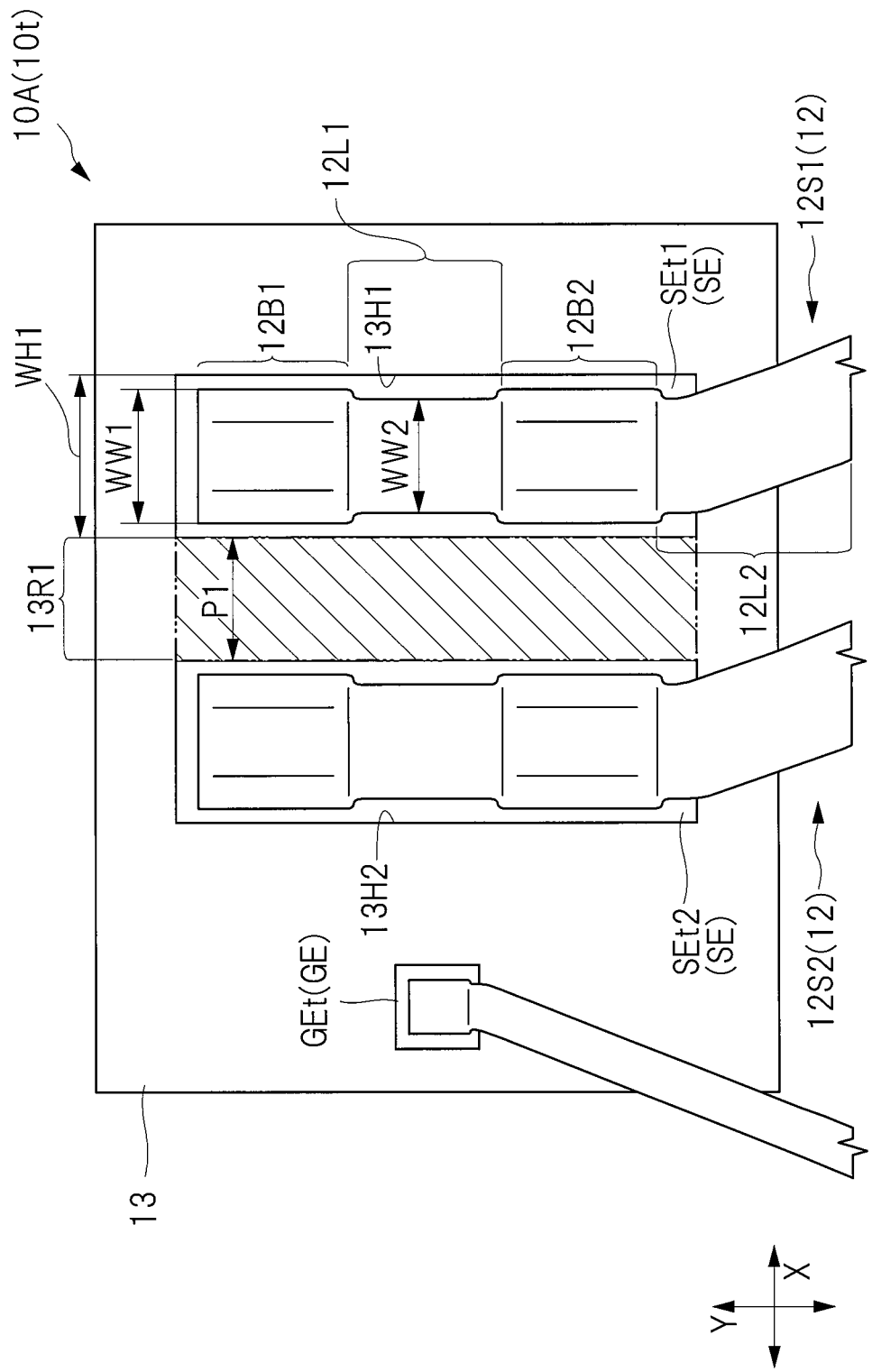
FIG. 25 is an enlarged plan view showing a modification example of FIG. 7.
Figure 26:
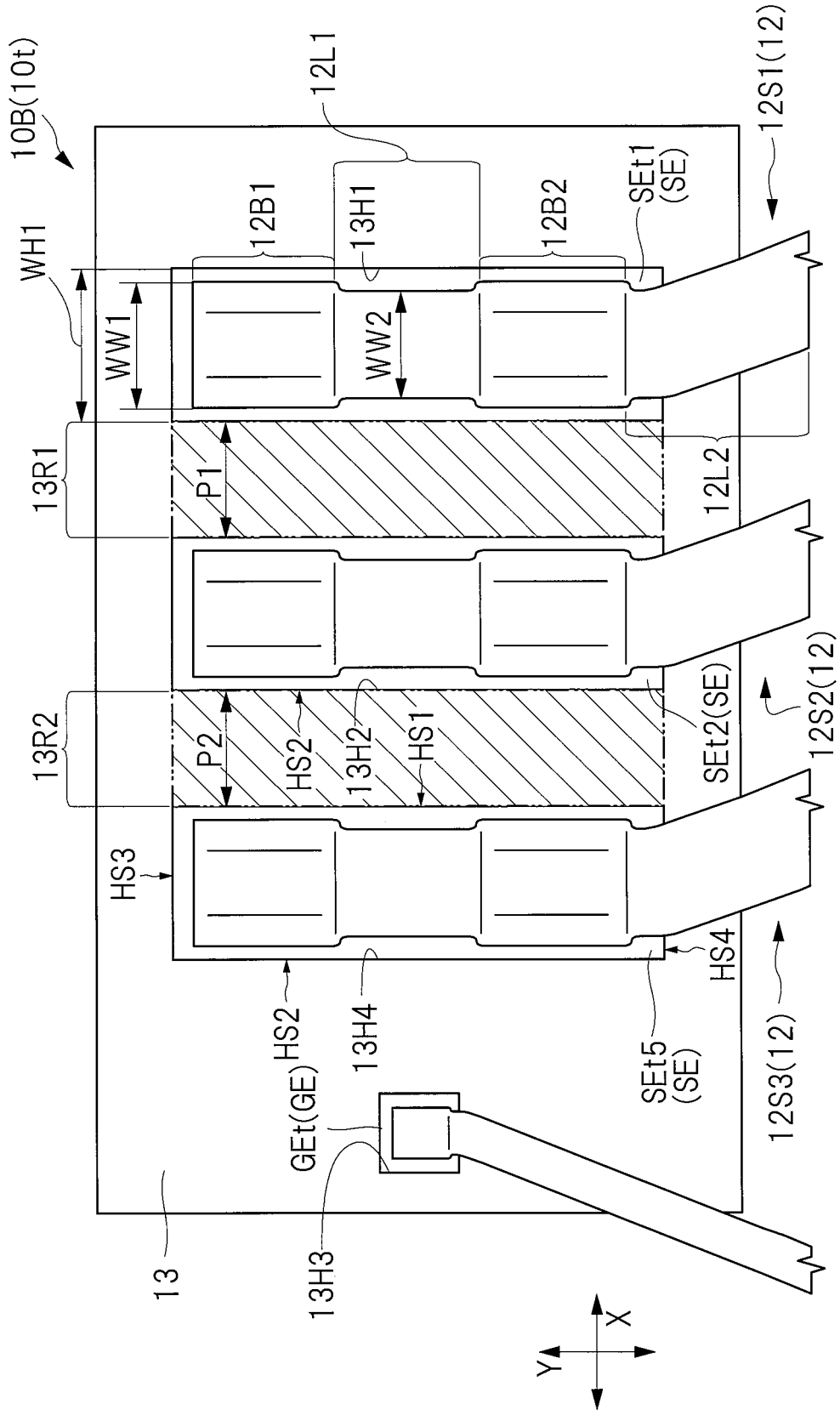
FIG. 26 is an enlarged plan view showing another modification example of FIG. 7.

However, in consideration of downsizing of the plane area of the semiconductor chip 10 and improvement in the arrangement density of the wires 12, it is preferable to reduce the width P1 of the region 13R1 as small as the contact at the wire bonding does not occur. FIG. 25 is an enlarged plan view showing a modification example of FIG. 7. FIG. 26 is an enlarged plan view showing another modification example of FIG. 7. A semiconductor chip 10A shown in FIG. 25 has the width P1 of the region 13R1 of 430 μm, and therefore, is different from the semiconductor chip 10 shown in FIG. 7 in that the width is smaller than the width WW1 of the connecting portion 12B1 of the wire 12S1. The length of the front surface 10t of the semiconductor chip 10A in the X direction is smaller than that of the semiconductor chip 10 shown in FIG. 7 because the width P1 of the region 13R1 is small. As described above, the length of the surface 10 in the X direction can be small as seen in the semiconductor chip 10A by the small width P1 of the region 13R1, and therefore, this manner is preferable for the reduction in the plane area of the semiconductor chip 10A. The width P1 of the region 13R1 is larger than the wire diameter of the wire 12S1, in other words, the width WW2 of the loop portion 12L1 of the wire 12S1 in the X direction. As a result, the (minimum) distance in the X direction between the wire 12S1 and the wire 12S2 adjacent to each other is larger than at least the wire diameter of the wire 12S1 (width WW2 of the loop portion 12L1). Therefore, in the wire bonding for, for example, the wire 12S1, contact of the bonding tool with the next wire 12S2 can be suppressed.

A semiconductor chip 10B shown in FIG. 26 is different from the semiconductor chip 10 shown in FIG. 7 in that the semiconductor chip 10B has three wires 12 connected to the source electrode pad SE. In an example shown in FIG. 26, A wire 12S3 is also connected to the source electrode pad SE in addition to the wires 12S1 and 12S2. Specifically, an opening 13H4 is formed between the opening 13H2 and the opening 13H3 in the insulating film 13, and a bonding surface SEt5 of the source electrode pad SE is exposed from the opening 13H4. The opening 13H4 (bonding surface SEt5) has the same shape as that of the opening 13H1 (bonding surface SEt1). For example, as similar to the opening 13H1 (bonding surface SEt1), the opening 13H4 (bonding surface SEt5) has the sides HS1, HS2, HS3, and HS4. The wire 12S3 is bonded to the bonding surface SEt5 at a plurality of parts (two parts in FIG. 26).

The wire 12S3 has the same structure as that of each of the wires 12S1 and 12S2. For example, as similar to the wire 12S1, the wire 12S3 has the connecting portions 12B1 and 12B2 and the loop portions 12L1 and 12L2. Although not shown in the drawing, the wire 12S3 has the connecting portion 12B3 that is bonded to the upper surface 30t of the wire bonding portion 30W of the lead 30S shown in FIG. 5 as similar to the wires 12S1 and 12S2.

The insulating film 13 has a region 13R2 located between the bonding surface SEt2 and the bonding surface SEt5 in a plan view. In the X direction in the example shown in FIG. 26, the width P2 of the region 13R2 located between the side HS2 of the bonding surface SEt2 and the side HS1 of the bonding surface SEt5 is the same as the width P1 of the region 13R1, and is, for example, 430 µm.

In the case of the semiconductor chip 10B, each of the three wires 12S1, 12S2, and 12S3 arrange side by side in the X direction is connected to the source electrode pad SE, and therefore, the length of the front surface 10t in the X direction is larger than that of the semiconductor chip 10 of FIG. 7. However, in the case of the semiconductor chip 10B, each of the width P1 of the region 13R1 and the width P2 of the region 13R2 is smaller than the width WW1 of the connecting portion 12B1 of the wire 12S1, and therefore, increase in the plane area of the semiconductor chip 10 caused by increase in the number of the connected wires 12 can be suppressed.

Each of the semiconductor chip 10A of FIG. 25 and the semiconductor chip 10B of FIG. 26 is the same as the semiconductor chip 10 of FIG. 7 except for the above-described differences. Therefore, repetitive description is omitted.

For example, as a modification example of FIG. 26, note that each of the width P1 of the region 13R1 and the width P2 of the region 13R2 is smaller than the wire diameter of the wire 12S1 (width WW2 of the loop portion 12L1) in some cases although not illustrated. In this case, the length of the front surface 10t in the X direction can be smaller than that of the semiconductor chip 10A of FIG. 25. If the width of the tip portion of the wedge tool WT (see FIG. 19) can be small, the contact of the bonding tool with the next wire 12 in the wire bonding for one wire 12 can be suppressed. However, in the case of the above-described modification example not shown, it is required to use a bonding tool having a special shape as a method of solving the problem caused at the wire bonding. Therefore, in consideration of versatility of a manufacturing apparatus, it is preferable to form the width P1 of the region 13R1 to be larger than at least the wire diameter of the wire 12S1 (width WW2 of the loop portion 12L1).

Although not illustrated, the width P1 of the region 13R1 may be made equal to or larger than the width WH1 of the bonding surface SEt1 as another modification example of FIG. 7. In this case, the area of the region 13R1 is equal to or larger than the area of the bonding surface SEt1. In the case of this modification example, the area of the front surface 10t is larger than that of the semiconductor chip 10. However, this modification example is effective since an electrode arrangement space has a margin when the region of the front surface 10t is large because of other reasons than a reason related to electrode layout.

The number of the wires 12 connected to the source electrode pad SE is not limited to two or three and may be, for example, four or more. By the increase in the number of the wires 12, the impedance of the conductive path can be decreased. However, from the viewpoint of suppressing the increase in the plane area of the semiconductor chip 10, it is preferable to reduce each width (the width P1 and width P2 shown in FIG. 26) of a part of the insulating film 13 in the X direction, the part being located between the openings adjacent to each other, as small as the above-described problem caused at the wire bonding can be solved.

Second Modification Example

Figure 27:
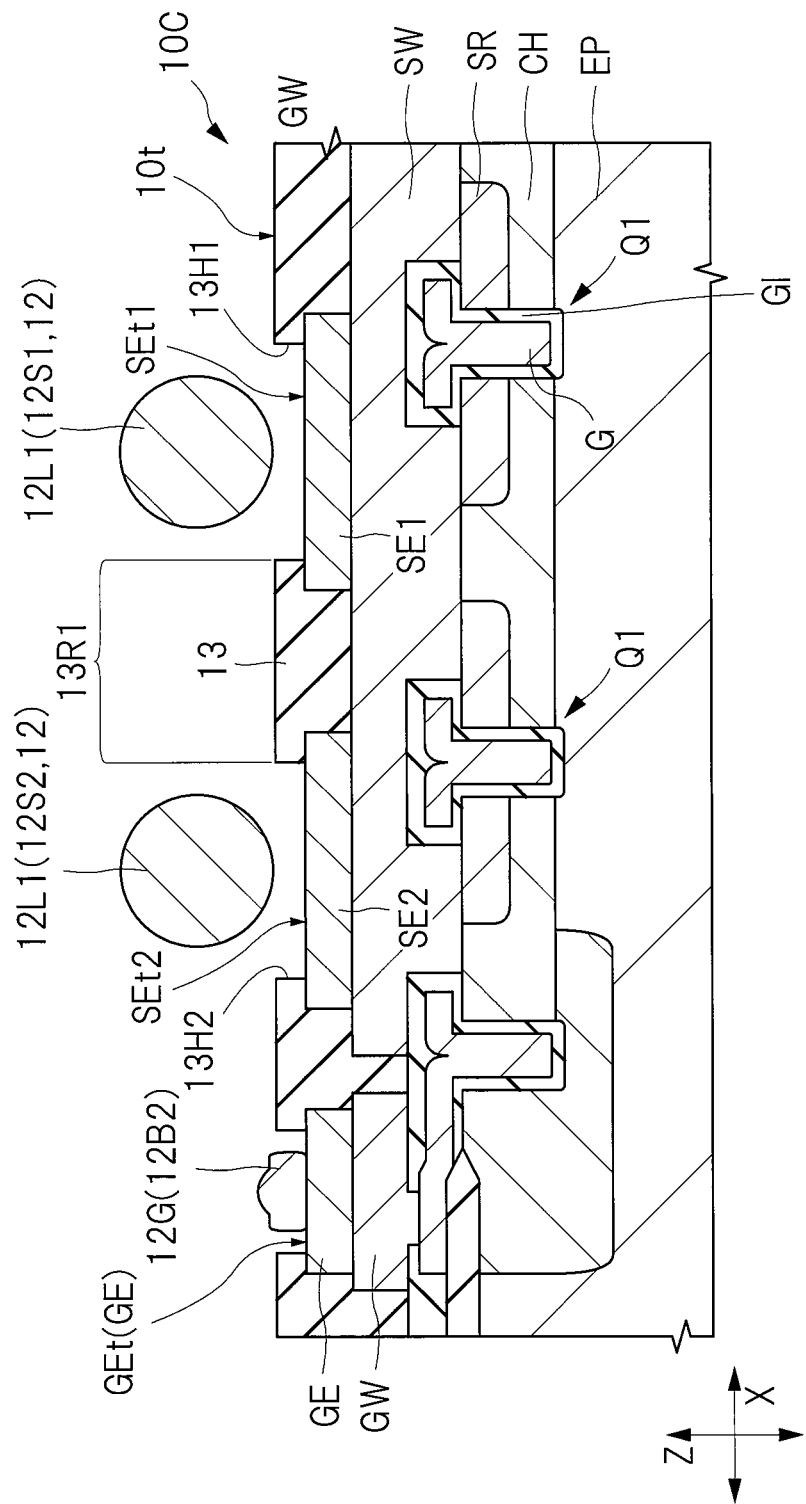
FIG. 27 is an enlarged cross-sectional view showing a modification example of FIG. 8.

The embodiment has described, for example, the aspect as shown in FIG. 8 in which the plurality of parts of one source electrode pad SE are exposed from the plurality of openings 13H1 formed in the insulating film 13. However, as seen in a modification example shown in FIG. 27, the bonding surface SEt1 may be a part of a source electrode pad (electrode, source electrode) SE1 covered with the insulating film 13, and the bonding surface SEt2 may be a part of a source electrode pad (electrode, source electrode) SE2 covered with the insulating film 13. FIG. 27 is an enlarged cross-sectional view showing a modification example of FIG. 8.

A semiconductor chip 10C shown in FIG. 27 is different from the semiconductor chip 10 shown in FIG. 8 in that the bonding surface SEt1 and the bonding surface SEt2 partially make up the source electrode pad SE1 and the source electrode pad SE2, respectively, that are different from each other. Specifically, in the case of the semiconductor chip 10C, a wiring (source wiring) SW is interposed between the source electrode pad SE1 and the source electrode pad SE2. The wiring SW is connected to the plurality of source regions SR of a plurality of transistors Q1. That is, each of the source electrode pad SE1 and the source electrode pad SE2 is electrically connected to the plurality of source regions SR of the plurality of transistors Q1 via the wiring SW. In other words, the source electrode pad SE1 and the source electrode pad SE2 are separated from each other but are electrically connected to each other via the wiring SW.

In the case of the semiconductor chip 10C of FIG. 27, the length of each of the source electrode pads SE1 and SE2 in the X direction is smaller than the length of the source electrode pad SE of FIG. 8. Therefore, in the X direction, a stress caused by the thermal expansion or contraction of the source electrode pads SE1 and SE2 can be reduced. As a result, the separation between each of the bonding surfaces SEt1 and SEt2 and the sealer 40 (see FIG. 6) can be suppressed.

Similarly, in the case of the semiconductor chip 10C, the gate electrode pad GE is electrically connected to the plurality of gate electrodes G of the plurality of transistors Q1 via a wiring (gate wiring) GW.

The semiconductor chip 10C of FIG. 27 is the same as the semiconductor chip 10 of FIG. 8 except for the above-described differences, and therefore, repetitive description is omitted.

Third Modification Example

Figure 28:
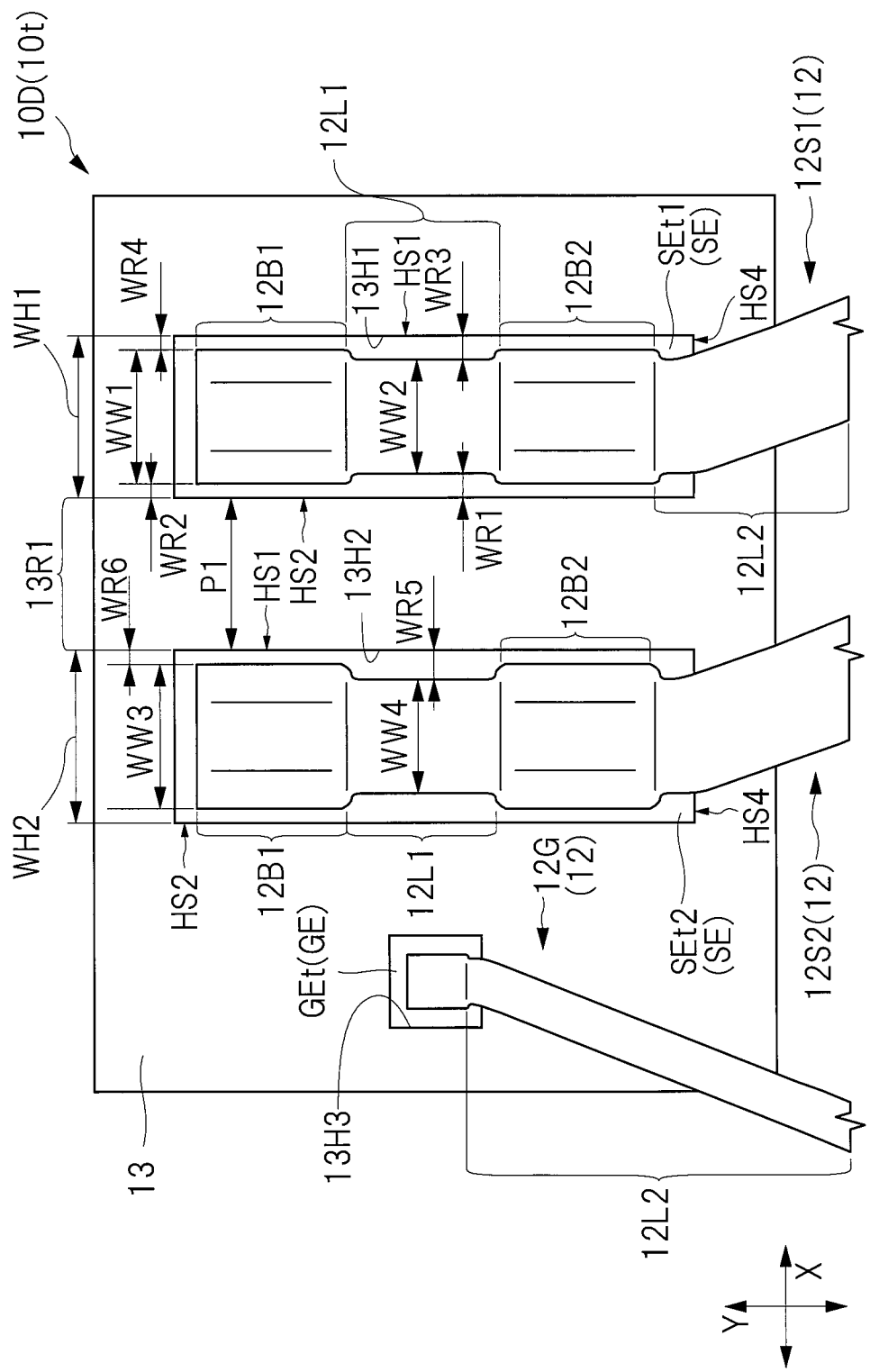
FIG. 28 is an enlarged plan view showing still another modification example of FIG. 7.

The embodiment has described, for example, the aspect as shown in FIG. 7 in which the structures of the bonding surface SEt1 and the bonding surface SEt2 are the same as each other and in which the structures of the wire 12S1 and the wire 12S2 are the same as each other. In this case, a part where the bonding surface SEt2 and the wire 12S2 are connected to each other can also obtain such same effect as described while exemplifying the part where the bonding surface SEt1 and the wire 12S1 are connected to each other. However, as seen in, for example, a semiconductor chip 10D of a modification example shown in FIG. 28, the bonding surface SEt1 and the bonding surface SEt2 may be different from each other in the structure, or the wire 12S1 and the wire 12S2 may be different from each other in the structure. FIG. 28 is an enlarged plan view of another modification example of FIG. 7.

In the X direction in the semiconductor chip 10D of FIG. 28, the width WH1 of the bonding surface SEt1 and the width WH2 of the bonding surface SEt2 are different from each other. Also, in the semiconductor chip 10D, the opening area of the opening 13H1 (the area of the bonding surface SEt1) and the opening area of the opening 13H2 (the area of the bonding surface SEt2) are also different from each other.

In the example shown in FIG. 28, the width WH2 is larger than the width WH1. In the semiconductor chip 10D, the opening area of the opening 13H1 (the area of the bonding surface SEt1) is smaller than the opening area of the opening 13H2 (the area of the bonding surface SEt2).

In the X direction shown in FIG. 28, the width WW3 of the connecting portion 12B1 of the wire 12S2 connected to the semiconductor chip 10D is smaller than the width P1 of the region 13R1 and is larger than the width WW1 of connecting portion 12B1 of the wire 12S1. Note that the width of the connecting portion 12B2 of the wire 12S1 is equal to the width WW1 of the connecting portion 12B1, and the width of the connecting portion 12B2 of the wire 12S2 is equal to the width WW3 of the connecting portion 12B1.

In the case of the modification example shown in FIG. 28, at the wire bonding step of bonding the wire 12S2, the wedge tool WT of FIG. 20 can be pressed until the position of the tip surface WThb of the wedge tool WT becomes lower than that of the aspect shown in FIG. 20 because the width WH2 of the bonding surface SEt2 is larger. In this manner, as shown in FIG. 28, the width WW3 of the connecting portion 12B1 of the wire 12S2 can be increased. In other words, the bonding area between the connecting portion 12B1 of the wire 12S2 and the bonding surface SEt2 can be increased. In this case, the impedance of the bonding surface between the connecting portion 12B1 of the wire 12S2 and the bonding surface SEt2 can be reduced.

Such a method as reducing the overall impedance as much as possible by making the width WW1 and the width WW3 shown in FIG. 28 to be different from each other in the size is effective for such a method as reducing the impedance as much as possible in a limited space of the front surface 10t.

As a modification example of the example shown in FIG. 28, note that the wire diameter (the diameter) of the wire 12S1 and the wire diameter (the diameter) of the wire 12S2 may be different from each other. However, when a type of the wire 12 is changed at the die bonding step, a manufacturing efficiency decreases. Therefore, from the viewpoint of improving the manufacturing efficiency, the wire diameter (the diameter) of the wire 12S1 and the wire diameter (the diameter) of the wire 12S2 are preferably the same as each other.

In the example shown in FIG. 28, the wire diameter (the diameter) of the wire 12S1 and the wire diameter (the diameter) of the wire 12S2 are the same as each other. Therefore, in the X direction, the width WW2 of the loop portion 12L1 of the wire 12S1 is equal to the width WW4 of the loop portion 12L1 of the wire 12S2.

As another modification example of FIG. 7, the structure in which the wire 12S2 is bonded to the bonding surface SEt2 may be different from the structure in which the wire 12S1 is bonded to the bonding surface SEt1. For example, the wire 12S1 may be bonded to the bonding surface SEt1 by the same structure as that of the example shown in FIG. 7, and the wire 12S2 may be bonded to the bonding surface SEt2 at one part as similar to the gate wire 12G. In this case, if the area of the bonding surface SEt2 is the same as the area of the bonding surface SEt1, an area of a region of bonding surface SEt2, the region not overlapping the wire 12S2, increases. Therefore, in the case of this modification example, the area of the bonding surface SEt2 is preferably smaller than the area of the bonding surface SEt1. However, from the viewpoint of impedance reduction, the bonding surface SEt1 and the bonding surface SEt2 are preferably the same as each other in the structure, and the wire 12S1 and the wire 12S2 are preferably the same as each other in the structure, as described in the above-described embodiment (see FIG. 7).

Fourth Modification Example

Figure 29:
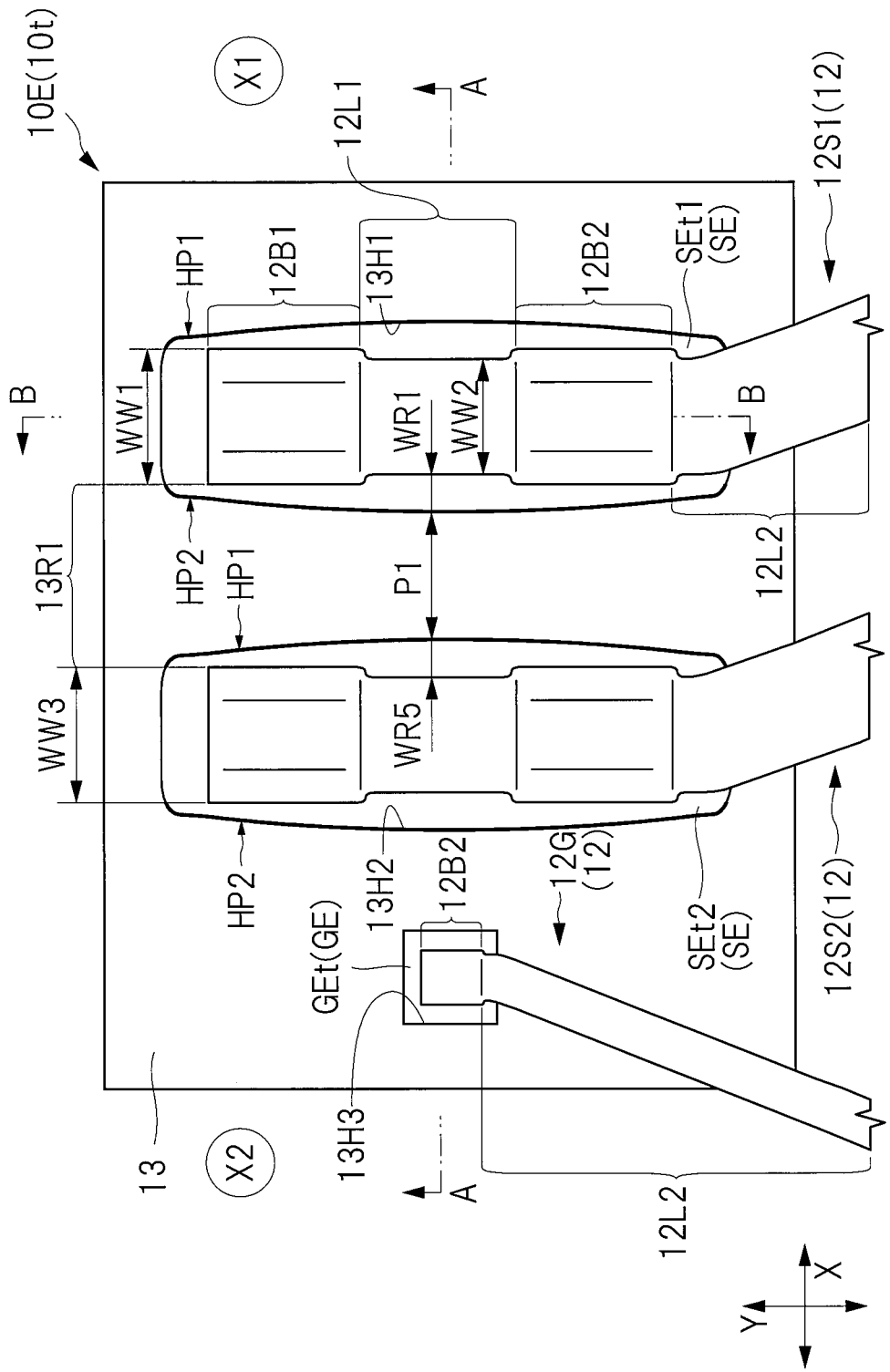
FIG. 29 is an enlarged plan view showing still another modification example of FIG. 7.

The embodiment has described, for example, the case as shown in FIG. 7 in which each shape of the bonding surface SEt1 and the bonding surface SEt2 is rectangular. However, each shape of the bonding surface SEt1 and the bonding surface SEt2 is not limited to the rectangular shape, and has various modification examples such as a polygon and a circle (including an ellipse). As an example, explanation will be made with reference to FIG. 29 while exemplifying an aspect in a case of a curved outline (periphery) of each of the bonding surface SEt1 and the bonding surface SEt2. FIG. 29 is an enlarged plan view of another modification example of FIG. 7.

When it is difficult to determine apexes at the peripheries as seen in the bonding surfaces SEt1 and SEt2 included in a semiconductor chip 10E shown in FIG. 29, it is difficult to define the sides HS1, HS2, HS3, and HS4, which have been described with reference to FIG. 7. In such a case, the definition explained with reference to the sides HS1 and HS2 shown in FIG. 7, etc., will be considered and applied as follows.

That is, in a plan view, the bonding surface SEt1 and the bonding surface SEt2 are arranged side by side in the X direction intersecting the Y direction. In the X direction, the periphery (outline) of each of the bonding surface SEt1 and the bonding surface SEt2 has a portion HP1 (equivalent to the side HS1 of FIG. 7) located on one side (X1 side) of the wire (wire 12S1 or 12S2) bonded to the corresponding bonding surface (bonding surface SEt1 or SEt2), and a portion HP2 (equivalent to the side HS2 of FIG. 7) located on the other side (X2 side) of the wire. In FIG. 29, note that portions equivalent to the portions HP1 and HP2 of the periphery (outline) of the bonding surface SEt1 and bonding surface SEt2 are shown by thick lines.

In the definition as described above, the side HS1 (see FIG. 7) described in the above-described embodiment can be replaced with the portion HP1. The side HS2 (see FIG. 7) described in the above-described embodiment can also be replaced with the portion HP2. In the case of the semiconductor chip 10E, the width P1 in the X direction of the region 13R1 sandwiched between the bonding surface SEt1 and the bonding surface SEt2 is not constant and has various values. When the width P1 is compared with the width WW1 or width WW2 of the wire 12S1 as described in the above-described embodiment, it is preferable to use the minimum value of a plurality of values as the width P1 for the comparison.

Fifth Modification Example

As another modification example of FIG. 7, the wire 12S1 may be bonded to one bonding surface SEt1 at three or more parts although illustration is omitted. In this case, the bonding area between the wire 12S1 and the bonding surface SEt1 increases, and therefore, the impedance of the conductive path passing through the wire 12S1 can be reduced. This can be also said to the wire 12S2.

In a case of the large number of the bonding parts between the wire 12S1 and the bonding surface SEt1, the length of the bonding surface SEt1 in the Y direction (for example, the lengths of the sides HS1 and HS2 in the example shown in FIG. 7) is large. In this case, a stress caused by a difference in linear expansion coefficient between the sealer 40 (see FIG. 23) and the source electrode pad SE is particularly large on both ends of the bonding surface SEt1 in the Y direction (large in the vicinity of the sides HS3 and HS4 in FIG. 7). Therefore, from the viewpoint of reducing the length of the source electrode pad in the Y direction, an aspect in which the wire 12S1 is bonded to one bonding surface SEt1 at two parts is particularly preferable as shown in FIG. 7.

Sixth Modification Example

In the above-described embodiment, a MOSFET is exemplified as an example of a power transistor included in a power semiconductor device. However, various modification examples are applicable. For example, an IGBT may be provided instead of the MOSFET. This case can be achieved by interpreting the drain of the MOSFET in the embodiment described above as the collector of the IGBT and interpreting the source of the MOSFET as the emitter of the IGBT. When the IGBT is used, a diode (free wheeling diode (FWD)) chip that controls a flow direction of a load current is mounted separately from an IGBT chip in many cases. Thus, on the die pad 20 shown in FIG. 5, the IGBT chip and the FDW chip are mounted.

In the above-described embodiment, the power semiconductor device has been exemplified and described as an example of a semiconductor device to which severe demands in environment temperature and temperature cycle load resistance tend to be required. However, even in a case of a semiconductor device other than the power semiconductor device, such as a control-system semiconductor device and a communication-system semiconductor device, if a specification of the demands in the environment temperature and the temperature cycle load resistance is high, performances concerning the environment temperature and the temperature cycle load resistance can be improved by applying the techniques described in the above-described embodiment and modification examples. In the semiconductor device other than the power semiconductor device, a gold (Au) wire is used as the wire, and the ball bonding method is used as the wire bonding method in many cases.

Seventh Modification Example

Figure 30:
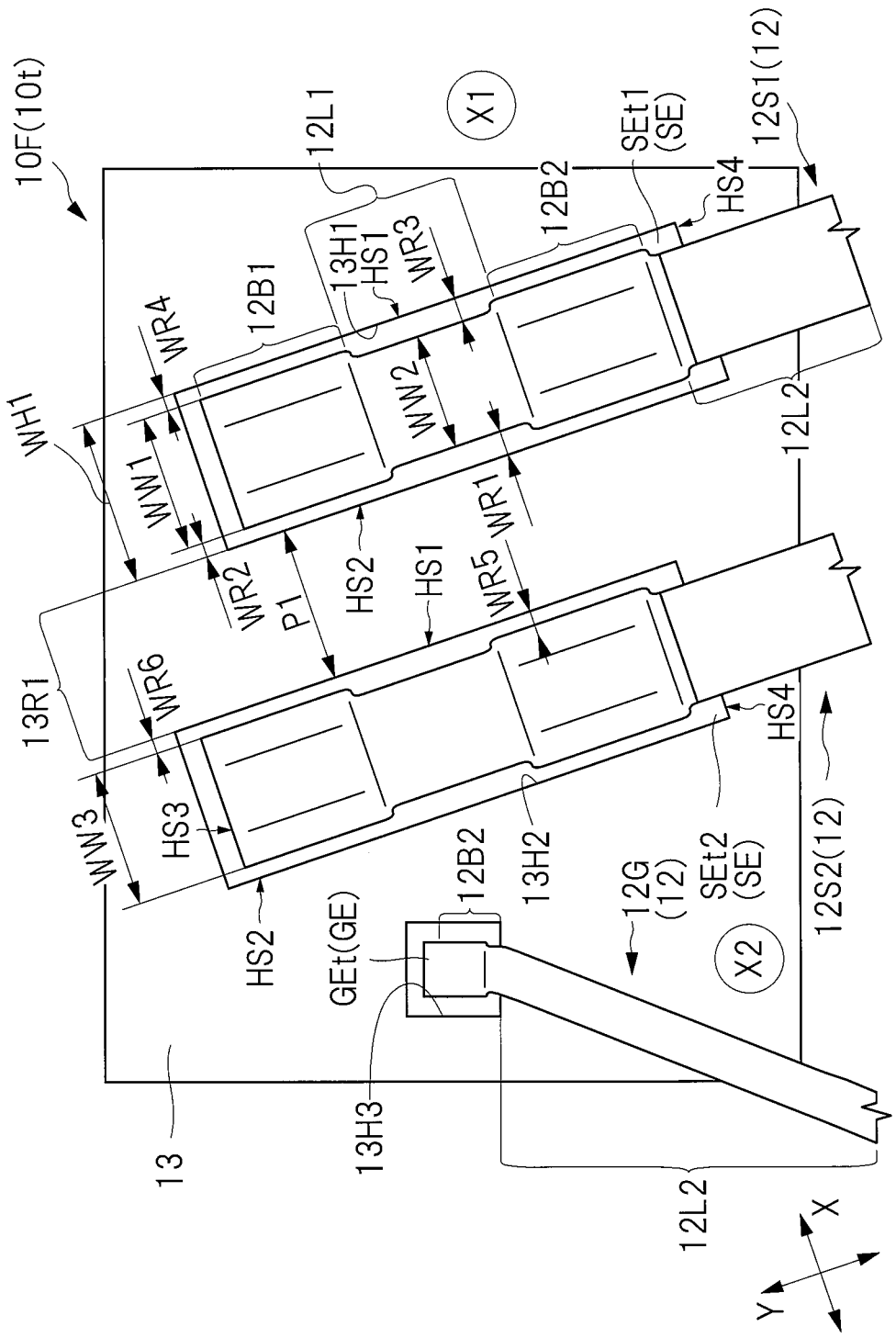
FIG. 30 is an enlarged plan view showing still another modification example of FIG. 7.

The above embodiment has described the aspect in which, for example, the X direction which is the direction of arrangement of the bonding surfaces SEt1 and SEt2 and the Y direction which is the direction of extension of the bonding surfaces SEt1 and SEt2 extend the respective outer peripheral sides of the front surface 10t of the semiconductor chip 10 as seen in the semiconductor chip 10 of FIG. 7. However, the configurations described above are also applicable to a case in which the X and Y directions intersect the respective outer peripheral sides of the front surface 10t of the semiconductor chip 10 at an angle other than a right angle. FIG. 30 is an enlarged plan view of another modification example of FIG. 7.

A semiconductor chip 10F shown in FIG. 30 is different from the semiconductor chip 10 shown in FIG. 7 in that the X direction which is the direction of arrangement of the bonding surfaces SEt1 and SEt2 and the Y direction which is the direction of extension of the bonding surfaces SEt1 and SEt2 intersect the respective outer peripheral sides of the front surface 10t of the semiconductor chip 10F at an angle other than a right angle.

In a case of the modification example shown in FIG. 30, in each of the wire 12S1 and wire 12S2, the directions of extension of the connecting portion 12B1, the loop portion 12L1, and the connecting portion 12B2 match the direction of extension of the loop portion 12L2. In this case, a degree of the deformation of the wires 12S1 and 12S2 is smaller on the boundary between the connecting portion 12B2 and the loop portion 12L2 than in the case of FIG. 7. As a result, a stress on the wires 12S1 and 12S2 is smaller.

As shown in FIG. 30, even when the direction of arrangement of the bonding surfaces SEt1 and SEt2 and the direction of extension of the same are tilted from the respective sides of the front surface 10t of the semiconductor chip 10, the width (thickness) in a plan view which has been described in the above-described embodiment and modification examples can be defined in the direction along the tilted X direction.

Eighth Modification Example

The various modification examples have been explained as described above. However, for example, the modification examples described above can be combined with one another and applied. And, parts of the modification examples may be extracted and combined with one another.

Technical concepts of the semiconductor device and the method of manufacturing the semiconductor device described above in the embodiment are extracted as follows.

[Statement 1]

A semiconductor device includes: a semiconductor chip having an insulating film formed on a first main surface, the insulating film having a first opening exposing a first bonding surface and a second opening exposing a second bonding surface; a first conductive member bonded to the first bonding surface of the semiconductor chip; a second conductive member bonded to the second bonding surface of the semiconductor chip; and a sealer that seals the semiconductor chip, the first conductive member, and the second conductive member so that the sealer is in contact with the first bonding surface and the second bonding surface of the semiconductor chip. The first conductive member includes: a first connecting portion bonded to the first bonding surface; a second connecting portion bonded to the first bonding surface; and a first loop portion located between the first connecting portion and the second connecting portion in a first direction in a plan view, the first loop portion being separated from the first bonding surface. The second conductive member includes: a third connecting portion bonded to the second bonding surface; a fourth connecting portion bonded to the second bonding surface; and a second loop portion located between the third connecting portion and the fourth connecting portion in a plan view, the second loop portion being separated from the second bonding surface. In a plan view, the first bonding surface and the second bonding surface are arranged side by side in a second direction intersecting the first direction. A periphery of each of the first bonding surface and the second bonding surface includes: a first portion (first side) closer in the second direction to one side of a wire bonded to each of the bonding surfaces; and a second portion (second side) closer in the second direction to the other side of the wire. In the second direction, the second portion of the first bonding surface and the first portion of the second bonding surface are arranged so as to be adjacent to each other across a first region of the insulating film. In the second direction, a maximum width of a region of the first bonding surface, the region being sandwiched between the first conductive member and the second portion of the first bonding surface, is smaller than a width of the first region of the insulating film.

[Statement 2]

A semiconductor device includes: a semiconductor chip having an insulating film formed on a first main surface, the insulating film having a first opening exposing a first bonding surface and a second opening exposing a second bonding surface; a first conductive member bonded to the first bonding surface of the semiconductor chip; a second conductive member bonded to the second bonding surface of the semiconductor chip; and a sealer that seals the semiconductor chip, the first conductive member, and the second conductive member so that the sealer is in contact with the first bonding surface and the second bonding surface of the semiconductor chip. The first conductive member includes: a first connecting portion bonded to the first bonding surface; a second connecting portion bonded to the first bonding surface; and a first loop portion located between the first connecting portion and the second connecting portion in a first direction in a plan view, the first loop portion being separated from the first bonding surface. The second conductive member includes: a third connecting portion bonded to the second bonding surface; a fourth connecting portion bonded to the second bonding surface; and a second loop portion located between the third connecting portion and the fourth connecting portion in a plan view, the second loop portion being separated from the second bonding surface. In a plan view, the first bonding surface and the second bonding surface are arranged side by side in a second direction intersecting the first direction. A periphery of each of the first bonding surface and the second bonding surface includes: a first portion (first side) closer in the second direction to one side of a wire bonded to each of the bonding surfaces; and a second portion (second side) closer in the second direction to the other side of the wire. In the second direction, the second portion of the first bonding surface and the first portion of the second bonding surface are arranged so as to be adjacent to each other across a first region of the insulating film. In a plan view, an area of the first region sandwiched between the second portion of the first bonding surface and the first portion of the second bonding surface is larger than an area of a part of the first bonding surface, the part not overlapping the first conductive member.

[Statement 3]

In the Statement 2, in a plan view, each of the first opening and the second opening of the insulating film includes: a first side extending in the first direction; a second side extending in the first direction and being opposite to the first side; a third side extending in the second direction intersecting the first direction; and a fourth side extending in the second direction and being opposite to the third side. In a plan view, an outer periphery of the first region includes: the second side of the first opening; the first side of the second opening; a fifth side extending from an intersection between the third side and the second side of the first opening to an intersection between the third side and the first side of the second opening; and a sixth side extending from an intersection between the fourth side and the second side of the first opening to an intersection between the fourth side and the first side of the second opening. An area of the first region and an area of the first opening are equal to each other.

[Statement 4]

In the Statement 2, in a plan view, each of the first opening and the second opening of the insulating film includes: a first side extending in the first direction; a second side extending in the first direction and being opposite to the first side; a third side extending in the second direction intersecting the first direction; and a fourth side extending in the second direction and being opposite to the third side. In a plan view, an outer periphery of the first region includes: the second side of the first opening; the first side of the second opening; a fifth side extending from an intersection between the third side and the second side of the first opening to an intersection between the third side and the first side of the second opening; and a sixth side extending from an intersection between the fourth side and the second side of the first opening to an intersection between the fourth side and the first side of the second opening. An area of the first region and an area of the first opening are different from each other.

[Statement 5]

In the Statement 2, in a plan view, an area of the first opening and an area of the second opening are equal to each other.

[Statement 6]

A method of manufacturing a semiconductor device includes the following steps.

The steps include: (a) a step of preparing a semiconductor chip including a first main surface formed with an insulating film and a first electrode covered with the insulating film and having bonding surfaces exposed from a plurality of openings formed in the insulating film, and including a first back surface being opposite to the first main surface; (b) a step of preparing a lead frame having a chip mounting portion having a second main surface to which the semiconductor chip is fixed, a first lead extending from the chip mounting portion, and a second lead extending so as to be side by side with the first lead; (c) a step of, after the step (a) and the step (b), mounting the semiconductor chip on the chip mounting portion so that the first back surface of the semiconductor chip faces the second main surface of the chip mounting portion; (d) a step of, after the step (c), electrically connecting the first lead to the bonding surfaces of the first electrode, the bonding surface being exposed from the plurality of openings of the semiconductor chip, via a plurality of conductive members by using a first bonding tool; and (e) a step of, after the step (d), sealing the semiconductor chip, a part of the chip mounting portion, the plurality of conductive members, a part of the first lead, and a part of the second lead, with a resin so that the resin is in contact with the bonding surfaces of the first electrode. At the step (a), the plurality of openings are arranged in the first direction in a plan view, each of the plurality of openings of the insulating film includes, in a plan view, a first side extending in the first direction, a second side extending in the first direction and being opposite to the first side, a third side extending in a second direction intersecting the first direction, and a fourth side extending in the second direction and being opposite to the third side, and the fourth side of a first opening of the plurality of openings and the third side of a second opening of the plurality of openings are located adjacent to each other across a first region of the insulating film in a plan view. The step (d) includes: (d-1) a step of, at the first opening of the plurality of openings, bonding the bonding surface to a first connecting portion of a first conductive member of the plurality of conductive members; (d-2) a step of, after the step (d-1), at the first opening, bonding the bonding surface to a second connecting portion of the first conductive member; and (d-3) a step of, after the step (d-2), bonding the first lead to a third connecting portion of the first conductive member. In the first direction, a width of the first opening is smaller than a width of a tip portion of the first bonding tool. At the steps (d-1) and (d-2), a part of the tip portion of the first bonding tool is arranged at a position at which the part of the tip portion covers a part of the insulating film.

[Statement 7]

In the Statement 6, the step (d) includes a step of, after the step (d-1) and before the step (d-2), moving the first bonding tool to be away from the bonding surface, and then, moving the first bonding tool in the second direction.

[Statement 8]

In the Statement 6, the step (d) includes a step of, after the step (d-2) and before the step (d-3), moving the first bonding tool to be away from the bonding surface, and then, moving the first bonding tool toward the first lead.

[Statement 9]

In the Statement 6, after the step (d), the first conductive member intersects any one of a plurality of sides of the first opening in a plan view.

[Statement 10]

In the Statement 6, in the first direction, a width of the first region of the insulating film, the first region being sandwiched between the fourth side of the first opening and the third side of the second opening, is smaller than a width of a tip portion of the first bonding tool.

What is claimed is:

1. A semiconductor device comprising:
   a frame member having a die pad, source leads and a gate lead;
   a semiconductor chip mounted on the die pad, the semiconductor chip having a first metal bonding pad for a source electrode and a second metal bonding pad for a gate electrode and an organic insulating film formed over the first and second metal bonding pads, the first and second bonding pads and the organic insulating film being formed on a first main surface of the semiconductor chip, the organic insulating film having a first opening exposing a first part of the first metal bonding pad, a second opening exposing a second part of the first metal bonding pad and a third opening exposing a part of the second metal bonding pad;
   a first wire being bonded to the first part of the first metal bonding pad and to the source leads;
   a second wire being bonded to the second part of the first metal bonding pad and to the source leads;
   a third wire being bonded to the part of the second metal bonding pad and to the gate lead; and
   a resin sealer sealing the semiconductor chip, the first to third wires, a part of the source leads and a part of the gate lead such that the resin sealer is in contact with the organic insulating film,
   wherein a total area of the organic insulating film in a plan view is larger than a total area defined by the first to third openings of the organic insulating film in the plan view,
   wherein a width of the organic insulating film between the first and second openings in the first direction is less than the first width and the second width,
   wherein the width of the organic insulating film between the first and second openings in the first direction is greater than a diameter of the first wire and a diameter of the second wire, and
   wherein the width of the organic insulating film between the first and second openings in the first direction is greater than a width of a first connecting portion connecting the first wire with the first part of the first metal bonding pad in the first direction and greater than a width of a second connecting portion connecting the second wire with the second part of the first metal bonding pad in the first direction.

2. The semiconductor device according to claim 1,
   wherein each of the first and second openings of the organic insulating film has a substantially rectangular shape in the plan view, and
   wherein each of the first and second openings of the organic insulating film is inclined diagonally with respect to the semiconductor chip in the plan view.

3. The semiconductor device according to claim 1,
   wherein each of the first and second wires has a bent portion between the semiconductor chip and the source leads in the plan view.

4. The semiconductor device according to claim 1,
   wherein each of the first and second openings of the organic insulating film has a substantially rectangular shape in the plan view,
   wherein the first opening has a first width in a first direction in the plan view and a first length in a second direction perpendicular to the first direction in the plan view, the first width being shorter than the first length, and
   wherein the second opening has a second width in the first direction in the plan view and a second length in the second direction in the plan view, the second width being shorter than the second length in the plan view.

5. The semiconductor device according to claim 1,
   wherein, in the plan view, the first opening and the second opening are arranged next to each other without the third opening intervening between the first opening and the second opening.

* * * * *